(12) United States Patent
Ikeda et al.

(10) Patent No.: US 7,834,420 B2
(45) Date of Patent: *Nov. 16, 2010

(54) SEMICONDUCTOR INTEGRATED CIRCUIT DEVICE AND PROCESS FOR MANUFACTURING THE SAME

(75) Inventors: Shuji Ikeda, Koganei (JP); Toshiaki Yamanaka, Menlo Park, CA (US); Kenichi Kikushima, Ohme (JP); Shinichiro Mitani, Tokorozawa (JP); Kazushige Sato, Ohme (JP); Akira Fukami, Higashimurayama (JP); Masaya Iida, Yokohama (JP); Akihiro Shimizu, Akishima (JP)

(73) Assignee: Renesas Electronics Corp., Kanagawa (JP)

( * ) Notice: Subject to any disclaimer, the term of this patent is extended or adjusted under 35 U.S.C. 154(b) by 5 days.

This patent is subject to a terminal disclaimer.

(21) Appl. No.: 12/335,302

(22) Filed: Dec. 15, 2008

(65) Prior Publication Data

US 2009/0140349 A1    Jun. 4, 2009

Related U.S. Application Data

(60) Continuation of application No. 11/834,095, filed on Aug. 6, 2007, now Pat. No. 7,511,377, which is a continuation of application No. 11/826,491, filed on Jul. 16, 2007, now Pat. No. 7,456,486, which is a continuation of application No. 11/765,265, filed on Jun. 19, 2007, now Pat. No. 7,397,123, which is a division of application No. 11/297,500, filed on Dec. 9, 2005, now Pat. No. 7,253,051, which is a continuation of application No. 10/971,073, filed on Oct. 25, 2004, now Pat. No. 7,049,680, which is a division of application No. 10/866,874, filed on Jun. 15, 2004, now Pat. No. 7,023,071, which is a continuation of application No. 10/304,045, filed on Nov. 26, 2002, now Pat. No. 6,809,399, which is a continuation of application No. 09/755,184, filed on Jan. 8, 2001, now Pat. No. 6,548,885, which is a division of application No. 09/334,266, filed on Jun. 16, 1999, now Pat. No. 6,211,004, which is a division of application No. 08/880,736, filed on Jun. 23, 1997, now Pat. No. 5,946,565, which is a continuation of application No. 08/451,117, filed on May 25, 1995, now Pat. No. 5,754,467.

(30) Foreign Application Priority Data

May 27, 1994  (JP) ................................. 6-114925
Jul. 5, 1994    (JP) ................................. 6-153163

(51) Int. Cl.
*H01L 29/00*     (2006.01)
*H01L 21/8234*   (2006.01)
(52) U.S. Cl. ...................................... 257/536; 438/238
(58) Field of Classification Search ................. 257/301, 257/369, 536, 904, E21.004–E21.007; 438/238, 438/253
See application file for complete search history.

(56) References Cited

U.S. PATENT DOCUMENTS

| | | | |
|---|---|---|---|
| 4,803,534 | A |  2/1989 | Koike et al. |
| 4,873,204 | A | 10/1989 | Wong et al. |
| 5,051,958 | A |  9/1991 | Arakawa |
| 5,098,854 | A |  3/1992 | Kapoor et al. |
| 5,121,186 | A |  6/1992 | Wong et al. |
| 5,187,122 | A |  2/1993 | Bonis |
| 5,194,749 | A |  3/1993 | Meguro et al. |
| 5,406,107 | A |  4/1995 | Yamaguchi |
| 5,462,894 | A | 10/1995 | Spinner et al. |
| 5,483,083 | A |  1/1996 | Meguro et al. |
| 5,523,598 | A |  6/1996 | Watanabe et al. |
| 5,656,524 | A |  8/1997 | Eklund et al. |
| 5,716,871 | A |  2/1998 | Yamazaki et al. |
| 5,736,421 | A |  4/1998 | Shimomura et al. |
| 5,946,565 | A |  8/1999 | Ikeda et al. |
| 6,548,885 | B2|  4/2003 | Ikeda et al. |
| 7,049,680 | B2*|  5/2006 | Ikeda et al. ................. 257/536 |
| 7,456,486 | B2*| 11/2008 | Ikeda et al. ................. 257/536 |

FOREIGN PATENT DOCUMENTS

JP       52-117063       10/1977

| JP | 59-121868 | 7/1984 |
| JP | 63-0114160 | 5/1988 |
| JP | 63-114172 | 5/1988 |
| JP | 2-224225 | 9/1990 |
| JP | 2-299261 | 12/1990 |
| JP | 3-61332 | 6/1991 |
| JP | 4-218956 | 8/1992 |
| JP | 4-277624 | 10/1992 |
| JP | 05-021736 | 1/1993 |
| JP | 06-224376 | 8/1994 |
| JP | 7-263577 | 10/1995 |
| JP | 7-321234 | 12/1995 |

OTHER PUBLICATIONS

D. Chen et al., "A New Device Interconnect Level Using Sub-Micron VLSI", Hewlett Package Laboratories, IEDM 84, pp. 118-121.
T. Tang et al., "VLSI Local Interconnect Level Using Titanium Nitride", Semiconductor Process and Design Center, IEDM 1985, pp. 590-593.
Japanese Official Action issued Feb. 9, 2010, for Application No. 2007-133936.

* cited by examiner

*Primary Examiner*—Calvin Lee
(74) *Attorney, Agent, or Firm*—Antonelli, Terry, Stout & Kraus, LLP.

(57) ABSTRACT

A SRAM of complete CMOS type having its memory cell composed of six MISFETs, in which a pair of local wiring lines for connecting the input/output terminals of CMOS inverters are formed of a refractory metal silicide layer formed over a first conducting layer constituting the individual gate electrodes of the drive MISFETs, the transfer MISFETs and the load MISFETs of the memory cell and in which a reference voltage line formed over the local wiring lines is arranged to be superposed over the local wiring lines to form a capacity element. Moreover, the capacity element is formed between the local wiring lines and the first conducting layer by superposing the local wiring lines over the first conducting layer. Moreover, the local wiring lines are formed by using resistance lowering means such as silicification. In addition, there are made common the means for lowering the resistance of the gate electrode of the transfer MISFETs and the means for forming the local wiring lines.

26 Claims, 52 Drawing Sheets

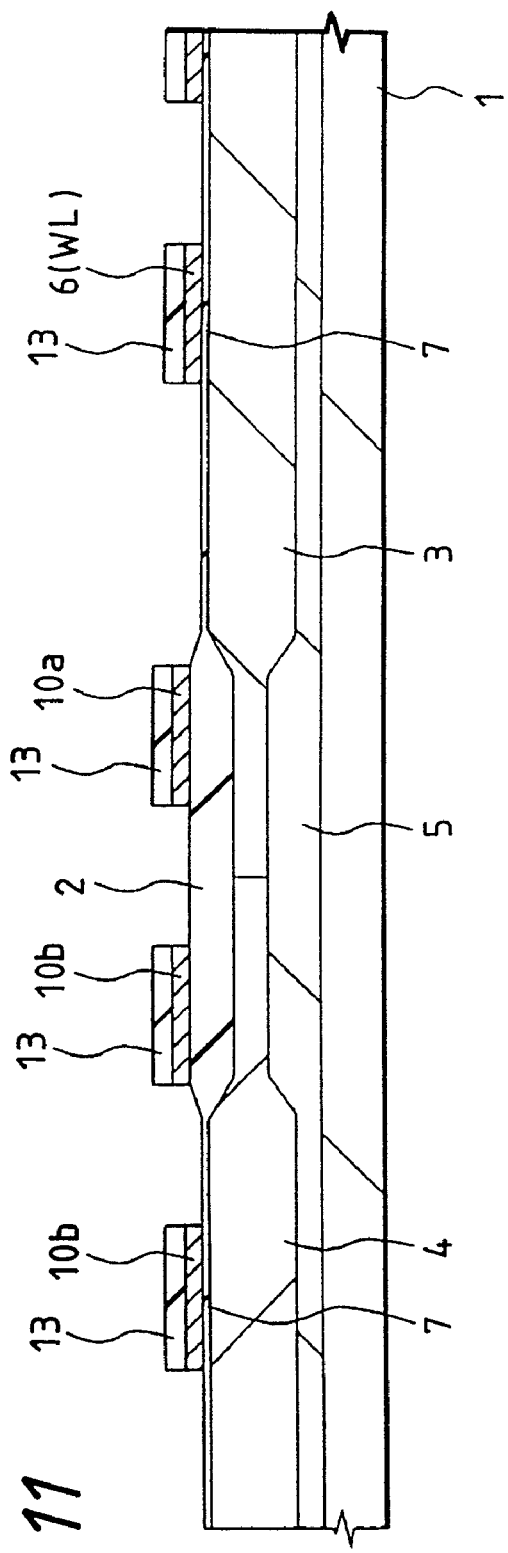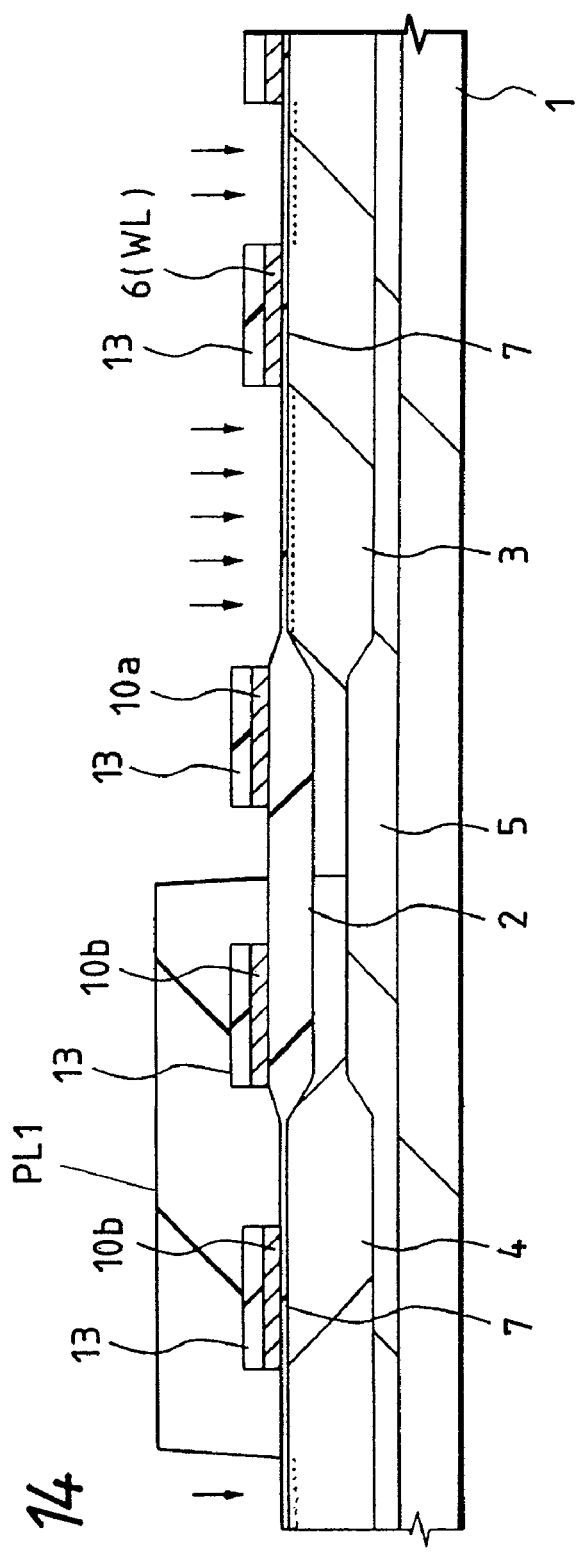

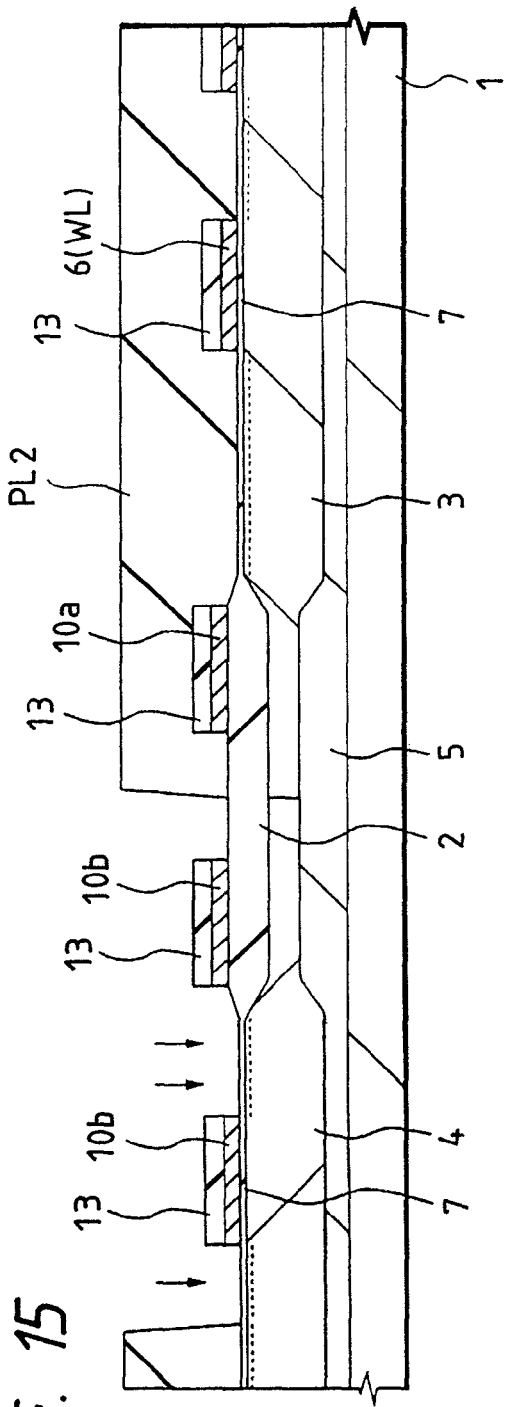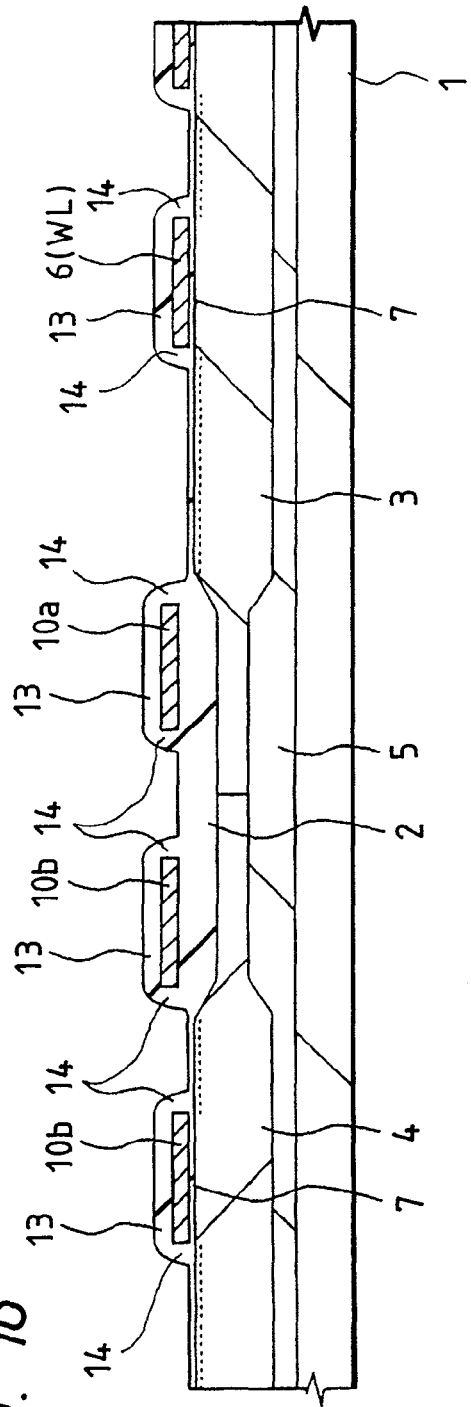

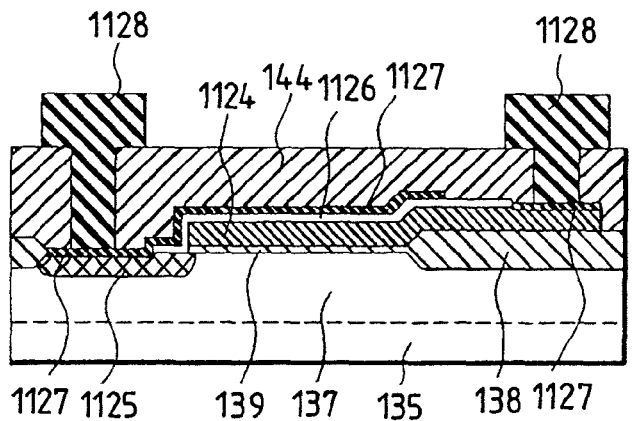
FIG. 66
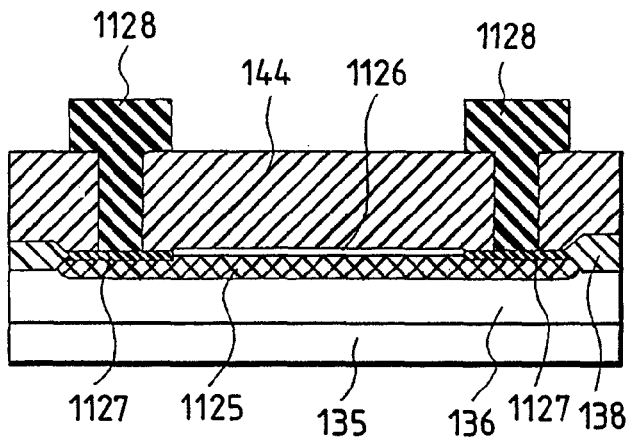
FIG. 67
FIG. 68
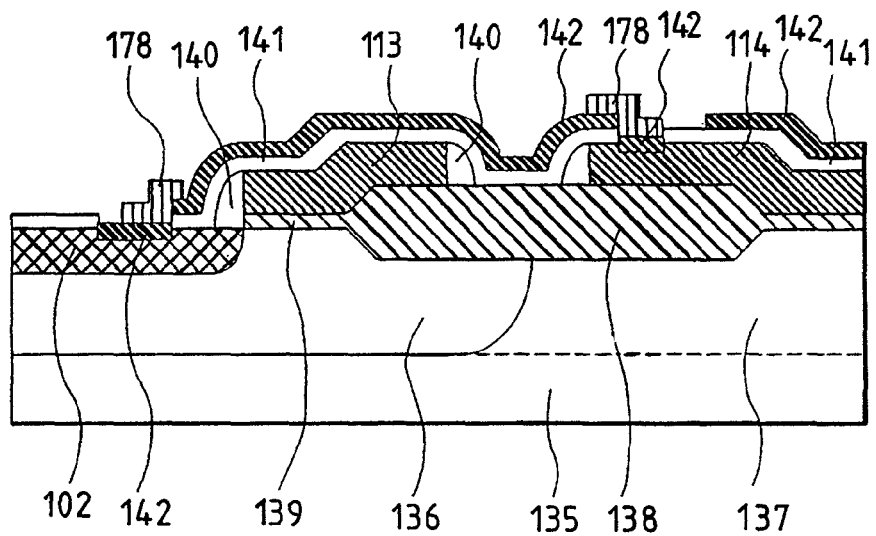

US 7,834,420 B2

SEMICONDUCTOR INTEGRATED CIRCUIT DEVICE AND PROCESS FOR MANUFACTURING THE SAME

This application is a Continuation application of application Ser. No. 11/834,095, filed Aug. 6, 2007 now U.S. Pat. No. 7,511,377, which is a Continuation application of application Ser. No. 11/826,491, filed Jul. 16, 2007 now U.S. Pat. No. 7,456,486, which is a Continuation application of application Ser. No. 11/765,265, filed Jun. 19, 2007 now U.S. Pat. No. 7,397,123, which is a Divisional application of application Ser. No. 11/297,500, filed Dec. 9, 2005, now U.S. Pat. No. 7,253,051, issued Aug. 7, 2007, which is a Continuation application of application Ser. No. 10/971,073, filed Oct. 25, 2004, now U.S. Pat. No. 7,049,680, issued May 23, 2006, which is a Divisional application of application Ser. No. 10/866,874, filed Jun. 15, 2004, now U.S. Pat. No. 7,023,071, issued Apr. 4, 2006, which is a Continuation application of application Ser. No. 10/304,045, filed Nov. 26, 2002, now U.S. Pat. No. 6,809,399, issued Oct. 26, 2004, which is a Continuation application of application Ser. No. 09/755,184, filed Jan. 8, 2001, now U.S. Pat. No. 6,548,885, issued Apr. 15, 2003, which is a Divisional application of application Ser. No. 09/334,266, filed Jun. 16, 1999, now U.S. Pat. No. 6,211,004, issued Apr. 3, 2001, which is a Divisional application of application Ser. No. 08/880,736, filed Jun. 23, 1997, now U.S. Pat. No. 5,946,565, issued Aug. 31, 1999, which is a Continuation application of application Ser. No. 08/451,117, filed May 25, 1995, now U.S. Pat. No. 5,754,467, issued May 19, 1998, the contents of application Ser. No. 08/451,117 being incorporated herein by reference in their entirety.

BACKGROUND OF THE INVENTION

The present invention relates to a semiconductor integrated circuit device and a technique for manufacturing the same and, more particularly, to a technique which is effective if applied to a semiconductor integrated circuit device having a SRAM (i.e., Static Random Access Memory).

The SRAM, as acting as a semiconductor memory device, is equipped with memory cells a memory cell which is disposed at an intersection between a word line and a pair of complementary data lines and composed of a flip-flop circuit and two transfer MISFETs (i.e., Metal Insulator Semiconductor Field Effect Transistors).

The flip-flop circuit of the memory cell of the SRAM is constructed as an information storage unit for storing information of 1 bit. This flip-flop circuit of the memory cell is exemplified by a pair of CMOS (i.e., Complementary metal Oxide Semiconductor) inverters. Each of the CMOS inverters is composed of n-channel type drive MISFETs and p-channel load MISFETs. On the other hand, transfer MISFETs are of the n-channel type. In short, this memory cell is of the so-called "CMOS (i.e., Full Complementary Metal Oxide Semiconductor)" using the six MISFETs. Incidentally, the complete CMOS type SRAM, which is formed over the principal surface of the semiconductor substrate with the drive MISFETs, the load MISFETs and the transfer MISFETs, will be called the "bulk CMOS type SRAM". This bulk CMOS type SRAM is disclosed, for example, on pp. 590 to 593 of IEDM (i.e., International Electron Device Meeting), Technical Digest, 1985.

In the SRAM of this kind, the paired CMOS inverters constituting the flip-flop circuit have their input/output terminals crossly connected with each other through a pair of wiring lines (as will be called the "local wiring lines"). One of the CMOS inverters has its input/output terminals connected with the source region of one of the transfer MISFETs, and the other CMOS inverter has its input/output terminals connected with the source region of the other transfer MISFET. One of the complementary data lines is connected with the drain region of one of transfer MISFETs, and the other complementary data line is connected with the drain region of the other transfer MISFET. With the individual gate electrodes of the paired transfer MISFETs, there is connected word lines, by which are controlled the ON/OFF of the transfer MISFETs. In the above-specified Publication, the local wiring lines are formed by a self-aligning silicide process. This silicide process per se is disclosed on pp. 118 to 121 of IEDM, Technical Digest, 1984.

SUMMARY OF THE INVENTION

As the capacity of a semiconductor memory device grows larger and larger according to the progress of the miniaturizing technique in recent years, the area to be occupied by the memory cell of the aforementioned bulk CMOS type SRAM grows smaller and smaller. However, when the area occupied by the memory cell is reduced, the storage node capacity (i.e., the pn junction capacity or gate capacity parasitic to the aforementioned storage nodes A and B) of the memory cell is reduced to reduce the amount of stored charge.

As a result, the resistance to the information inversion (i.e., the so-called "α ray soft error") of the memory cell due to the α ray having irradiated the surface of the semiconductor chip is lowered to make it difficult to retain the safe operation of the memory cell. In order to promote the miniature structure without deteriorating the stable operation of the memory cell, therefore, the counter-measures for retaining the amount of stored charge are indispensable.

More specifically, if the memory cell is irradiated with the α ray which is emitted when a radioactive element, as contained in a trace amount in a package or resin material used for sealing the memory cell, such as uranium or thorium disintegrates, electron/hole pairs are produced along the range of the α ray to immigrate into the pn junction forming the storage node so that the information of the memory cell is broken. This phenomenon is called the "soft error". In the bulk CMOS type SRAM of the prior art, because of the large memory cell area, the capacity of the storage node itself, as composed of a pn junction capacity or a gate capacity, and the driving ability of the load MISFETs is so high that the storage node can be stored with charge sufficient for compensating the charge loss due to the α ray. If the memory cell area is miniaturized, however, the amount of charge to be stored in the storage node is also reduced to raise a problem that the resistance of the memory cell to the irradiation of the α ray is deteriorated.

Specifically, we have found that new counter-measures for retaining the charge storing amount of the memory cell is indispensable in the bulk CMOS type SRAM, too, for further miniaturizing the memory cell of the SRAM.

An object of the present invention is to provide a technique capable of improving the resistance to the soft error by increasing the storage node capacity of the memory cell of the SRAM.

Another object of the present invention is to provide a technique capable of miniaturizing the memory cell of the SRAM.

Another object of the present invention is to provide a technique capable of operating the memory cell of the SRAM at a high speed and at a low voltage.

Another object of the present invention is to provide a technique capable of improving the production yield and reliability of the memory cell of the SRAM.

The foregoing and other objects and novel features of the present invention will become apparent from the following description to be made with reference to the accompanying drawings.

The representative ones of the invention to be disclosed herein will be summarized in the following.

(1) A semiconductor integrated circuit device including a SRAM having a memory cell comprising: a flip-flop circuit composed of a pair of CMIS inverters having drive MISFETs and load MISFETs; and a pair of transfer MISFETs connected with a pair of input/output terminals of said flip-flop circuit, wherein a first conducting layer is formed over the principal surface of a semiconductor substrate to form the individual gate electrodes of said drive MISFETs, said load MISFETs and said transfer MISFETs, wherein a second conducting layer is formed over said first conducting layer to form a pair of local wiring lines for connecting the individual input/output terminals of said paired CMIS inverters, wherein a third conducting layer is formed over said second conducting layer to form a reference voltage line to be connected with the source region of said drive MISFETs, and wherein said reference voltage line is arranged to be superposed over said paired local wiring lines.

(2) In the aforementioned SRAM, a semiconductor integrated circuit device, wherein said local wiring lines are partially extended over the gate electrode of said drive MISFETs, said load MISFETs or said transfer MISFETs.

(3) In the aforementioned SRAM, a semiconductor integrated circuit device, wherein said local wiring lines are partially extended over a semiconductor region constituting the input/output terminals of said CMIS inverters.

(4) In the aforementioned SRAM, a semiconductor integrated circuit device, wherein there is formed over said reference voltage line a fourth conducting layer which is made of a conducting material having a lower resistance than that of said third conducting layer constituting said reference voltage line, for supplying a reference voltage, and wherein said fourth conducting layer and said reference voltage line are electrically connected through at least one connection hole which is formed in each memory cell.

(5) In the aforementioned SRAM, a semiconductor integrated circuit device, wherein the connection hole for connecting said fourth conducting layer and said reference voltage line and the connection hole for connecting the reference voltage line and the source region of said drive MISFETs are spaced from each other.

(6) In the aforementioned SRAM, a semiconductor integrated circuit device, wherein said local wiring lines are made of a refractory metal silicide film.

(7) In the aforementioned SRAM, a semiconductor integrated circuit device, wherein the refractory metal silicide layer of said second conducting layer is formed over the drain region of said transfer MISFETs, wherein a pad layer of said third conducting layer is formed over said refractory metal silicide layer, and wherein a data line is connected with said drain region through said pad layer and said refractory metal silicide layer.

(8) In the aforementioned SRAM, a semiconductor integrated circuit device, wherein the refractory metal silicide layer of said second conducting layer is formed over the source region of said load MISFETs, wherein a pad layer of said third conducting layer is formed over said refractory metal silicide layer, and wherein a reference voltage is supplied to said drain region through said pad layer and said refractory metal silicide layer.

(9) In the aforementioned SRAM, a semiconductor integrated circuit device, wherein a well energizing semiconductor region having a conduction type different from that of said source region is formed over the principal surface of the semiconductor substrate adjacent to the source region of said load MISFETs.

(10) In the aforementioned SRAM, a semiconductor integrated circuit device, wherein the gate electrode of said transfer MISFETs is made of a conducting layer lying over said first conducting layer in place of means made of said first conducting layer.

(11) In a SRAM having a memory cell comprising: a flip-flop circuit composed of a pair of CMOS inverters having drive MISFETs and load MISFETs; and a pair of transfer MISFETs connected with a pair of input/output terminals of said flip-flop circuit, a semiconductor integrated circuit device wherein a first conducting layer is formed over the principal surface of a semiconductor substrate to form the individual gate electrodes of said drive MISFETs, said load MISFETs and said transfer MISFETs, wherein a second conducting layer is formed over said first conducting layer to form a pair of local wiring lines for connecting the individual input/output terminals of said paired CMOS inverters, wherein a third conducting layer is formed over said second conducting layer to form a supply voltage line to be connected with the source region of said load MISFETs, and wherein said supply voltage line is arranged to be superposed over said paired local wiring lines.

(12) A process for manufacturing a semiconductor integrated circuit device having wiring lines for connecting a first semiconductor region of a first conduction type and a second semiconductor region of a second conduction type, which are formed over a semiconductor substrate at a spacing from each other, comprising the following steps (a) to (d):

(a) the step of selectively forming a first silicon layer on the individual surfaces of said first semiconductor region and said second semiconductor region;

(b) the step of forming a refractory metal film all over the surface of the semiconductor substrate, as covers said first silicon layer;

(c) the step of patterning a second silicon layer into the shape of said wiring lines after said second silicon layer is formed over said refractory metal film; and (d) the step of thermally treating said semiconductor substrate to silicify said first silicon layer, said refractory metal film and said second silicon layer, and then removing said refractory metal film left unreacted over said semiconductor substrate.

(13) In a process for manufacturing a SRAM having a memory cell comprising: a flip-flop circuit composed of a pair of CMIS inverters having drive MISFETs and load MISFETs; and a pair of transfer MISFETs connected with a pair of input/output terminals of said flip-flop circuit, a process for manufacturing a semiconductor integrated circuit device, wherein a pair of local wiring lines for connecting the input/output terminals of said paired CMIS inverters with each other are formed by the following steps (a) to (d):

(a) the step of selectively forming a first silicon layer on the individual surfaces of a first semiconductor region of a first conduction type and a second semiconductor region of a second conduction type, which constitute the input/output terminals of said CMIS inverters, and on the partial surfaces of the individual gate electrodes of said drive MISFETs and said load MISFETs;

(b) the step of forming a refractory metal film all over the surface of a semiconductor substrate, as covers said first silicon layer;

(c) the step of patterning a second silicon layer into the shape of local wiring lines after said second silicon layer is formed over said refractory metal film; and (d) the step of thermally treating said semiconductor substrate to silicify said first silicon layer, said refractory metal film and said second silicon layer and then removing said refractory metal film left unreacted over said semiconductor substrate.

(14) In a process for manufacturing said SRAM, a semiconductor integrated circuit device manufacturing process, further comprising, before said step (a): the step of removing the thick insulating film covering the portions of the individual gate electrodes of said drive MISFETs and said load MISFETS, by the dry etching method using a photoresist as the mask; and the step of removing the thin insulating film, which covers the individual surfaces of said first semiconductor region and said semiconductor region, by etching back the entire surface of said semiconductor substrate, while leaving said thin insulating film on the side walls of said gate electrode.

(15) In a process for manufacturing said SRAM, a semiconductor integrated circuit device manufacturing process, wherein the refractory metal silicide layer formed on the individual surfaces of said first semiconductor region and said second semiconductor region has a higher bottom face than the top face of the gate insulating film of said drive MISFETs and said load MISFETs.

(16) In a process for manufacturing said SRAM, a semiconductor integrated circuit device manufacturing process, wherein when said second silicon layer is not left, when patterned at said step (c) into the shape of said local wiring lines, on at least a portion of such one of the individual semiconductor regions of said drive MISFETs and said load MISFETs as does not constitute the input/output terminals of said CMIS inverters.

(17) In a process for manufacturing said SRAM, a semiconductor integrated circuit device manufacturing process, wherein a reference voltage line or a supply voltage line is formed over said local wiring lines after said step (d), and wherein a capacity is formed between said local wiring lines and said reference voltage line or said supply voltage line.

(18) In a process for manufacturing said SRAM, a semiconductor integrated circuit device manufacturing process, wherein the second silicon layer, as formed over said refractory metal film at said step (c), is made thicker than the thickness necessary for said silification.

(19) In a process for manufacturing said SRAM, a semiconductor integrated circuit device manufacturing process, wherein a second refractory metal film or its silicide film is formed over said second silicon layer after said second silicon layer is formed over said refractory metal film at said step (c).

(20) In a process for manufacturing said SRAM, a semiconductor integrated circuit device manufacturing process, wherein a refractory metal silicide film is formed simultaneously with said local wiring line forming step on such one of the individual semiconductor regions of said drive MISFETs, said transfer MISFETs and said load MISFETs as is connected with any of said data line, said supply voltage line and said reference voltage line.

According to the aforementioned means (1), (11) and (17), the reference voltage line to be formed over the local wiring lines is arranged to be superposed over the local wiring lines so that the capacity element is formed between the reference voltage line and the local wiring lines. As a result, the capacity of the storage nodes, as connected with the local wiring lines, can be increased to improve the resistance of the memory cell to the α ray soft error.

According to the aforementioned means (2), the local wiring lines are arranged to be partially superposed over the gate electrodes of the drive MISFETs, the load MISFETs or the transfer MISFETs so that the gate capacity component of the storage node capacity can be increased. As a result, the storage node capacity of the memory cell can be increased to improve the resistance to the a ray soft error.

According to the aforementioned means (3), the local wiring lines are arranged to be partially superposed over the storage nodes of the memory cell so that the capacity component of the diffusion layer of the storage node capacity can be increased. As a result, the storage node capacity of the memory cell can be increased to improve the resistance to the α ray soft error.

According to the aforementioned means (4), over the reference voltage line, there is arranged the wiring line having a lower resistance, and the electric power is supplied from the lower-resistance wiring line to the reference voltage through the connection holes which are formed in at lest one in each memory cell. As a result, the electric power of the reference voltage line can be supplied to each memory cell so that the reference voltage can be stabilized. As a result, the minimum value ($V_{cc.min}$) of the supply voltage can be improved to improve the resistance of the memory cell to the α ray soft error.

According to the aforementioned means (5), the connection holes for connecting the lower-resistance wiring line and the reference voltage line and the connection holes for connecting the reference voltage line and the source region of the drive MISFETs are spaced from each other so that the step, which might otherwise be formed by the overlap of those connection holes, can be avoided to flatten the connection hole forming regions. As a result, the connection holes can have their contact resistances reduced to operate the memory cell at a high speed and at a low voltage.

According to the aforementioned means (12) and (13), the local wiring lines are formed by causing the silicifying reaction among the polycrystalline silicon film, the refractory metal film deposited on the former, and the second polycrystalline silicon film deposited on the former, so that the silicon in the semiconductor regions forming the storage nodes of the memory cell can be prevented from participating in the aforementioned silicifying reaction. As a result, the junction leakage current of the semiconductor regions can be reduced to improve the operational reliability of the memory cell.

According to the aforementioned means (14), the step of forming the connection holes in the portions of the gate electrodes and the step of exposing the semiconductor regions are carried out separately of each other to make the allowance unnecessary for the mask alignment between the connection holes and the semiconductor regions, so that the areas for the connection holes can be reduced to highly integrate the memory cell. By connecting the local wiring lines and the semiconductor regions in self-alignment, moreover, no allowance is required for the mask alignment of the two so that the memory cell size can be reduced to highly integrate the memory cell.

According to the aforementioned means (6), (12) and (13), the paired local wiring lines for connecting the storage nodes of the memory cell are made of the refractory metal silicide, so that the p-type impurity in the semiconductor region of the load MISFETs and the n-type impurity in the semiconductor region or the gate electrodes of the drive MISFETs can be prevented from diffusing into each other through the local wiring lines. As a result, the ohmic connections can be made with a low resistance between the semiconductor regions of the different conduction types and between the semiconductor region and the gate electrodes thereby to operate the memory cell at a high speed and at a low voltage.

According to the aforementioned means (15), even in the case of a misalignment of the photoresist to be used as the mask at the time of etching the overlying polycrystalline silicon film, it is possible to prevent the underlying polycrystalline silicon film from being scraped. As a result, the allowance for the alignment of the photoresist can be eliminated to reduce the areas for the semiconductor regions thereby to highly integrate the memory cell.

According to the aforementioned means (7), (8) and (20), the refractory metal silicide layers are formed on the surfaces of at least the portions of the individual source regions and drain regions of the transfer MISFETs, the drive MISFETs and the load MISFETs, as constituting the memory cell, so that the source regions and the drain regions can have their resistances lowered. As a result, it is possible to operate the memory cell at a high speed and at a low voltage.

According to the aforementioned means (9), the source region, the well energizing drain region and the supply voltage line can be ohmically connected without considering the conduction type of the polycrystalline silicon pad layer, as formed on the refractory metal silicide layer, so that the source region and the well energizing drain region of the load MISFETs can be simultaneously supplied with the supply voltage through the one connection hole. As a result, the source region and the well energizing drain region of the load MISFETs can be arranged adjacent to each other and can have their areas reduced to highly integrate the memory cell.

According to the aforementioned means (18), when the local wiring lines are to be formed by the silicifying reaction, their thickness and surface areas are increased by making the polycrystalline silicon film, as deposited on the refractory metal silicide layer, thicker than that necessary for that silicifying reaction, so that the capacity to be established between the local wiring lines and the overlying reference voltage line is increased. As a result, the storage node capacity of the memory cell can be further increased to improve the resistance to the array soft error.

BRIEF DESCRIPTION OF THE DRAWINGS

FIG. 11 is a section of an essential portion of the semiconductor substrate and shows a process for manufacturing the memory cell of the SRAM of the present invention;

FIG. 14 is a section of an essential portion of the semiconductor substrate and shows a process for manufacturing the memory cell of the SRAM of the present invention;

FIG. 15 is a section of an essential portion of the semiconductor substrate and shows a process for manufacturing the memory cell of the SRAM of the present invention;

FIG. 16 is a section of an essential portion of the semiconductor substrate and shows a process for manufacturing the memory cell of the SRAM of the present invention;

FIG. 66 is a section showing a semiconductor integrated circuit device according to a fifteenth embodiment of the present invention;

FIG. 67 is a section showing a semiconductor integrated circuit device according to a sixteenth embodiment of the present invention; and FIG. 68 is a section showing a semiconductor integrated circuit device according to a seventeenth embodiment of the present invention.

DETAILED DESCRIPTION OF THE PREFERRED EMBODIMENTS

Embodiment 1

Figure 1:
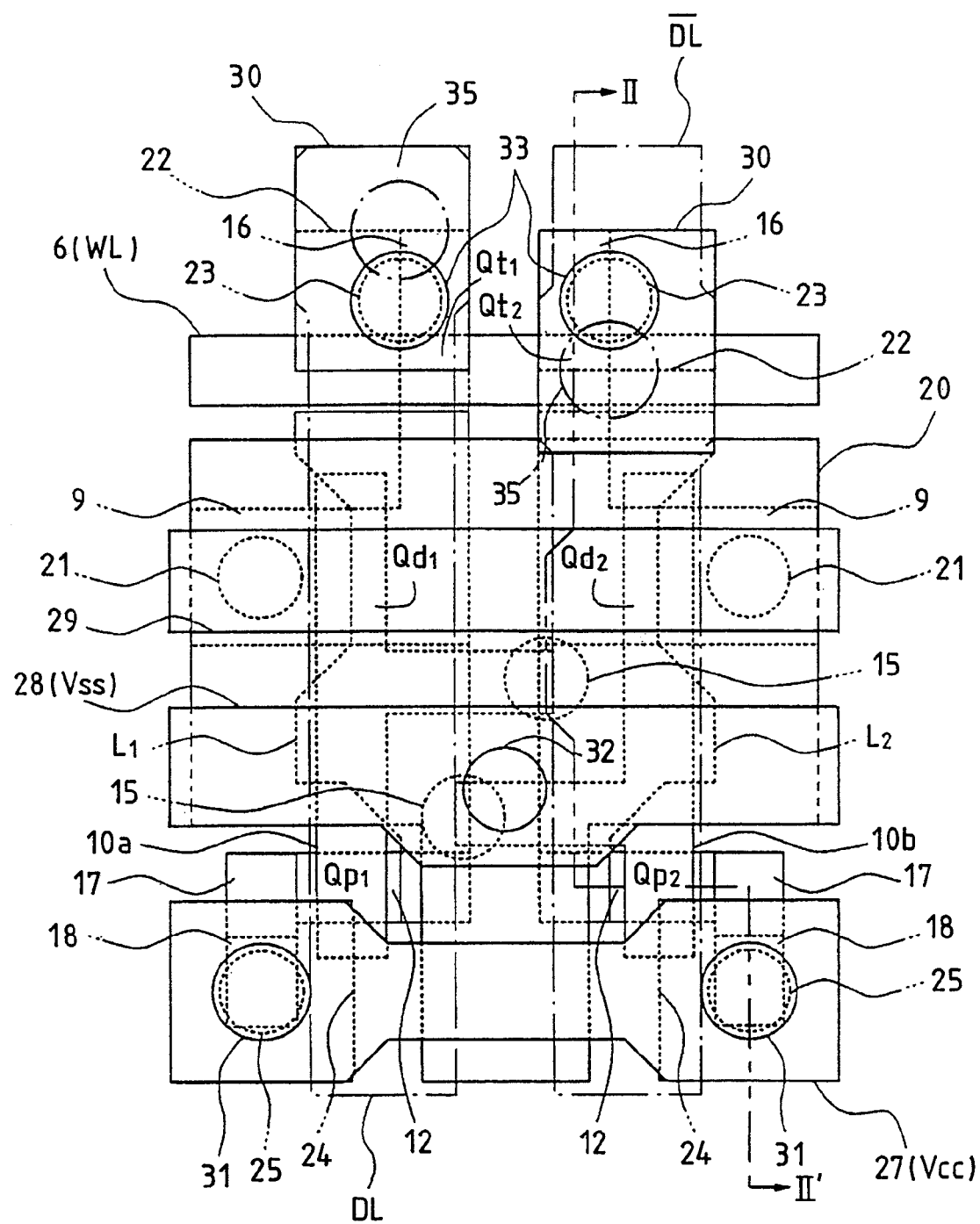
FIG. 1 is a top plan view showing a memory cell of a SRAM according to a first embodiment of the present invention.

The present invention will be described in detail in the following in connection with its embodiments with reference to the accompanying drawings. Incidentally, throughout Figures for describing the embodiments, the repeated description of the parts or portions having identical functions will be omitted by designating them at the same reference characters.

Figure 2:
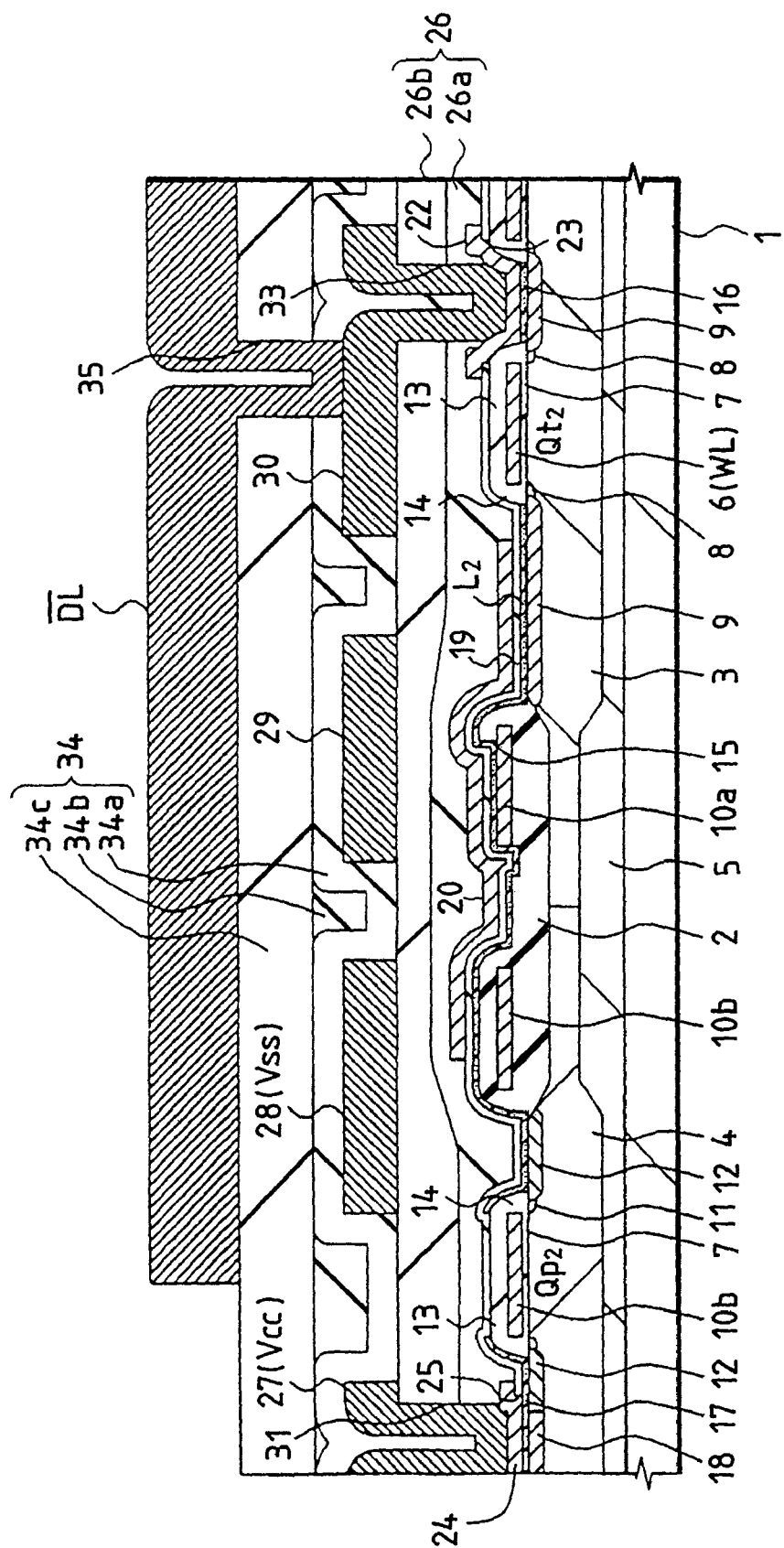
FIG. 2 is a section showing an essential portion of a semiconductor substrate taken along line II-II' of FIG. 1.

FIG. 1 is a top plan view showing a memory cell of a SRAM according to the present embodiment, and FIG. 2 is a section taken along line II-II' of FIG. 1.

Figure 3:
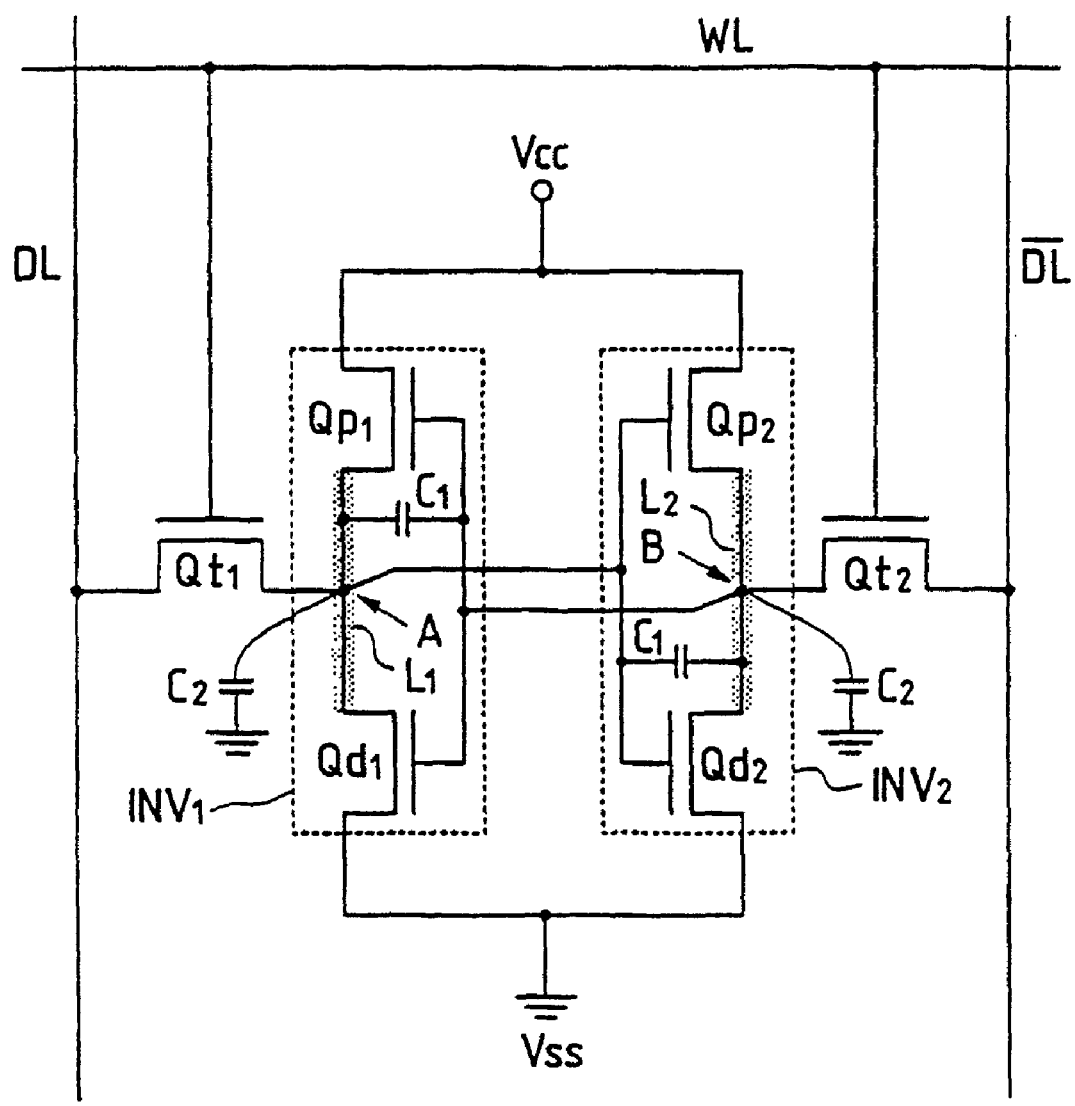
FIG. 3 is an equivalent circuit diagram of the memory cell of the SRAM of the present invention.

FIG. 3 is an equivalent circuit diagram of a memory cell of the SRAM of the present embodiment. As shown in FIG. 3, the memory cell of the SRAM of the present embodiment is composed of a pair of drive MISFETs $Qd_1$ and $Qd_2$, a pair of load MISFETs $Qp_1$ and $Qp_2$ and a pair of transfer MISFETs $Qt_1$ and $Qt_2$, which are arranged at an intersecting portion between a pair of complementary data lines (i.e., data line DL and barred data line $\overline{DL}$) and a word line WL. The drive MISFETs $Qd_1$ and $Qd_2$ and the transfer MISFETs $Qt_1$ and $Qt_2$ belong to the n-channel type whereas the load MISFETs $Qp_1$ and $Qp_2$ belong to the p-channel type. In short, this memory cell belongs to the complete CMOS type (i.e., the bulk CMOS type SRAM) composed of the four n-channel MISFETs and the two p-channel MISFETs.

Of these six MISFETs composing the memory cell, the drive MISFET $Qd_1$ and the load MISFET $Qp_1$ constitute a CMOS inverter ($INV_1$), and the drive MISFET $Qd_2$ and the load MISFET $Qp_2$ constitute a CMOS inverter ($INV_2$). These paired CMOS inverters ($INV_1$ and $INV_2$) have their input/output terminals (i.e., storage nodes A and B) crossly coupled through a pair of local wiring lines $L_1$ and $L_2$ to constitute a flip-flop acting as an information storage unit for storing information of 1 bit.

This flip-flop circuit has its one input/output terminal (i.e., the storage node A) connected with the source region of the transfer MISFET $Qt_1$ and its other input/output terminal (i.e. the storage node B) connected with the source region of the transfer MISFET $Qt_2$. The transfer MISFET $Qt_1$ has its drain region connected with the data line DL, and the transfer MISFET $Qt_2$ has its drain region connected with the barred data line $\overline{DL}$.

Moreover, the flip-flop circuit has its one end (i.e., the source regions of the load MISFETs $Qp_1$ and $Qp_2$) connected with a supply voltage (Vcc) and its other end (i.e., the source regions of the drive MISFETs $Qd_1$ and $Qd_2$) connected with a reference voltage ($V_{ss}$) The supply voltage ($V_{cc}$) is exemplified by 5 V, Land the reference voltage ($V_{ss}$) is exemplified by 0 V (i.e., the GND potential).

Here will be described the operations of the aforementioned circuit. When one CMOS inverter ($INV_1$) has its storage node A at a high ("H") potential, the drive MISFET $Qd_2$ is turned ON whereas the load MISFET $Qp_2$ is turned OFF, so that the other CMOS inverter ($INV_2$) has its storage node B set to a low ("L") potential. Moreover, the drive MISFET $Qd_1$ is turned OFF whereas the load MISFET $Qp_1$ is turned ON, so that the storage node A is held at the high ("H") potential. In other words, the states of the mutual storage nodes A and B are latched by the latch circuit having the paired CMOS inverters ($INV_1$ and $INV_2$) crossly connected, so that the information is stored while the supply voltage is applied.

The transfer MISFETs $Qt_1$ and $Qt_2$ have their individual gate electrodes connected with the word line WL, by which their ON and OFF are controlled. Specifically, when the word line WL is at the high ("H") potential, the transfer MISFETs $Qt_1$ and $Qt_2$ are ON to electrically connect the latch circuit and the complementary data lines (i.e., the data line DL and the barred data line $\overline{DL}$) so that the potential state (i.e., "H" or "L") of the storage nodes A and B appears on the data line DL and the data line $\overline{DL}$ and is read as the information of the memory cell.

In order to write the information in the memory cell, the information of the data lines DL and barred $\overline{DL}$ is transmitted to the storage nodes A and B by setting the word line WL to the "H" potential level and by turning ON the transfer MISFETs $Qt_1$ and $Qt_2$. In order to read the information of the memory cell, on the other hand, the information of the storage nodes A and B is transmitted to the data lines DL and $\overline{DL}$ likewise by setting the word line WL to the "H" potential level and by turning ON the transfer MISFETs $Qt_1$ and $Qt_2$.

A specific construction of the aforementioned memory cell will be described with reference to FIG. 1 (presenting a top plan view of a semiconductor substrate and showing about one memory cell), FIG. 2 (presenting a section of the semiconductor substrate, as taken along line II-II' of FIG. 1) and FIGS. 3 to 7. Incidentally, FIG. 1 and FIGS. 4 to 7 show only the conducting layers of the memory cell but not the insulating films such as element isolating insulating films or interlayer insulating films.

Figure 4:
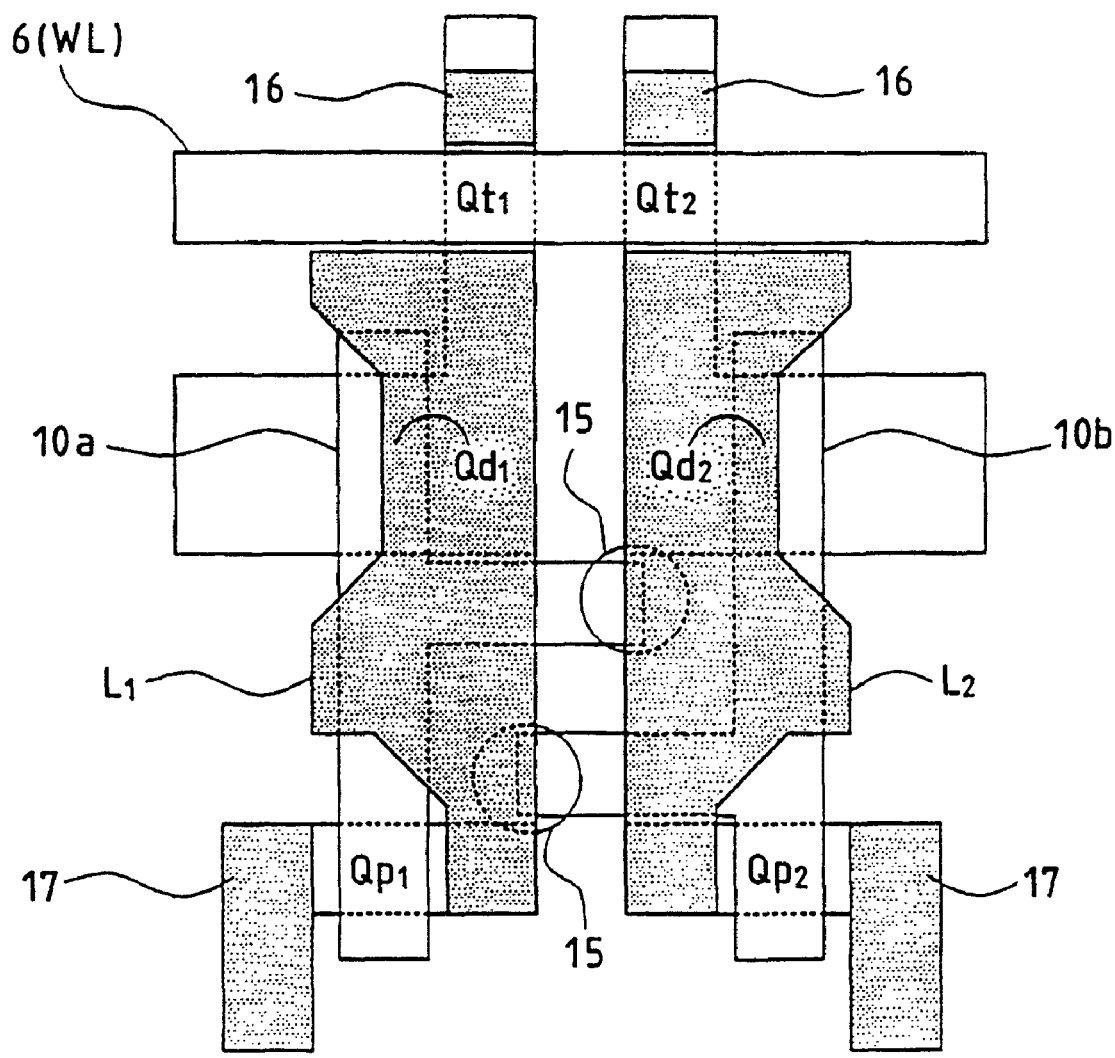
FIG. 4 is a top plan view showing the super-position of the local wiring lines and the gate electrodes of the memory cell of the SRAM of the present invention.

As shown in FIGS. 2 and 4, the six MISFETs composing the memory cell is formed in the active region which is surrounded by a field insulating film of a p⁻-type semiconductor substrate 1. The drive MISFETs $Qd_1$ and $Qd_2$ and the transfer MISFETs $Qt_1$ and $Qt_2$ of the n-channel type are individually formed in the active region of a p-type well 3, and the load MISFETs $Qp_1$ and $Qp_2$ of the p-channel type are formed in the active region of an n-type well 4. The p-type well 3 and the n-type well 4 are individually formed in the principal surface of a p-type epitaxial silicon layer 5 formed over the semiconductor substrate 1.

The transfer MISFETs $Qt_1$ and $Qt_2$ have a gate electrode 6 integrated with the word line WL. This gate electrode 6 (or the word line WL) is formed of a polycrystalline silicon film (or a poly-cide film having a lamination of a polycrystalline silicon film and a refractory metal silicide film) and is formed over a gate insulating film 7 made of a silicon oxide film.

The aforementioned transfer MISFETs $Qt_1$ and $Qt_2$ have their individual source regions and drain regions formed of a lightly doped n⁻-type semiconductor region 8 and a heavily doped n⁺-type semiconductor region 9, which are formed in the active region of the p-type well 3. In short, the transfer MISFETs $Qt_1$ and $Qt_2$ have their individual source regions and drain regions constructed of the LDD (i.e., Lightly Doped Drain) structure.

The drive MISFET $Qd_1$ and the load MISFET $Qp_1$, as constituting one CMOS inverter ($INV_1$) of the flip-flop circuit, have a common gate electrode 10a, and the drive MISFET $Qd_2$ and the load MISFET $Qp_2$, as constituting the other CMOS inverter ($INV_2$), have a common gate electrode 10b. These gate electrodes 10a and 10b are made of the same polycrystalline silicon film as that of the gate electrode 6 (or the word line WL) of the aforementioned transfer MISFETs $Qt_1$ and $Qt_2$ and are formed over the gate insulating film 7. The polycrystalline silicon film forming the gate electrode 6 (or the word line WL) and the gate electrodes 10a and 10b is doped with an n-type impurity (e.g., phosphorous (P)).

The individual source regions and drain regions of the drive MISFETs $Qd_1$ and $Qd_2$ are formed of the lightly doped n⁻-type semiconductor region 8 and the heavily doped n⁺-type semiconductor region 9, which are formed in the active region of the p-type well 3, In short, the individual source regions and drain regions of the drive MISFETs $Qt_1$ and $Qd_2$ are constructed of the LDD structure. On the other hand, the individual source regions and drain regions of the load MISFETs $Qp_1$ and $Qp_2$ are formed of a lightly doped p⁻-type semiconductor region 11 and a heavily doped p⁺-type semiconductor region 12, which are formed in the active region of the n-type well 4. In short, the individual source regions and drain regions of the load MISFETs $Qp_1$ and $Qp_2$ are constructed of the LDD structure.

Over the aforementioned six MISFETs constituting the memory cell, there are formed a pair of local wiring lines $L_1$ and $L_2$ through a silicon oxide insulating film 13 and a side wall insulating film (or side wall spacer) 14, which cover the upper portions of the gate electrodes (6, 10$a$ and 10$b$) and the side walls. These paired local wiring lines $L_1$ and $L_2$ are formed of a refractory metal silicide film, which is formed by reacting a polycrystalline silicon film and a refractory metal film over the semiconductor substrate 1, such as a cobalt silicide ($CoSi_x$) film. The paired local wiring lines $L_1$ and $L_2$ are formed in self-alignment with the side wall insulating film 14, as will be described hereinafter. Moreover, the side wall insulating film 14 is formed in self-alignment with the gate electrodes (6, 10$a$ and 10$b$).

One local wiring line $L_1$ is connected with the drain region (i.e., the p$^+$-type semiconductor region 12) of the load MISFET $Qp_1$ and the drain region (i.e., the n$^+$-type semiconductor region 9) of the drive MISFET $Qd_1$ and the gate electrode 10$b$ of the drive MISFET $Qd_2$ and with the load MISFET $Qp_2$ through connection holes 15 which are opened in the insulating film 13. The other local wiring line $L_2$ is connected with the drain region (i.e., the n$^+$-type semiconductor region 9) of the load MISFET $Qp_2$ and the drain region (i.e., the n$^+$-type semiconductor region 9) of the drive MISFET $Qd_2$ and with the gate electrode 10$a$ of the drive MISFET $Qd_1$ and the load MISFET $Qp_1$ through the connection holes 15 which are opened in the insulating film 13.

The drain region (i.e., the n$^+$-type semiconductor region 9) of the transfer MISFET $Qt_1$ is formed on its surface with a refractory metal silicide layer such as a cobalt silicide (CoSi) layer 16, and the drain region (i.e., the n$^+$-type semiconductor region 9) of the transfer MISFET $Qt_2$ is formed on its surface with the same cobalt silicide layer 16. With the drain region of the transfer MISFETs $Qt_1$ and $Qt_2$, there are connected the data lines DL and $\overline{DL}$ through the cobalt silicide layer 16. This cobalt silicide layer 16 is formed at the same step as that of the local wiring lines $L_1$ and $L_2$, as will be described hereinafter.

The source region (i.e., the p$^+$-type semiconductor region 12) of the load MISFET $Qp_1$ and an n$^+$-type semiconductor region 18, as formed adjacent to that source region, are formed thereover with a refractory metal silicide layer such as a cobalt silicide layer 17. The source region (i.e., the p$^+$-type semiconductor region 12) of the load MISFET $Qp_2$ and the n$^+$-type semiconductor region 18, as formed adjacent to that source region, are also formed thereover with the same cobalt silicide layer 17. The source region and the n$^+$-type semiconductor region 18 of the load MISFETs $Qp_1$ and $Qp_2$ are individually supplied with the supply voltage ($V_{cc}$) through a later-described supply voltage line. The cobalt silicide layer 17 is formed at the same step as that of the local wiring lines $L_1$ and $L_2$ and the cobalt silicide layer 16.

Figure 5:
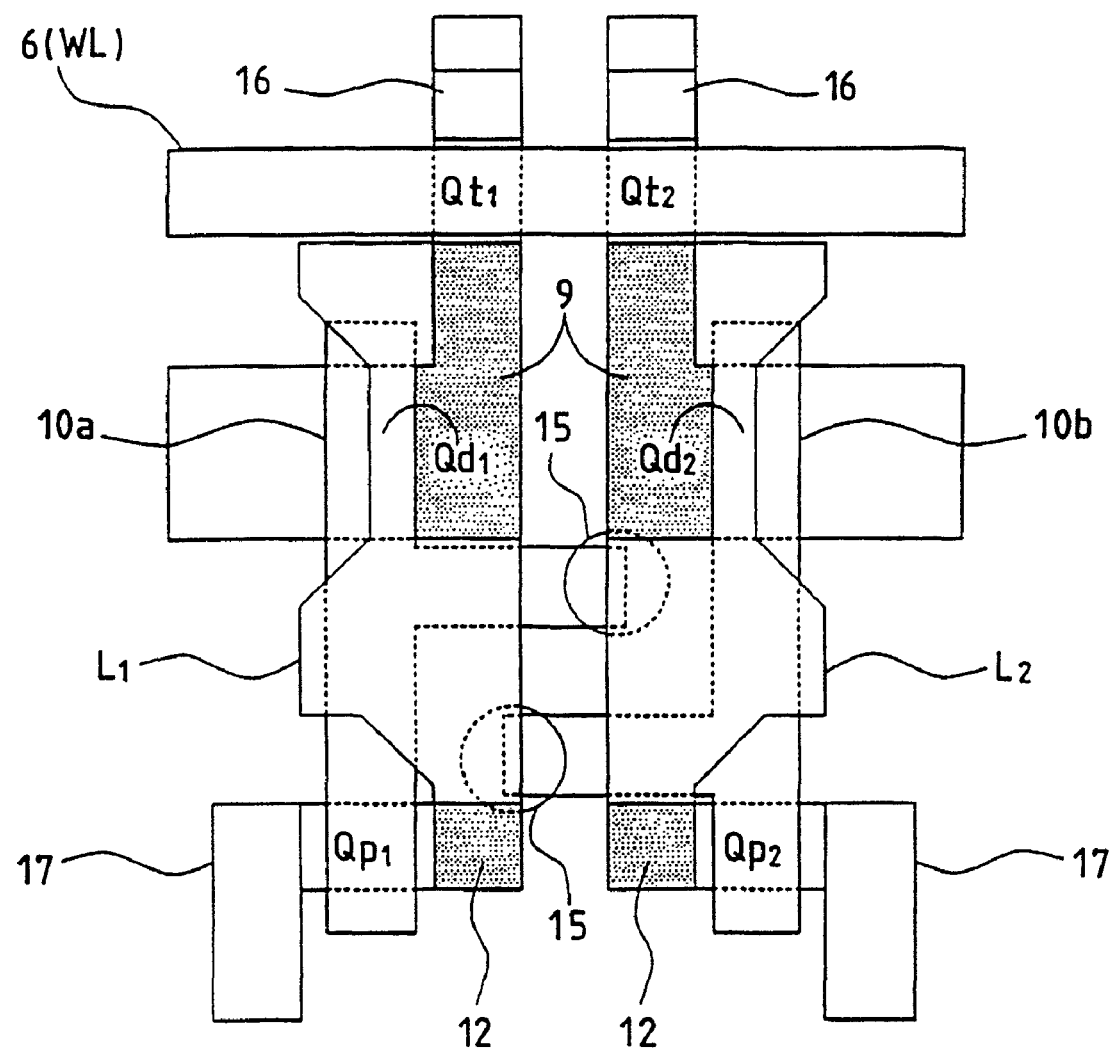
FIG. 5 is a top plan view showing the superposition of the local wiring lines and the storage nodes of the memory cell of the SRAM of the present invention.

FIGS. 4 and 5 are top plan views showing the layout of the aforementioned paired local wiring lines $L_1$ and $L_2$ and their underlying gate electrodes 10$a$ and 10$b$.

As shown in FIG. 4, one local wiring line $L_1$ extends to have its portion superposed over the gate electrode 10$a$, and the other local wiring line $L_2$ extends to have its portion superposed over the gate electrode 10$b$. Although not shown, however, the local wiring lines $L_1$ and $L_2$ may extend to have their portions superposed over the gate electrode 6 (i.e., the word line WL).

Thus, the memory cell of the SRAM of the present embodiment is arranged such that the local wiring lines $L_1$ and $L_2$ are superposed as much as possible over the gate electrode 10$a$ (of the drive MISFET $Qd_1$ and the load MISFET $Qp_1$), the gate electrode 10$b$ (of the drive MISFET $Qd_2$ and the load MISFET $Qp_2$) or the gate electrode 6 (i.e., the word line WL) (of the transfer MISFETs $Qt_1$ and $Qt_2$). Thanks to this construction, a gate capacity component ($C_1$) (as shown in FIG. 3) of the storage node capacity can be increased to increase the storage node capacity of the memory cell thereby to improve the resistance to an a ray soft error. Specifically, the gate electrodes 6, 10$a$ and 10$b$, the silicon oxide films 13 and 14 and the local wiring lines $L_1$ and $L_2$ constitute the capacity element $C_1$. The silicon oxide films 13 and 14 act as dielectric films of the capacity element $C_1$.

As shown by netted patterns in FIG. 5, moreover, one local wiring line $L_1$ is extended partially over the semiconductor region (i.e., the n$^+$-type semiconductor region 9 of the drive MISFET $Qd_1$ and the p$^+$-type semiconductor region 12 of the load MISFET $Qp_1$) constituting the storage node A of the memory cell, and the other local wiring line $L_2$ is extended partially over the semiconductor region (i.e., the n$^+$-type 9 of the drive MISFET $Qd_2$ and the p$^+$-type semiconductor region 12 of the load MISFET $Qp_2$) constituting the storage node B of the memory cell.

In short, the memory cell of the SRAM of the present embodiment is arranged such that the local wiring lines $L_1$ and $L_2$ are partially superposed over the storage nodes A and B of the memory cell. Thanks to this construction, the capacity component of the diffusion layer of the storage node capacity can be increased to increase the storage node capacity of the memory cell thereby to improve the resistance to the a ray soft error.

Figure 6:
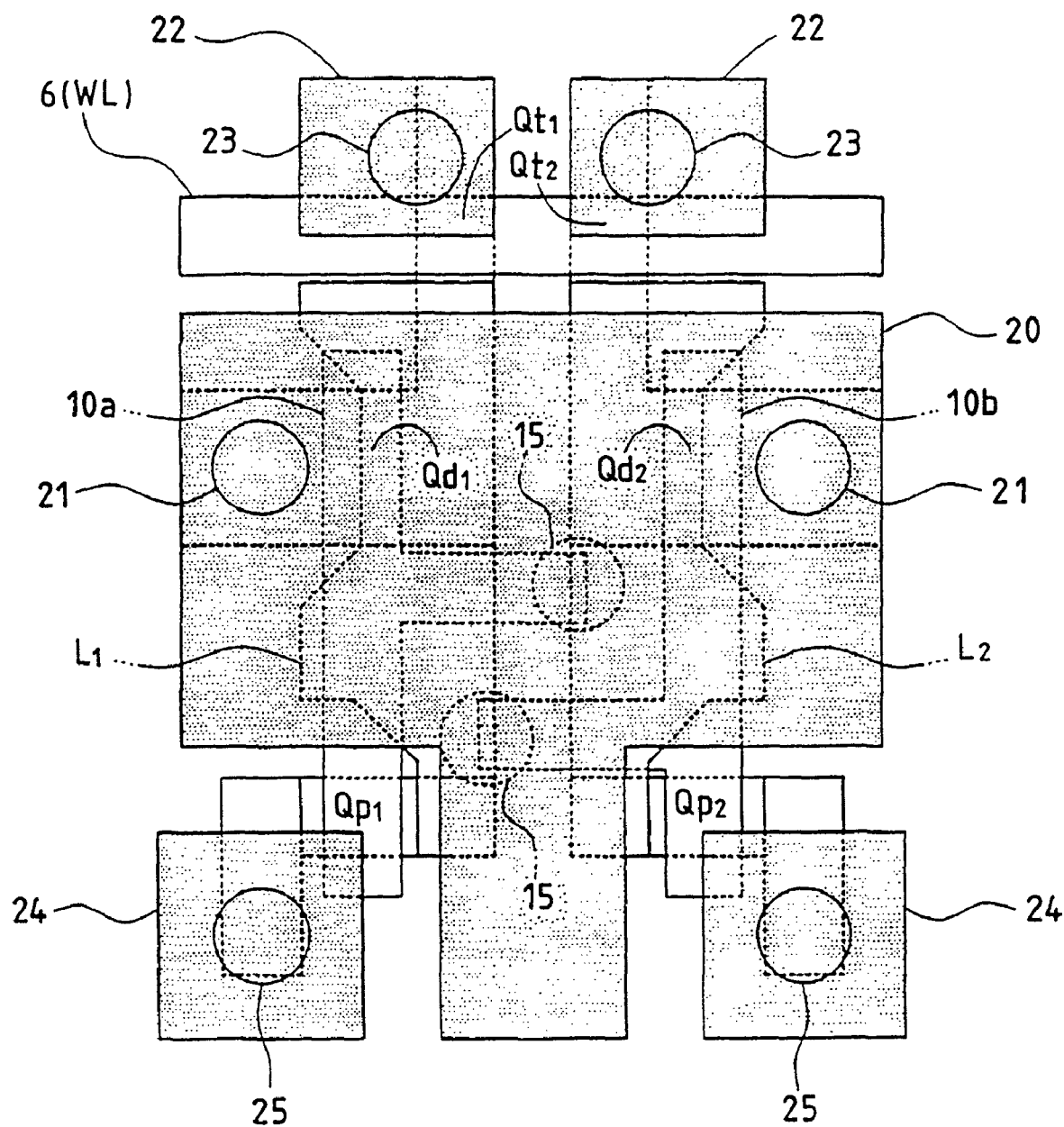
FIG. 6 is a top plan view showing the super-position of the local wiring lines and the reference voltage line of the memory cell of the SRAM of the present invention.

Over the aforementioned local wiring lines $L_1$ and $L_2$, as shown in FIGS. 2 and 6, there is formed a reference voltage line 20 through a thin insulating film 19 which is formed of a laminated film of a silicon oxide film and a silicon nitride film. This reference voltage line 20 is arranged to cover the local wiring lines $L_1$ and $L_2$. The reference voltage line 20 is made of a polycrystalline silicon film doped with an n-type impurity (e.g., P) and is connected with the individual source regions (i.e., the n$^+$-type semiconductor region 9) of the drive MISFETs $Qd_1$ and $Qd_2$ through connection holes (as shown in FIG. 1) opened in the insulating film 19 and an insulating film (identical to the gate insulating film 7).

Over the drain region (i.e., the n$^+$-type semiconductor region 9) of the transfer MISFETs $Qt_1$ and $Qt_2$, there is formed a pad layer 22 which is made of the same polycrystalline silicon film as that of the aforementioned reference voltage line 20. This pad layer 22 is electrically connected with the aforementioned refractory metal silicide layer 16 through connection holes 23 which are opened in the insulating film 19. Over the individual source regions (i.e., the p$^+$-type semiconductor region 12) of the load MISFETs $Qp_1$ and $Qp_2$, there is formed a pad layer 24 which is made of the same polycrystalline silicon film as the aforementioned reference voltage line 20. This pad layer 24 is electrically connected with the aforementioned refractory metal silicide layer 17 through connection holes 25 opened in the insulating film 19.

Figure 7:
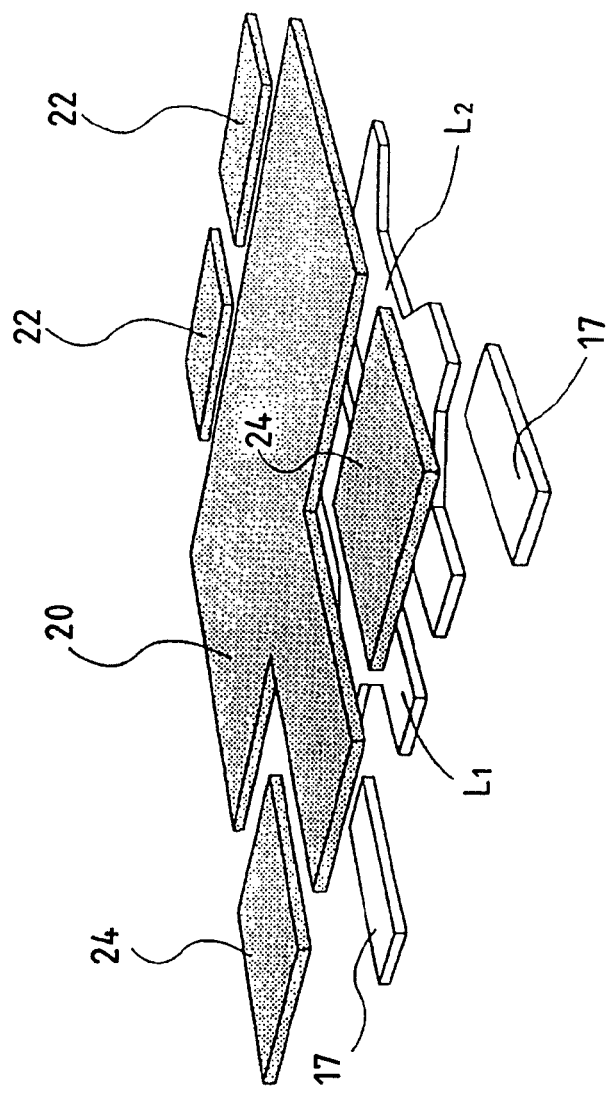
FIG. 7 is a perspective view showing the superposition of the local wiring lines and the reference voltage line of the memory cell of the SRAM of the present invention.

FIG. 6 is a top plan view showing the layout of the aforementioned reference voltage line 20 and the underlying local wiring lines $L_1$ and $L_2$, and FIG. 7 is a perspective view of the same.

As shown, the reference voltage line 20 is formed to cover substantially all over the local wiring lines $L_1$ and $L_2$. Specifically, the memory cell of the SRAM of the present embodiment is arranged such that the reference voltage line 20 formed over the local wiring lines $L_1$ and $L_2$ is superposed over the local wiring lines $L_1$ and $L_2$. Thanks to this construction, the reference voltage line 20, the local wiring lines $L_1$ and $L_2$ and the thin insulating film (i.e., the dielectric film) 19 sandwiching former constitute a capacity element ($C_2$) so that the capacity of the storage nodes A and B connected with the local wiring lines $L_1$ and $L_2$ can be increased to improve the resistance of the memory cell to the α ray soft error.

Over the aforementioned reference voltage line 20, as shown in FIGS. 1 and 2, there is formed a first-layered metal wiring line through an inter-layer insulating film 26. This inter-layer insulating film 26 is formed of a laminated film of a silicon oxide film and a BPSG (i.e., Boro Phospho Silicate Glass) film. The first-layered metal wiring line is made of an aluminum (Al) alloy, for example, to constitute a supply voltage line 27, a sub-reference voltage line 28, a sub-word line (or a divided word line) 29 and a pad layer 30.

The supply voltage line 27 is electrically connected with the aforementioned pad layer 24 through connection holes 31 opened in the inter-layer insulating film 26. The sub-reference voltage line 28 is electrically connected with the reference voltage line 20 through connection holes 32 (as shown in FIG. 1) opened in the inter-layer insulating film 26. The sub-word line 29 is electrically connected with the aforementioned word line WL through the (not-shown) connection holes opened in the inter-layer insulating film 26 and the insulating films 19 and 13. The pad layer 30 is electrically connected with the aforementioned pad layer 22 through connection holes 33 opened in the inter-layer insulating film 26.

Thus, in the memory cell of the SRAM of the present embodiment, the reference voltage line 20, as made of a polycrystalline silicon film, is overlaid by the sub-reference voltage line 28, which is made of Al having a lower resistance than polycrystalline silicon, and is supplied with the electric power from the sub-reference voltage line 28 through the connection holes 32, at least one of which is formed in each memory cell. Thanks to this construction, the reference voltage ($V_{ss}$) can be supplied to each memory cell so that it can be stabilized. As a result, the supply voltage ($V_{cc}$) can have its minimum value ($V_{cc.min}$) increased to improve the resistance of the memory cell to the α ray soft error.

In the memory cell of the SRAM of the present embodiment, as shown in FIG. 1, the aforementioned connection hole 32 for connecting the sub-reference voltage line 28 and the reference voltage line 20 and the aforementioned connection hole 21 for connecting the reference voltage line 20 and the source region (i.e., the n$^+$-type semiconductor region 9) of the drive MISFETs $Qd_1$ and $Qd_2$ are arranged at a spacing from each other. Thanks to this construction, the step, which might otherwise be formed by the overlap of the connection holes 21 and 32, can be avoided to flatten the connection forming regions so that the contact resistances of the connection holes 21 and 32 can be reduced to operate the memory cell at a high speed and at a low voltage.

The aforementioned first-layered metal wiring line is overlaid by the second-layered metal wiring line through an inter-layer insulating film 34. This inter-layer insulating film 34 is formed of a three-layered film which is composed of a silicon oxide film 34a, a spin-on-glass film 34b and a silicon oxide film 34c sequentially in the recited order from the lower-most layer. The second-layered metal wiring line is made of an aluminum alloy, for example, to constitute the aforementioned data lines DL and $\overline{DL}$. These data lines DL and $\overline{DL}$ are electrically connected with the aforementioned pad layer 30 through connection holes 35 which are opened in the inter-layer insulating film 34.

Figure 8:
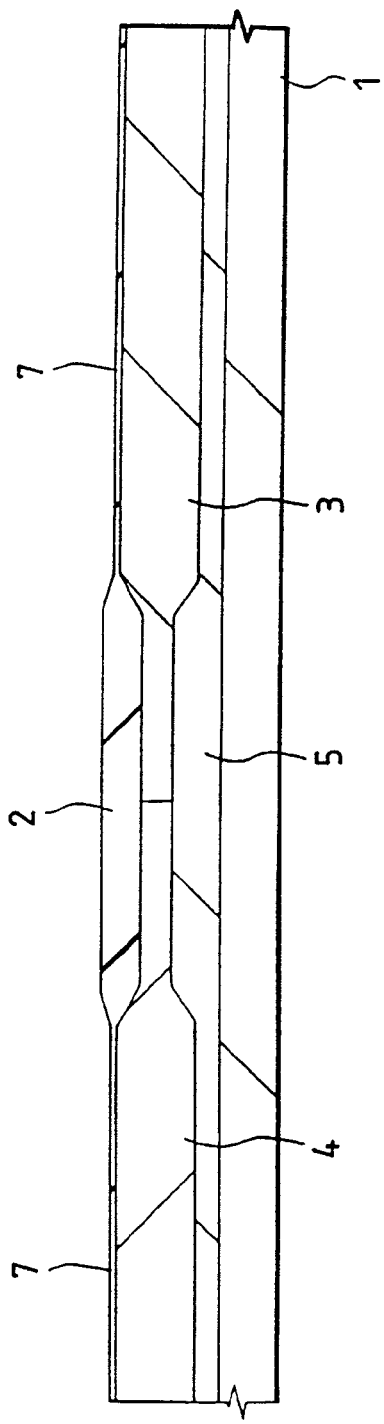
FIG. 8 is a section of an essential portion of a semiconductor substrate and shows a process for manufacturing the memory cell of the SRAM of the present invention.

Here will be described a process for manufacturing the memory cell of the SRAM of the present embodiment thus constructed. Incidentally, the sections of the Figures (i.e., FIGS. 8 to 39) showing the memory cell manufacturing method are taken along line II-II' of FIG. 1. On the other hand, the top plan views show only the conducting layers, and the insulating films between the individual conducting layers are not shown. First of all, the p-type epitaxial silicon layer 5 is made to grow on the semiconductor substrate 1 made of p$^-$-type single crystal silicon, as shown in FIG. 8. After this, the field insulating film 2, as made of a thick silicon oxide film, is formed on the surface of the epitaxial silicon layer 5 by the well-known LOCOS method using a silicon nitride film as the thermal oxidation mask. Subsequently, the epitaxial silicon layer 5 is doped with an n-type impurity (P) and a p-type impurity ($BF_2$) by the ion implantation method using a photoresist as the mask. After this, these impurities are extended and diffused to form the p-type well 3 and the n-type well 4. Next, these p-type well 3 and n-type well 4, as enclosed by the field insulating film 2, are formed on their individual principal surfaces with the gate insulating film 7 made of a thin silicon oxide film having a thickness as small as about 9 nm.

Figure 9:
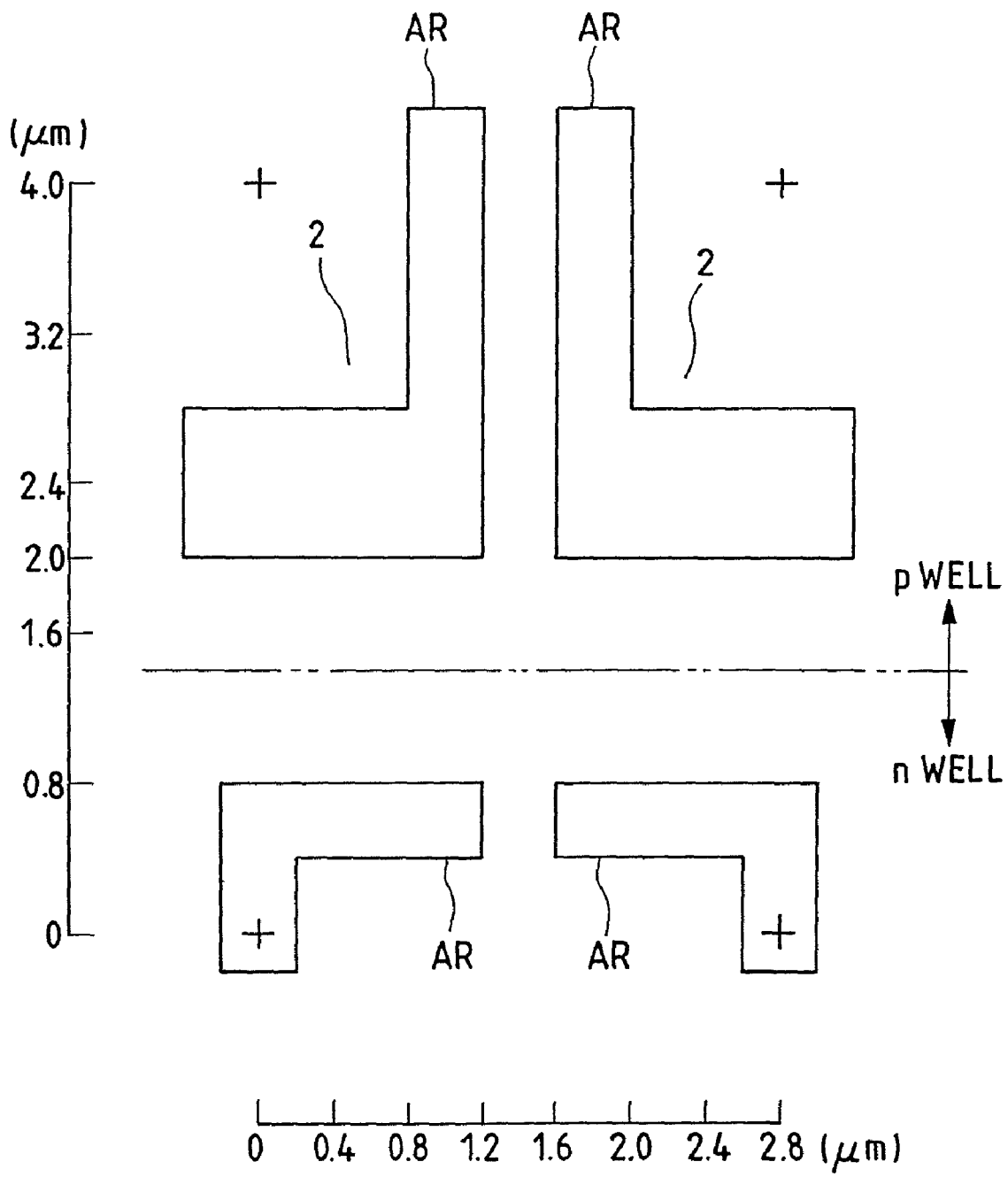
FIG. 9 is a top plan view showing the active region of the memory cell of the SRAM of the present invention.
Figure 10:
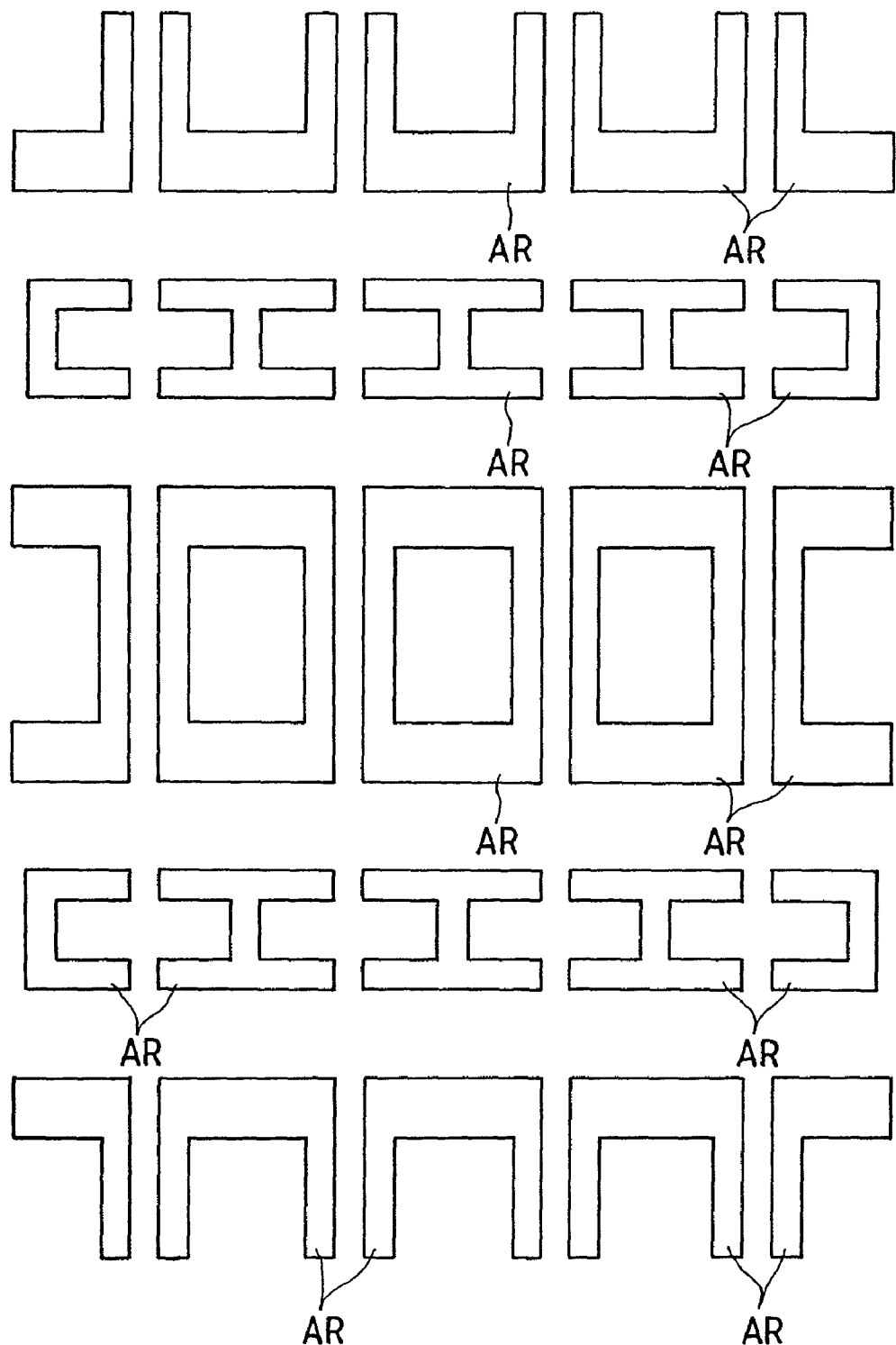
FIG. 10 is a top plan view showing the active region patterns for the sixteen memory cells of the SRAM of the present invention.

FIG. 9 is a top plan pattern of an active region AR (of one memory cell) enclosed by the aforementioned field insulating film 2. The memory cell is formed in the rectangular region which is defined by the four "+" symbols in FIG. 9. This memory cell has its size exemplified by about 4.0 (μm)×2.8 (μm). Moreover, the pattern of the active pattern AR of the sixteen memory cells is shown in FIG. 10.

Figure 12:
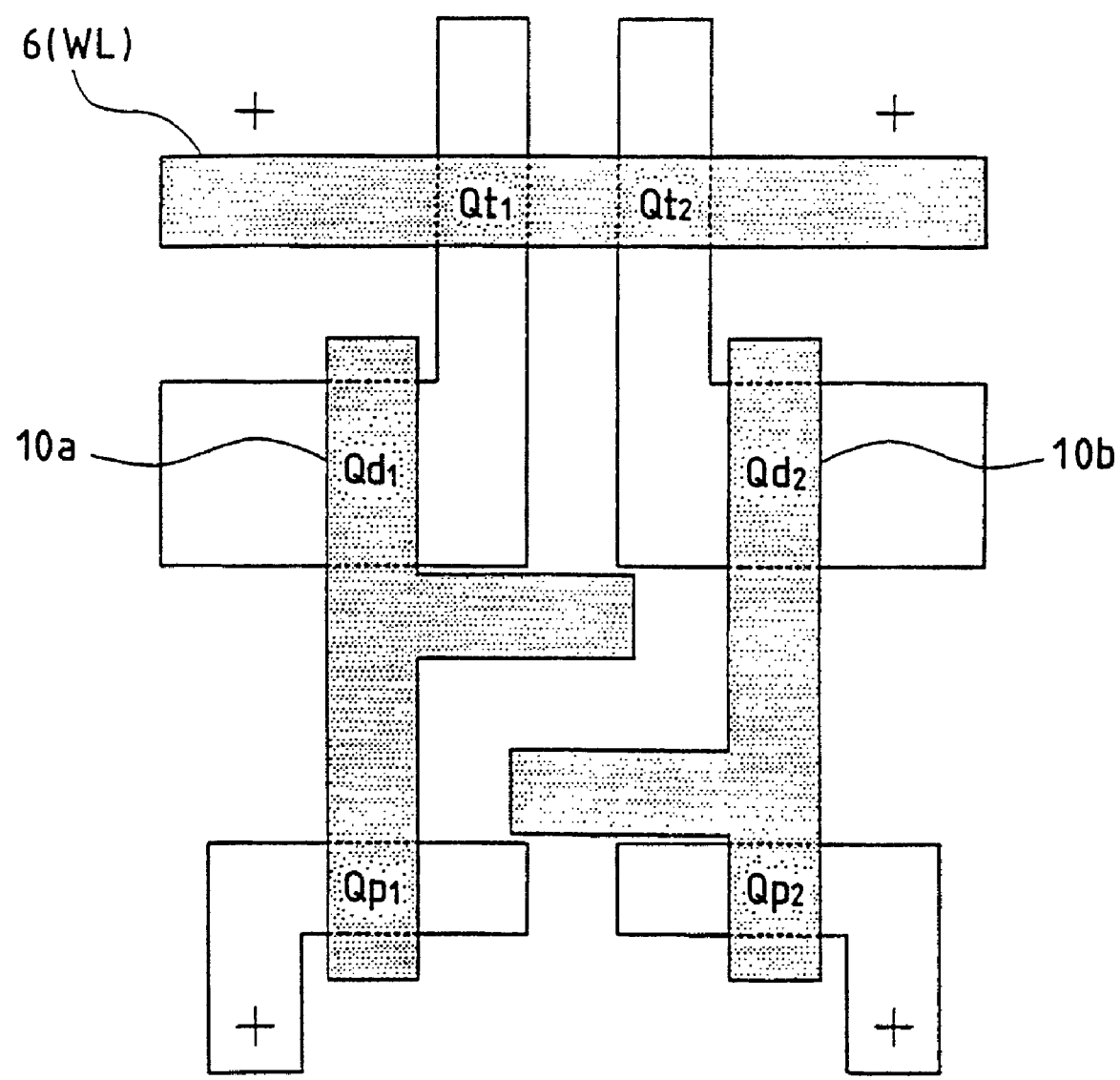
FIG. 12 is a top plan view of an essential portion of the semiconductor substrate and shows a process for manufacturing the memory cell of the SRAM of the present invention.
Figure 13:
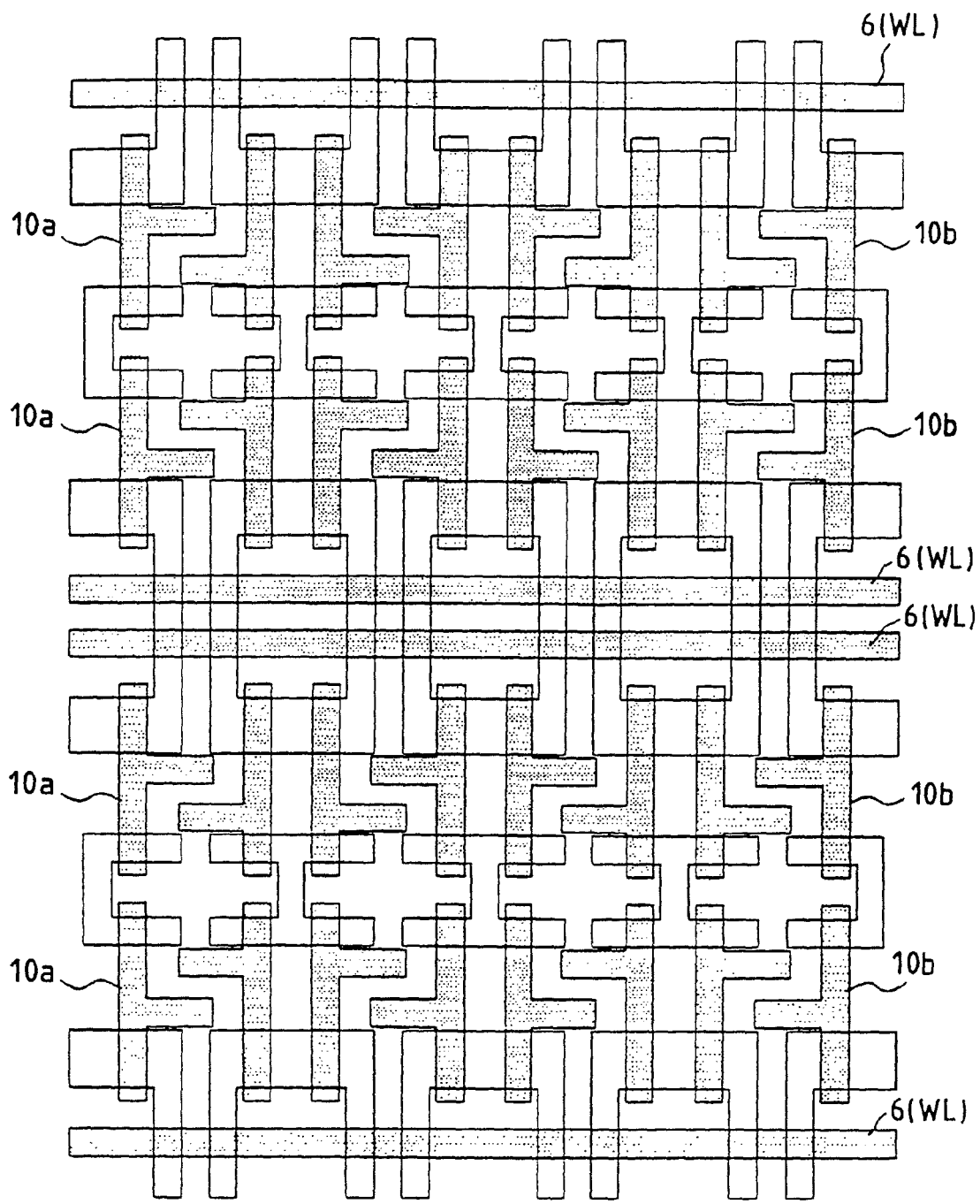
FIG. 13 is a top plan view showing a gate electrode (or word line) pattern for the sixteen memory cells of the SRAM of the present invention.
Figure 17:
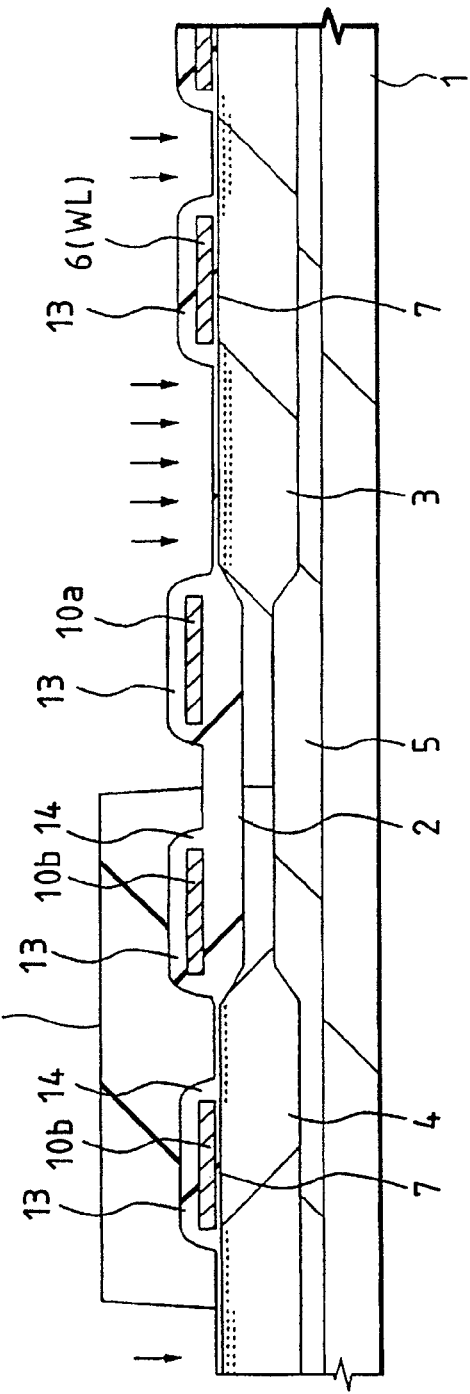
FIG. 17 is a section of an essential portion of the semiconductor substrate and shows a process for manufacturing the memory cell of the SRAM of the present invention.

Next, the gate electrode 6 (i.e., the word line WL) of the transfer MISFETs $Qt_1$ and $Qt_2$ and the gate electrodes 10a and 10b of the drive MISFETs $Qt_1$ and $Qd_2$ and the load MISFETs $Qp_1$ and $Qp_2$ are formed, as shown in FIGS. 11 and 12. The gate electrode 6 (or the word line WL) and the gate electrodes 10a and 10b are formed, for example, by depositing a polycrystalline silicon film having a thickness of about 100 nm all over the semiconductor substrate 1 by the CVD (i.e., Chemical Vapor Deposition) method, subsequently by depositing the insulating film 13 of silicon oxide (having a thickness of about 120 nm) by the CVD method, and by patterning the insulating film 13 and the polycrystalline silicon film by the dry etching method. FIG. 13 shows a pattern of the gate electrodes 6 (i.e., the word lines WL) and the gate electrodes 10a and 10b for the sixteen memory cells.

Next, the p-type well 3 and the n-type well 4 are partially doped with n-type impurities (phosphorous (P) and arsenic (As)) by the ion implantation using a photoresist PL1 as the mask, as shown in FIG. 14. Next, the photoresist PL1 is removed, and the n-type well 4 is doped with a p-type impurity (e.g., boron fluoride ($BF_2$)) by the ion implantation method using a photoresist PL2 as the mask, as shown in FIG. 15. Next, the photoresist PL2 is removed, the silicon oxide film, as deposited all over the semiconductor substrate 1 by the CVD method, is patterned by the RIE (i.e., Reactive Ion Etching) method, for example, the side wall insulating film (i.e., the side wall spacer) 14 in self-alignment with the side walls of the gate electrode 6 (i.e., the word line WL) and the gate electrodes 10a and 10b, as shown in FIG. 16.

Figure 18:
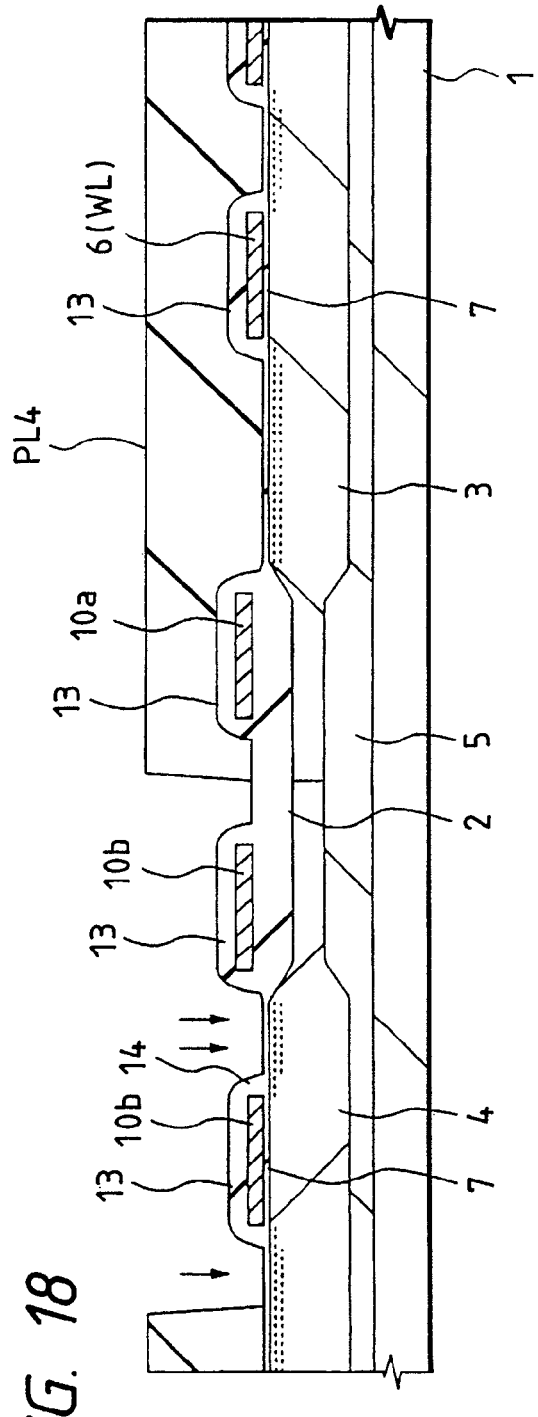
FIG. 18 is a section of an essential portion of the semiconductor substrate and shows a process for manufacturing the memory cell of the SRAM of the present invention.

Next, the p-type well 3 and the n-type well 4 are partially doped with an n-type impurity (P and As) by the ion implantation using a photoresist PL3 as the mask. Next, the photoresist film PL3 is removed, and the n-type well 4 is doped with a p-type impurity ($BF_2$) by the ion implantation method using a photoresist PL4 as the mask, as shown in FIG. 18.

Figure 19:
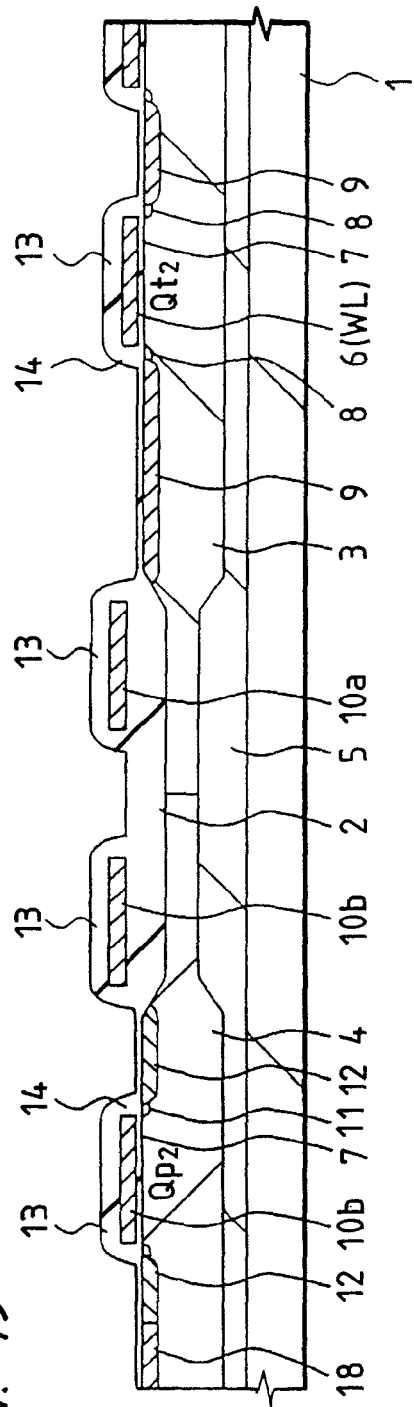
FIG. 19 is a section of an essential portion of the semiconductor substrate and shows a process for manufacturing the memory cell of the SRAM of the present invention.

Next, the photoresist PL4 is removed, and the n-type impurity and the p-type impurity are thermally diffused to form the principal surface of the p-type well 3 with the individual source region and drain region (i.e., the n$^-$-type semiconductor region 8 and the n$^+$-type semiconductor region 9) of the transfer MISFETs $Qt_1$ and $Qt_2$ and the drive MISFETs $Qd_1$ and $Qd_2$ and the principal surface of the n-type well 4 with the source region and drain region (i.e., the p⁻-type semiconductor region 11 and the p⁺-type semiconductor region 12) of the load MISFETs $Qp_1$ and $Qp_2$, as shown in FIG. 19.

Figure 20:
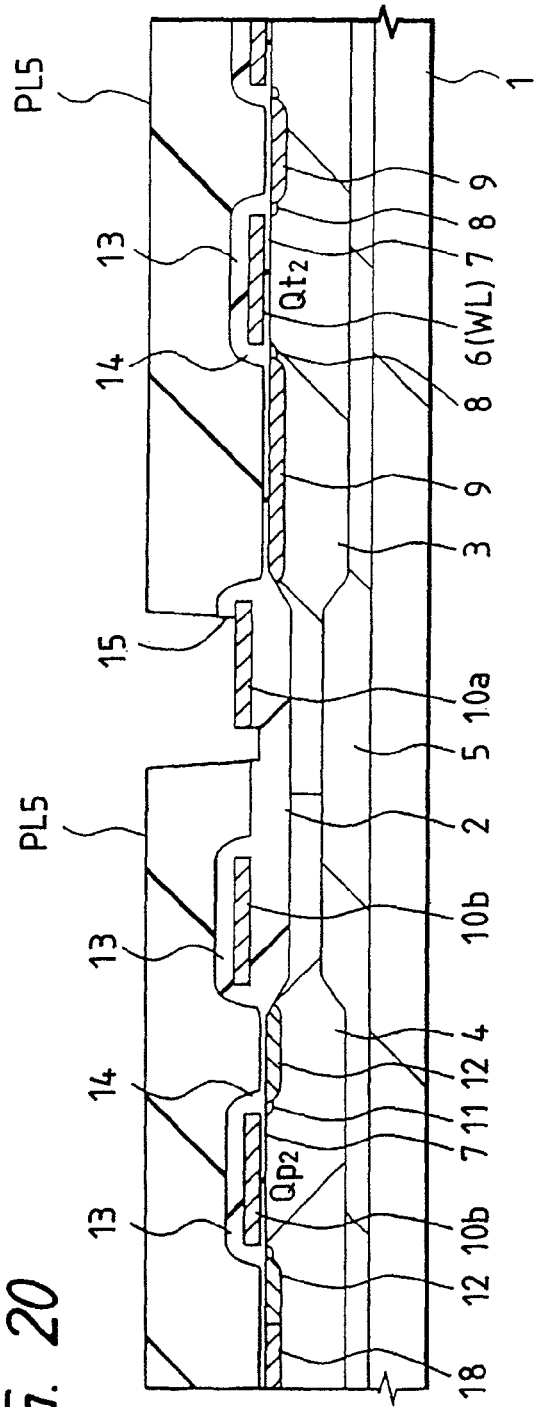
FIG. 20 is a section of an essential portion of the semiconductor substrate and shows a process for manufacturing the memory cell of the SRAM of the present invention.
Figure 21:
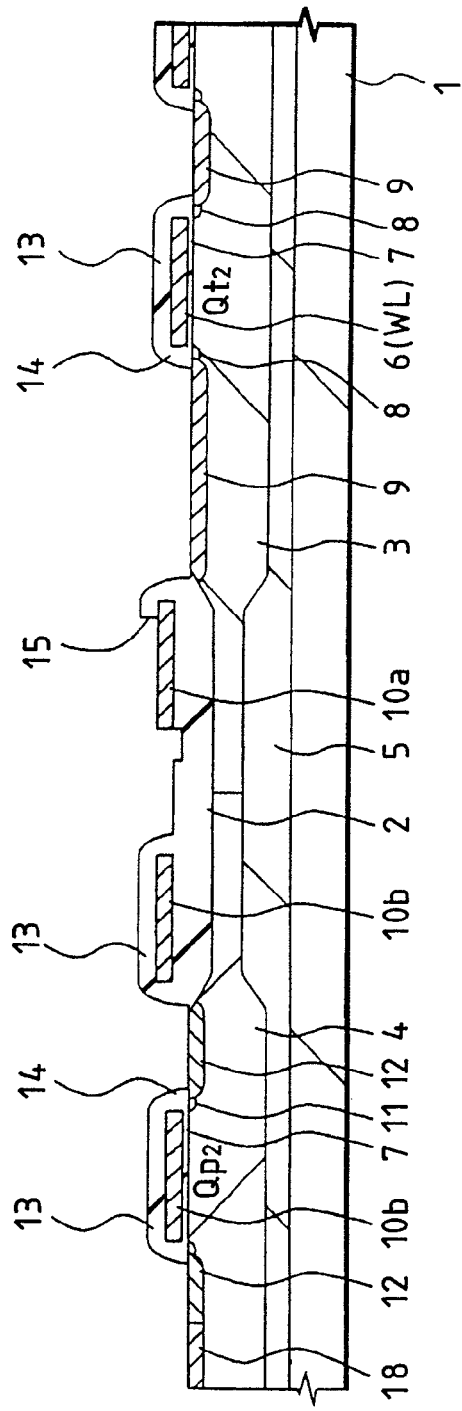
FIG. 21 is a section of an essential portion of the semiconductor substrate and shows a process for manufacturing the memory cell of the SRAM of the present invention.

Next, the insulating film 14, as covering the gate electrodes 10a and 10b of the drive MISFETs $Qd_1$ and $Qd_2$, is formed with the connection hole 15 by the dry etching method using a photoresist PL5 as the mask, as shown in FIG. 20, to partially expose the gate electrodes 10a and 10b.

Next, the photoresist PL5 is removed, and the semiconductor substrate 1 is etched back all over its surface to remove the insulating film (i.e., the same insulating film as the gate insulating film 7) covering the individual surfaces of the individual source and drain region (i.e., the n⁺-type semiconductor region 9) of the drive MISFETs $Qd_1$ and $Qd_2$ and the transfer MISFETs $Qt_1$ and $Qt_2$, the source region and drain region (i.e., the p⁺-type semiconductor region 12) of the load MISFETs $Qp_1$ and $Qp_2$, and the well energizing n⁺-type semiconductor region 18, thereby to expose the n⁺-type semiconductor region 9, the p⁺-type semiconductor region 12 and the n⁺-type semiconductor region 18.

Thus, in the manufacture process of the present embodiment, the insulating film 13 over the gate electrodes 10a and 10b is formed at first with the connection hole 15 by the dry etching method using the photoresist PL5 as the mask, and the semiconductor substrate 1 is then etched all over the surface to remove the insulating film covering the individual surfaces of the n⁺-type semiconductor region 9, the p⁺-type semiconductor region 12 and the n⁺-type semiconductor region 18.

In other words, the step of partially exposing the gate electrodes 10a and 10b and the step of exposing the n⁺-type semiconductor region 9, the p⁺-type semiconductor region 12 and n⁺-type semiconductor region 18 are executed separately of each other to expose the n⁺-type semiconductor region 9, the p⁺-type semiconductor region 12 and the n⁺-type semiconductor region 18 in self-alignment with the side wall insulating film 14. Thanks to this construction, no mask allowance is required for the connection hole 15 with the n⁺-type semiconductor region 9, the p⁺-type semiconductor region 12 and the n⁺-type semiconductor region 18 so that the areas for the connection hole 15, the n⁺-type semiconductor region 9, the p⁺-type semiconductor region 12 and the n⁺-type semiconductor region 18 can be reduced to highly integrate the memory cell.

Incidentally, in case the mask alignment is allowed, the aforementioned means may be replaced by the dry etching method using a photoresist as the mask to simultaneously expose the portions of the gate electrodes 10a and 10b, the n⁺-type semiconductor region 9, the p⁺-type semiconductor region 12 and n⁺-type semiconductor region 18. In this case, the aforementioned etching-back step is not necessary so that the manufacture process for the memory cell can be shortened.

Figure 22:
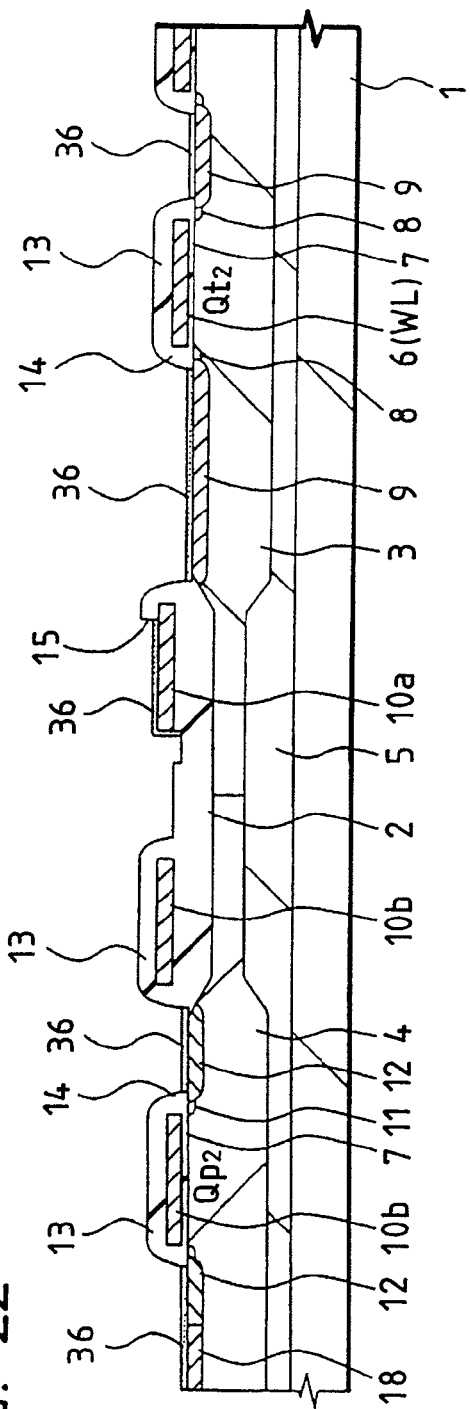
FIG. 22 is a section of an essential portion of the semiconductor substrate and shows a process for manufacturing the memory cell of the SRAM of the present invention.
Figure 23:
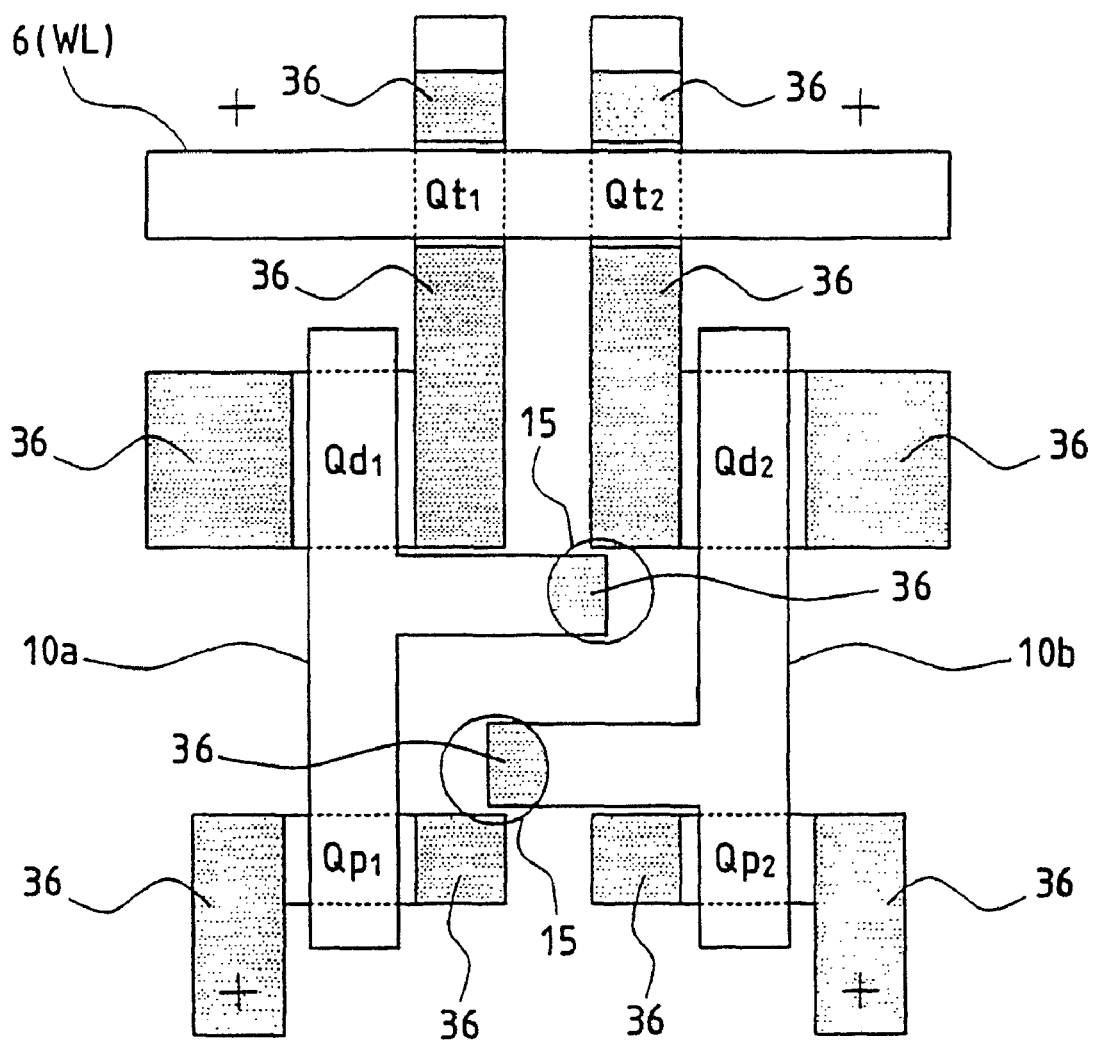
FIG. 23 is a top plan view of an essential portion of the semiconductor substrate and shows a process for manufacturing the memory cell of the SRAM of the present invention.

Next, as shown in FIGS. 22 and 23, a thin polycrystalline silicon film 36 having a thickness of about 40 nm is selectively deposited by the selective CVD method over the individual surfaces of the portions of the gate electrodes 10a and 10b, the n⁺-type semiconductor region 9, the p⁺-type semiconductor region 12 and the n⁺-type semiconductor region 18, which are exposed by the aforementioned step. In other words, the polycrystalline silicon film 36 is deposited only on the gate electrodes 10a and 10b, the n⁺-type semiconductor region 9, the p⁺-type semiconductor region 12 and the n⁺-type semiconductor region 18 but not onto the insulating films 13 and 14 made of a silicon oxide film. Alternatively, the polycrystalline silicon film 36 may be left on the individual surfaces of the portions of the gate electrodes 10a and 10b, the n⁺-type semiconductor region 9, the p⁺-type semiconductor region 12 and the n⁺-type semiconductor region 18 by depositing the polycrystalline silicon film 36 on the entire surface of the semiconductor substrate 1 and by patterning the polycrystalline silicon film 36 by the dry etching method using the photoresist as the mask.

Figure 24:
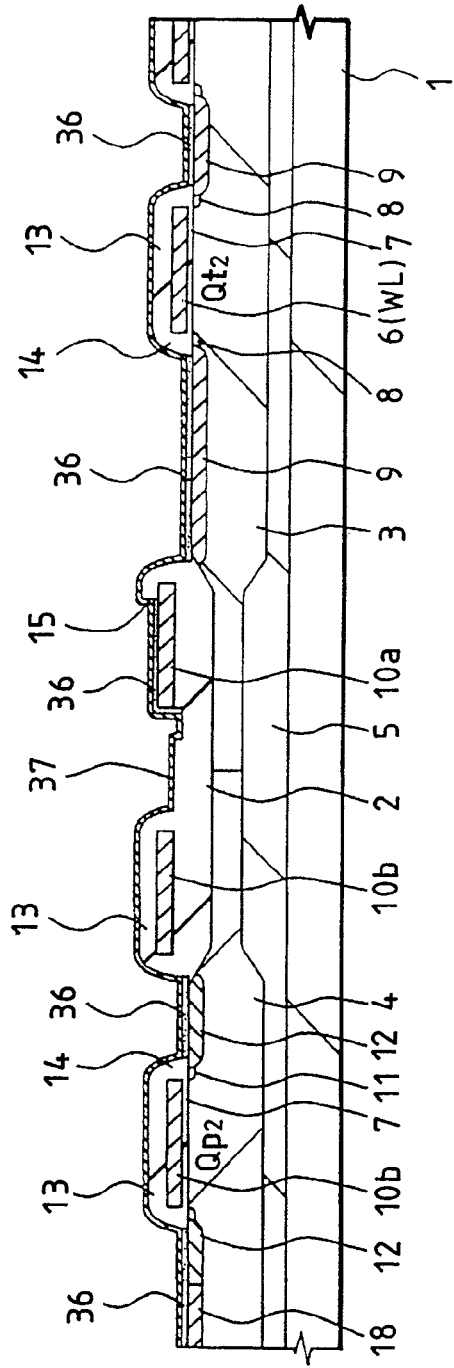
FIG. 24 is a section of an essential portion of the semiconductor substrate and shows a process for manufacturing the memory cell of the SRAM of the present invention.
Figure 25:
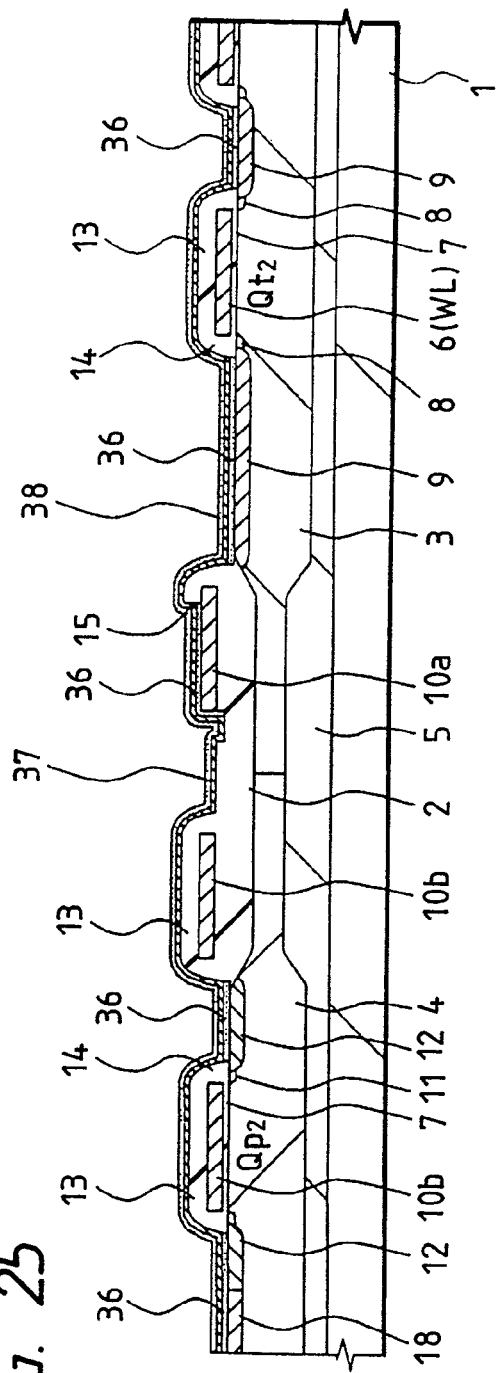
FIG. 25 is a section of an essential portion of the semiconductor substrate and shows a process for manufacturing the memory cell of the SRAM of the present invention.

Next, as shown in FIG. 24, a thin Co film 37 having a thickness of about 20 nm is deposited all over the surface of the semiconductor substrate 1 by the sputtering method, an; as shown in FIG. 25, a thin polycrystalline silicon film 38 having a thickness of about 40 nm is then deposited all over the surface of the semiconductor substrate 1 by the CVD method or the sputtering method. Thus, according to the manufacture process of the present embodiment, the polycrystalline silicon film 36, the Co film 37 and the polycrystalline silicon film 38 are deposited on the individual surfaces of the portions of the gate electrodes 10a and 10b, the n⁺-type semiconductor region 9, the p⁺-type semiconductor region 12 and the n⁺-type semiconductor region 18, whereas the Co film 37 and the polycrystalline silicon film 38 are deposited on the remaining regions (e.g., the insulating film). Incidentally, in place of the aforementioned Co film 37, there may be deposited another refractory metal film such as a thin film of W (tungsten), Mo (molybdenum), Ti (titanium) or Ta (tantalum).

Figure 26:
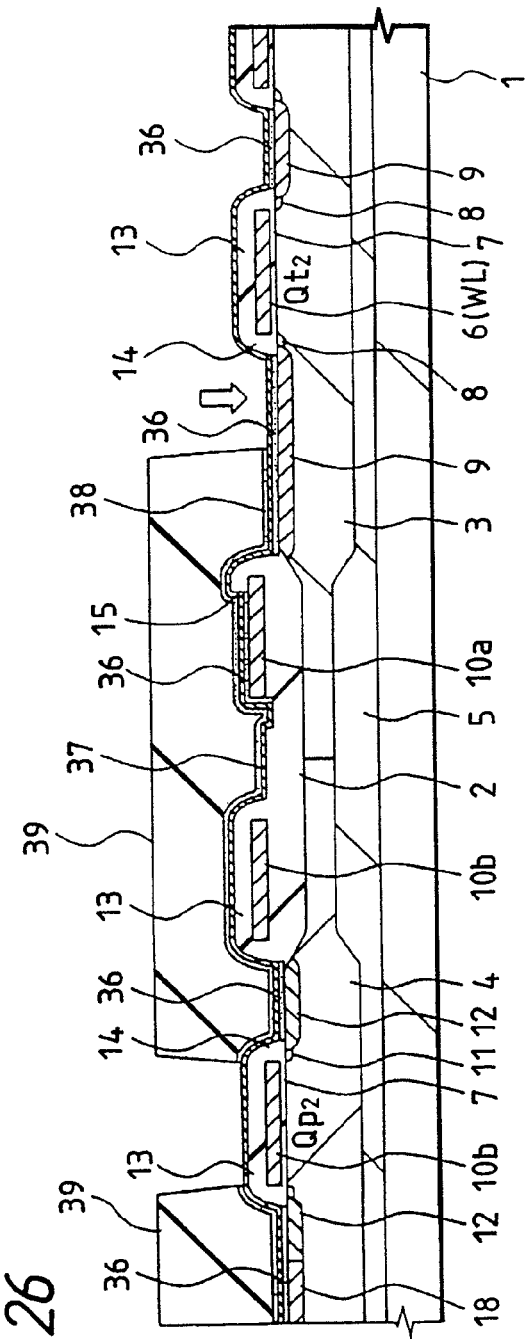
FIG. 26 is a section of an essential portion of the semiconductor substrate and shows a process for manufacturing the memory cell of the SRAM of the present invention.

Next, as shown in FIG. 26, the overlying polycrystalline silicon film 38 is patterned by the dry etching method using a photoresist 39 so that it is left on the individual surfaces of the region to be formed with the local wiring lines $L_1$ and $L_2$, the drain region (i.e., the n⁺-type semiconductor region 9) of the transfer MISFETs $Qt_1$ and $Qt_2$, the source region (i.e., the p⁺-type semiconductor region 12) of the load MISFETs $Qp_1$ and $Qp_2$, and the n⁺-type semiconductor region 9 adjacent to the former.

The photoresist 39 acting as the etching mask of the aforementioned polycrystalline silicon film 38 need not completely cover the drain region (i.e., the n⁺-type semiconductor region 9) of the drive MISFETs $Qd_1$ and $Qd_2$ and the drain region (i.e., the p⁺-type semiconductor region 12) of the load MISFETs $Qp_1$ and $Qp_2$. In other words, there arises no problem even if the portion (as indicated by arrow in FIG. 26) of the polycrystalline silicon film 38 on the n⁺-type semiconductor region 9 is etched out by the mask misalignment of the photoresist 39, as shown in FIG. 26. This is because even if the polycrystalline silicon film 38 is partially etched out, the underlying Co film 37 acts as the etching stopper so that the polycrystalline silicon film 36 on the surfaces of the n⁺-type semiconductor region 9 and the p⁺-type semiconductor region 12 is not etched out.

Although not especially limited, in the present embodiment, when the aforementioned polycrystalline silicon film 38 is to be etched, it is left on such an n⁺-type semiconductor region 9 (i.e., the drain region) of the n⁺-type semiconductor region 9 (i.e., the source region and the drain region) of the drive MISFETs $Qd_1$ and $Qd_2$ as constitutes the storage nodes A and B of the memory cell, but not on the n⁺-type semiconductor region 9 (i.e., the source region) which does not constitute the storage nodes A and B. The polycrystalline silicon film 38 on the n⁺-type semiconductor region 9 (i.e., the source region) need not be wholly removed but may be partially left to cause no trouble by the mask misalignment of the photoresist 39.

Figure 27:
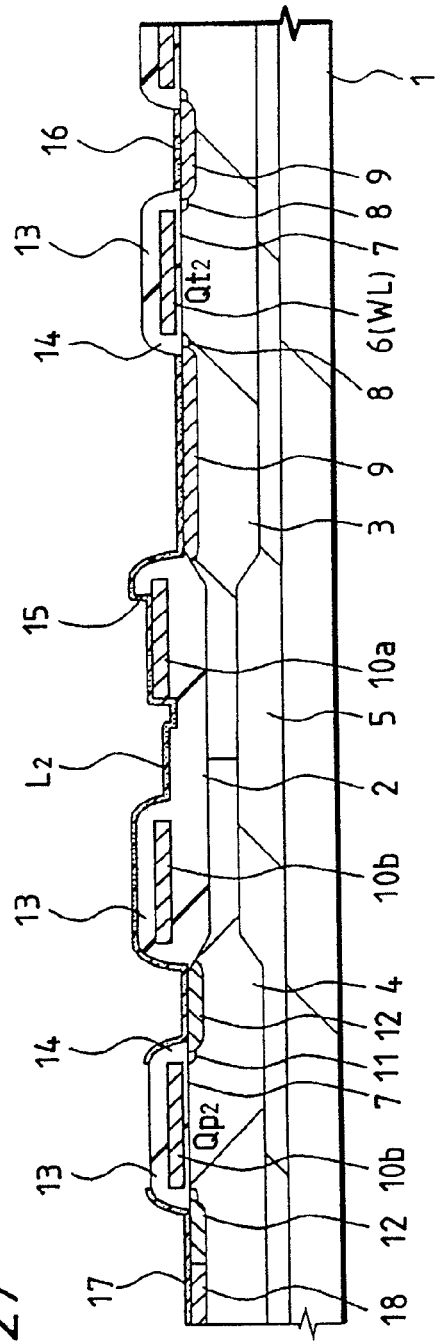
FIG. 27 is a section of an essential portion of the semiconductor substrate and shows a process for manufacturing the memory cell of the SRAM of the present invention.
Figure 28:
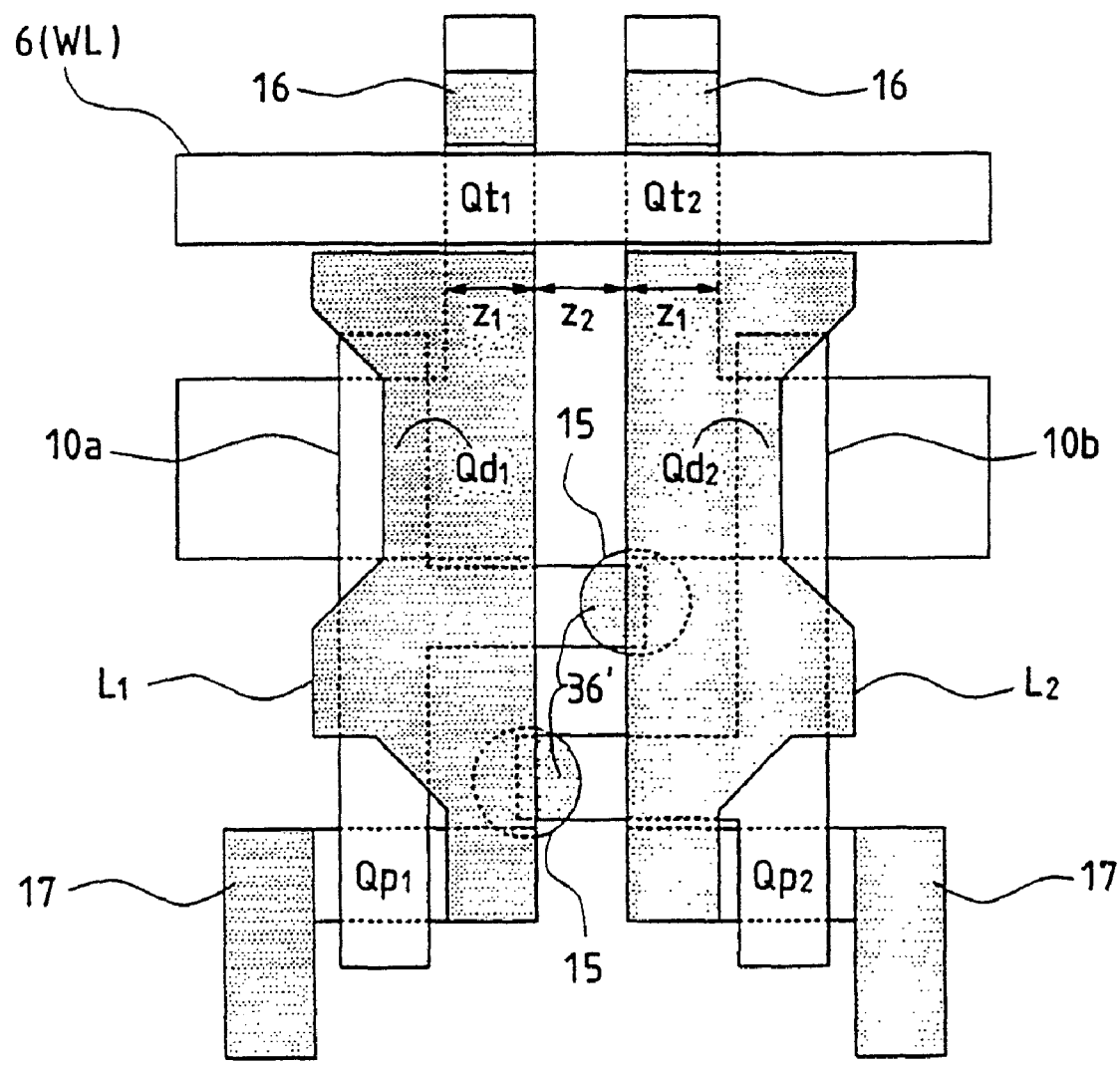
FIG. 28 is a top plan view of an essential portion of the semiconductor substrate and shows a process for manufacturing the memory cell of the SRAM of the present invention.
Figure 29:
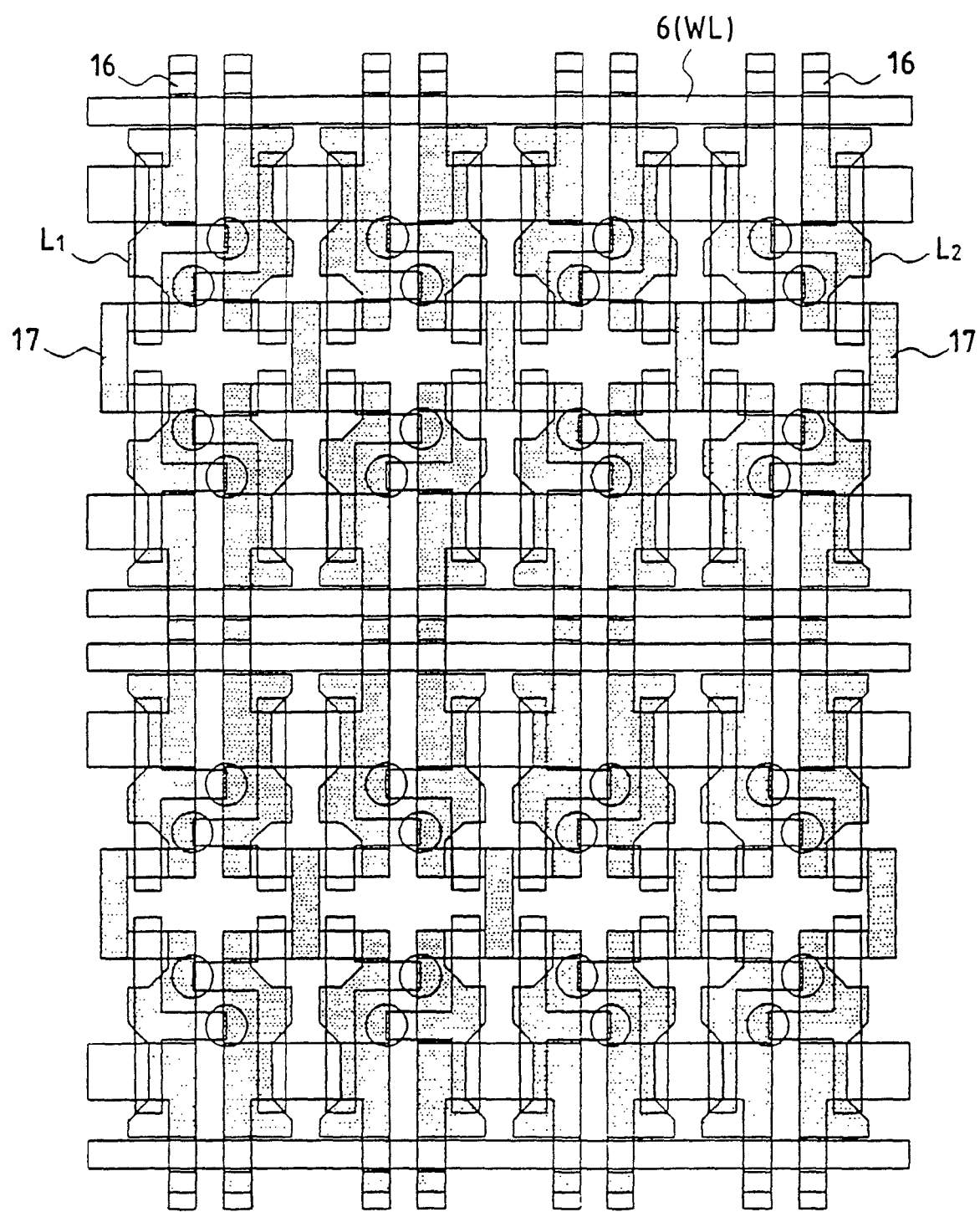
FIG. 29 is a top plan view showing the local wiring line pattern for the sixteen memory cells of the SRAM of the present invention.

Next, this photoresist 39 is removed, and the semiconductor substrate 1 is subjected to a heat treatment in the atmosphere of inert gases at about 700° C. to cause a silicifying reaction among the polycrystalline silicon film 38, the Co film 37 and the polycrystalline silicon film 36. Next, the unreacted Co film 37, as left on the region having no deposition of the polycrystalline silicon films 36 and 38, is removed by the wet etching method to form the local wiring lines $L_1$ and $L_2$ of a cobalt silicide film and the cobalt silicide layers 16, 17 and 36', as shown in FIGS. 27 and 28. FIG. 29 shows a pattern of the local wiring lines $L_1$ and $L_2$ and the cobalt silicide layers 16, 17 and 36' for the sixteen memory cells.

Thus, in the manufacture process of the present embodiment, the paired local wiring lines $L_1$ and $L_2$ connecting the storage nodes A and B of the memory cell are made of the cobalt silicide. This cobalt silicide is a material having a lower electric resistance than the polycrystalline silicon and acting as an effective barrier against the diffusion of the atoms of an impurity such as P (phosphorous) or B (boron). Thanks to this construction, therefore, the p-type impurity in the drain region (i.e., the $p^+$-type semiconductor region 12) of the load MISFETs $Qp_1$ and $Qp_2$ and the n-type impurity in the drain region (i.e., the $n^+$-type semiconductor region 9) of the drive MISFETs $Qd_1$ and $Qd_2$ or in the gate electrodes 10a and 10b can be prevented from diffusing into each other through those local wiring lines $L_1$ and $L_2$. As a result, the $p^+$-type semiconductor region 12 and the $n^+$-type semiconductor region 9 of the different conduction types and the gate electrodes 10a and 10b can be ohmically connected with a low resistance to operate the memory cell at a high speed and at a low voltage.

According to the manufacture process of the present embodiment, moreover, when the local wiring lines $L_1$ and $L_2$ are to be formed, the polycrystalline silicon film 36 is selectively formed on the individual surfaces of the drain region (i.e., the $n^+$-type semiconductor region 9) of the drive MISFETs $Qd_1$ and $Qd_2$ and the drain region (i.e., the $p^+$-type semiconductor region 12) of the load MISFETs $Qp_1$ and $Qp_2$, as constitute the storage nodes A and B of the memory cell, and the Co film 37 and the polycrystalline silicon film 38 are formed over the polycrystalline silicon film 36 so that the silicifying reaction is caused among those three layers. Thanks to this construction, the silicons of the aforementioned $n^+$-type semiconductor region 9 and $p^+$-type semiconductor region 12 constituting the storage nodes A and B of the memory cell can be prevented from participating in the aforementioned silicifying reaction. As a result, the cobalt silicide layers 16 and 17 can be made shallow so that the junction leakage current of the $n^+$-type semiconductor region 9 and the $p^+$-type semiconductor region 12 can be reduced to improve the operational reliability of the memory cell.

In case, on the contrary, the Co film 37 is made to directly contact with the $n^+$-type semiconductor region 9 and the $p^+$-type semiconductor region 12 without forming the polycrystalline silicon film 36, the silicons in the $n^+$-type, semiconductor region 9 and the $p^+$-type semiconductor region 12 participate in the silicifying reaction. As a result, the cobalt silicide layers 16 and 17 are formed deep in the substrate (i.e., the p-type well 3 and the n-type well 4) so that the junction leakage current to the substrate from the $n^+$-type semiconductor region 9 and the $p^+$-type semiconductor region 12 increases.

Incidentally, in order that the silicons in these $n^+$-type semiconductor region 9 and $p^+$-type semiconductor region 12 may not participate in the silicifying reaction, it is sufficient to control the thickness of the polycrystalline silicon film 36 so that this film 36 may be left, between the local wiring lines $L_1$ and $L_2$ and the underlying $n^+$-type semiconductor region 9 and $p^+$-type semiconductor region 12, to have a thickness larger than that of at least the gate insulating film 7 even after the local wiring lines $L_1$ and $L_2$ are formed by the silicifying reaction.

Thanks to the aforementioned construction, moreover, the polycrystalline silicon film 36 on the $n^+$-type semiconductor region 9 and the $p^+$-type semiconductor region 12, as constituting the storage nodes A and B of the memory cell, can be prevented from being scraped off, even in the case of a misalignment of the photoresist 39 acting as the mask for etching the overlying polycrystalline silicon film 38. As a result, no allowance for the alignment of the photoresist 39 is required so that the areas of the $n^+$-type semiconductor region 9 and the $p^+$-type semiconductor region 12 can be reduced to highly integrate the memory cell.

According to the manufacture process of the present embodiment, moreover, the cobalt silicide layer 16 (or 17) having a low resistance is formed on the surfaces of at least one portion of the respective source regions and drain regions of the six MISFETs $Qt_1$ and $Qt_2$, drive MISFETs $Qd_1$ and $Qd_2$ and load MISFETs $Qp_1$ and $Qp_2$ constituting the memory cell. Thanks to this construction, the source regions and drain regions, as formed with the cobalt silicide layer 16 (or 17), can have their resistances reduced to operate the memory cell at a high speed and at a low voltage.

According to the manufacture process of the present embodiment, moreover, when the aforementioned polycrystalline silicon film 38 is to be etched, it is not left on such an $N^+$-type semiconductor region 9 (i.e., the source region) of the $n^+$-type semiconductor region 9 (i.e., the source region and the drain region) of the drive MISFETs $Qd_1$ and $Qd_2$ as does not constitute the storage nodes A and B of the memory cell. Thanks to this construction, it is possible to prevent the disadvantage, in which the source regions and drain regions of the drive MISFETs $Qd_1$ and $Qd_2$ are shorted through the polycrystalline silicon film 38 and the local wiring lines $L_1$ and $L_2$. As a result, it is possible to improve the production yield and reliability of the SRAM.

According to the manufacture process of the present embodiment, moreover, the local wiring lines $L_1$ and $L_2$ are formed in self-alignment with the side wall insulating film 14 of the gate electrodes (6, 10a and 10b). Thanks to this construction, when the local wiring lines $L_1$ and $L_2$ and the $n^+$-type semiconductor region 9 and the $p^+$-type semiconductor region 12 constituting the storage nodes A and B are to be connected, no allowance is required for the mask alignment of them. As a result, gaps $Z_1$ and $Z_2$, as taken along the extending direction of the word line WL, can be reduced, as shown in FIG. 28, to reduce the size of the memory cell thereby to highly integrate the memory cell.

Figure 30:
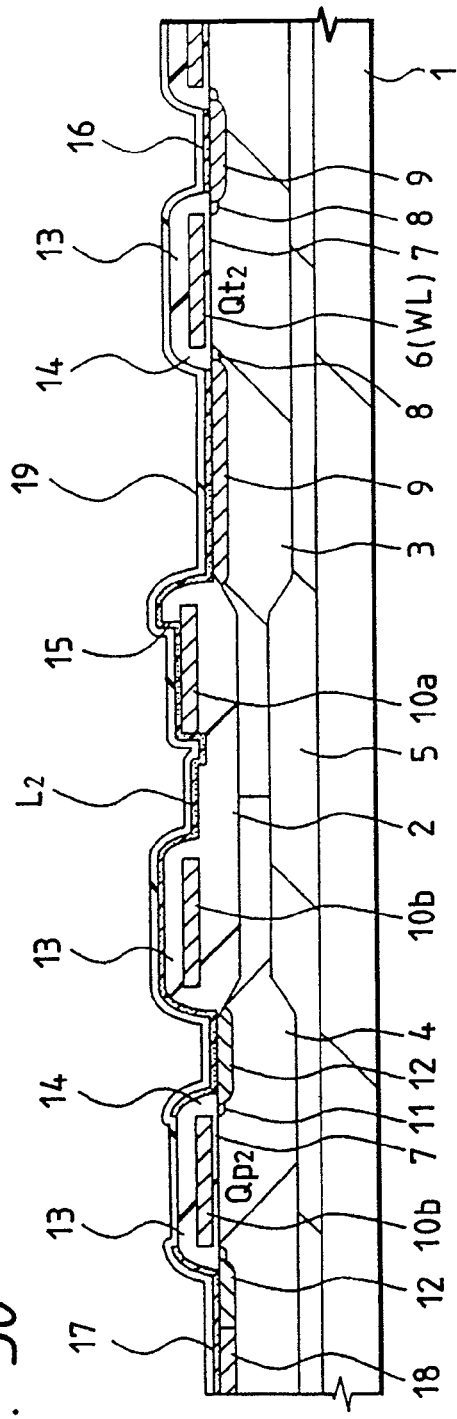
FIG. 30 is a section of an essential portion of the semiconductor substrate and shows a process for manufacturing the memory cell of the SRAM of the present invention.

Next, the insulating film 19 is deposited all over the surface of the semiconductor substrate 1 by the CVD method, as shown in FIG. 30. This insulating film 19 is formed by laminating a silicon nitride film having a thickness of about 10 nm on a silicon oxide film having a thickness of about 10 nm.

Figure 31:
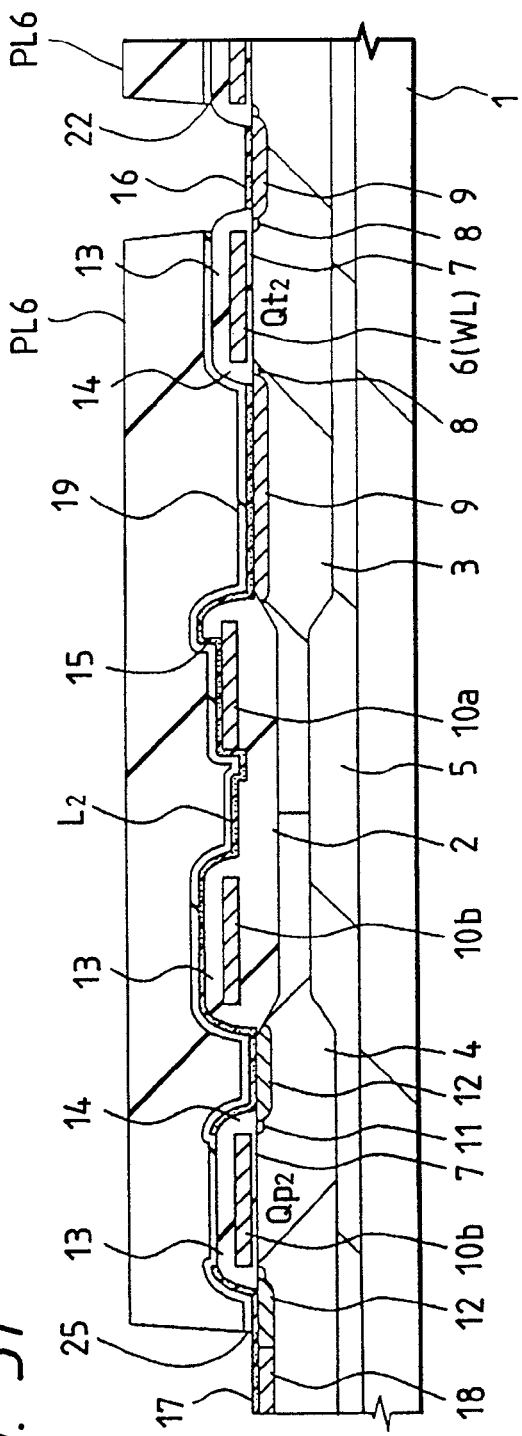
FIG. 31 is a section of an essential portion of the semiconductor substrate and shows a process for manufacturing the memory cell of the SRAM of the present invention.

Next, as shown in FIG. 31, the aforementioned insulating film 19 is removed from the drain region (i.e., the $n^+$-type semiconductor region 9) of the transfer MISFETs $Qt_1$ and $Qt_2$ to form the connection hole 23 by the dry etching method using a photoresist PL6 as the mask. Moreover, the insulating film 19 is removed from the source region (i.e., the $p^+$-type semiconductor region 12) of the load MISFETs $Qp_1$ and $Qp_2$ and from the $n^+$-type semiconductor region 18 adjacent to that well energizing source region, thereby to form the connection hole 25. Although not shown, moreover, the insulating film 19 is removed from the source region (i.e., the $n^+$-type semiconductor region 9) of the drive MISFETs $Qd_1$ and $Qd_2$ to form the connection hole 21.

Figure 32:
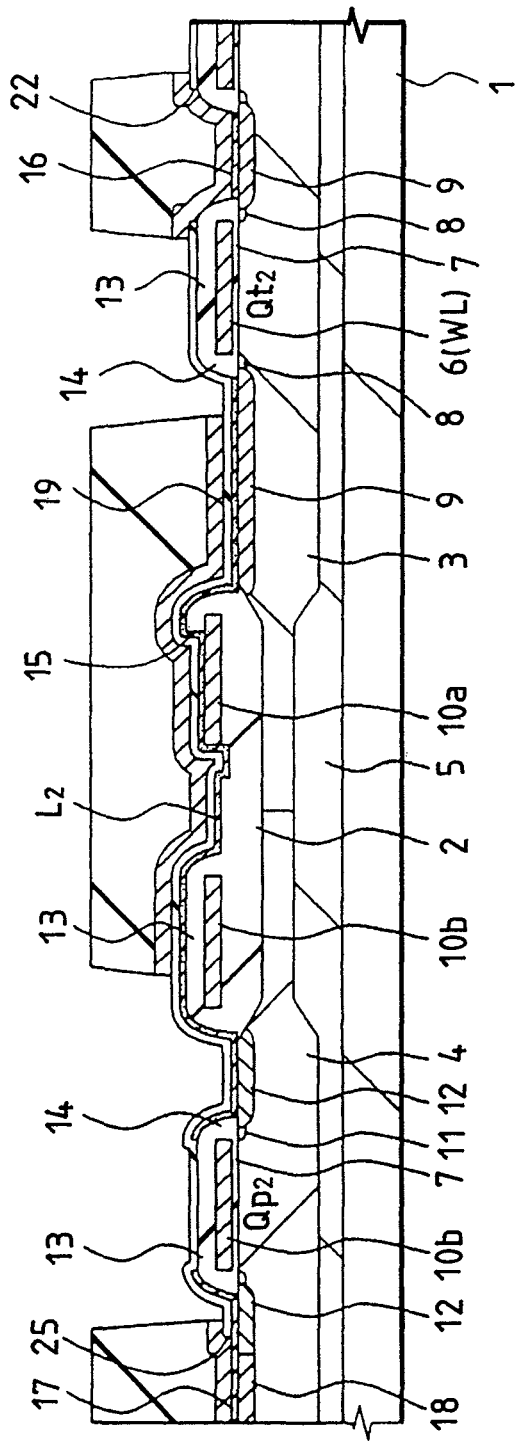
FIG. 32 is a section of an essential portion of the semiconductor substrate and shows a process for manufacturing the memory cell of the SRAM of the present invention.
Figure 33:
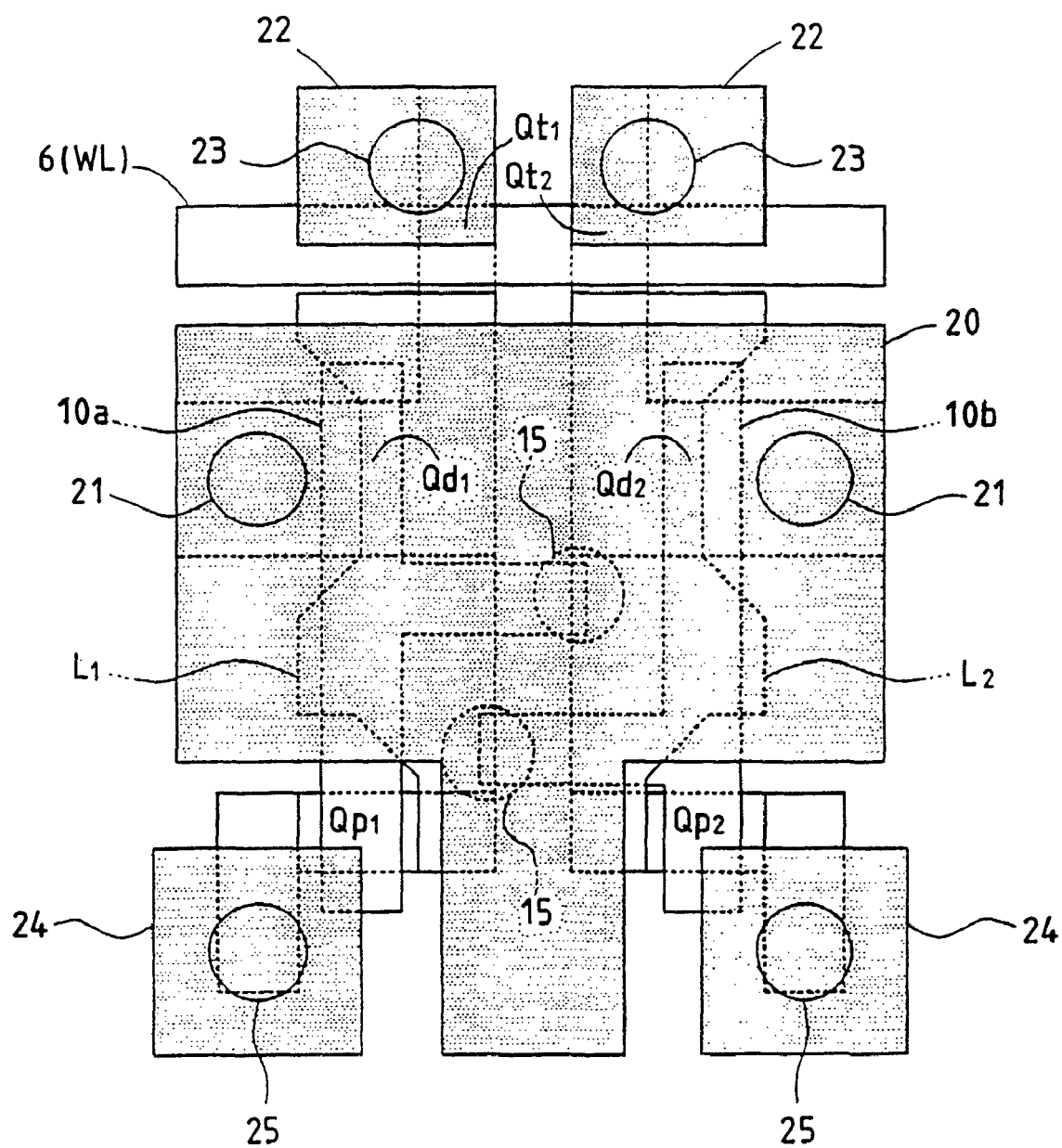
FIG. 33 is a top plan view of an essential portion of the semiconductor substrate and shows a process for manufacturing the memory cell of the SRAM of the present invention.
Figure 34:
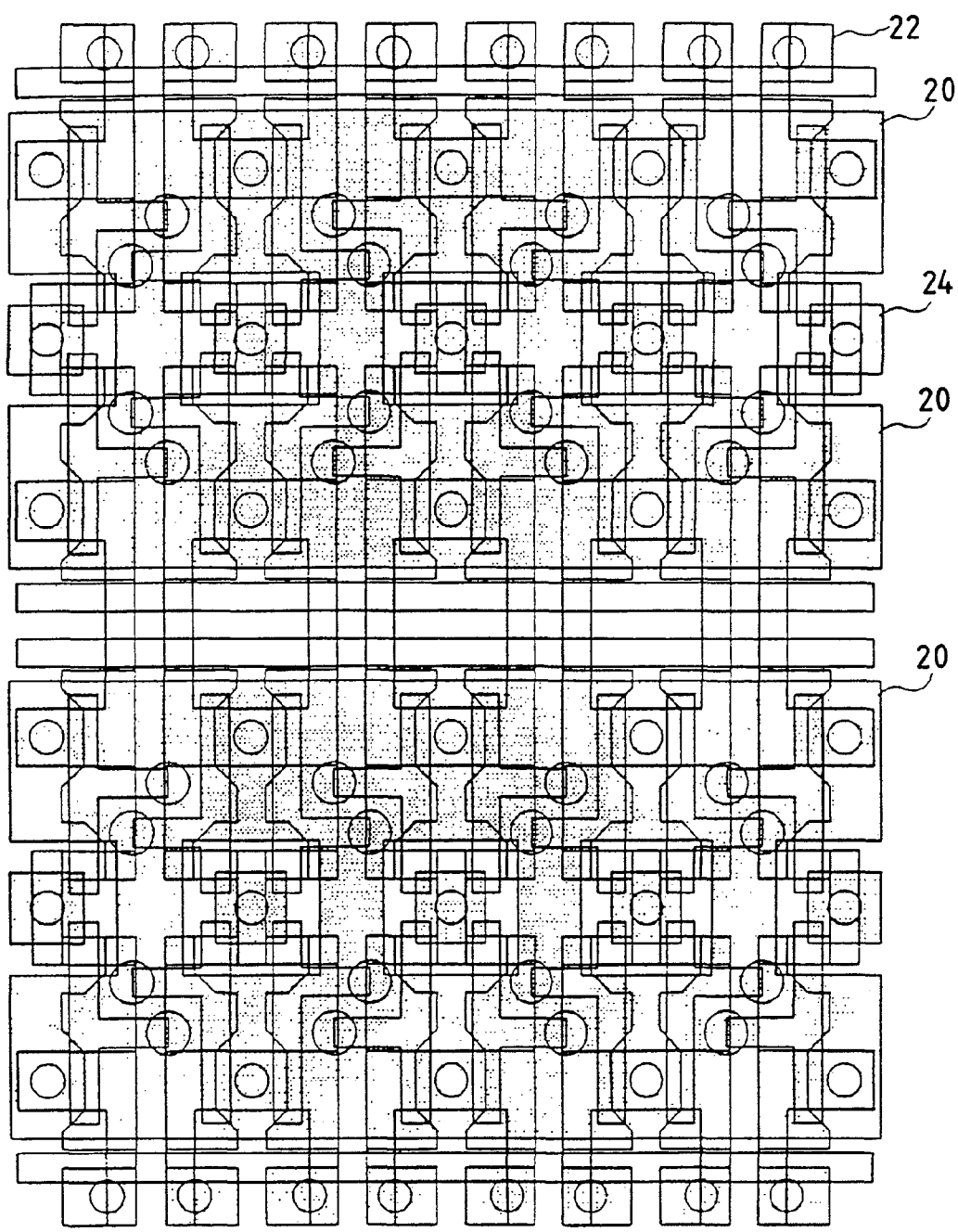
FIG. 34 is a top plan view showing the reference voltage line pattern for the sixteen memory cells of the SRAM of the present invention.

Next, the polycrystalline silicon film having a thickness of about 70 nm is deposited all over the surface of the semiconductor substrate 1 by the CVD method. Then, this polycrystalline silicon film is patterned by the dry etching method using a photoresist as the mask to form the reference voltage line 20, the pad layer 22 and the pad layer 24, as shown in FIGS. 32 and 33. The reference voltage line 20 is arranged to cover the local wiring lines $L_1$ and $L_2$ and is connected through the connection hole 21 with the source region (i.e., the n$^+$-type semiconductor region 9) of the drive MISFETs Qd$_1$ and Qd$_2$; The pad layer 22 is connected through the connection hole 23 with the cobalt silicide layer 16, and the pad layer 24 is connected through the connection hole 25 with the cobalt silicide layer 17. FIG. 34 shows the reference voltage line 20 and the pad layers 22 and 24 for the sixteen memory cells.

Figure 35:
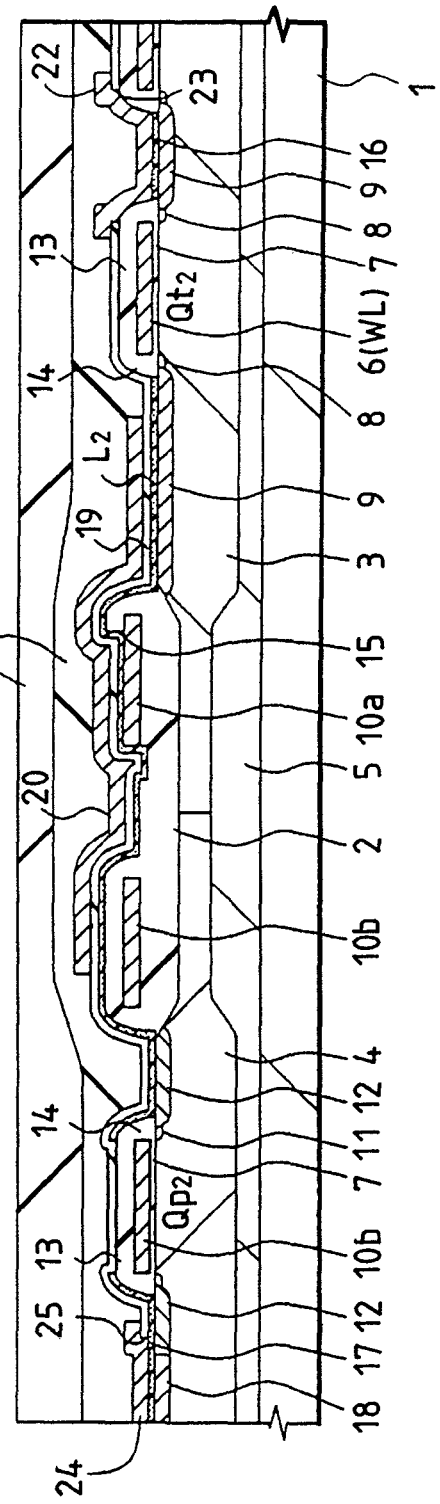
FIG. 35 is a section of an essential portion of the semiconductor substrate and shows a process for manufacturing the memory cell of the SRAM of the present invention.

Next, as shown in FIG. 35, the inter-layer insulating film 26 is deposited all over the surface of the semiconductor substrate 1 by the CVD method. This inter-layer insulating film 26 is formed by laminating a BPSG film 26b having a thickness of about 300 nm on a silicon oxide film 26a having a thickness of about 150 nm and subsequently by flattening the BPSG film by the reflow.

Figure 36:
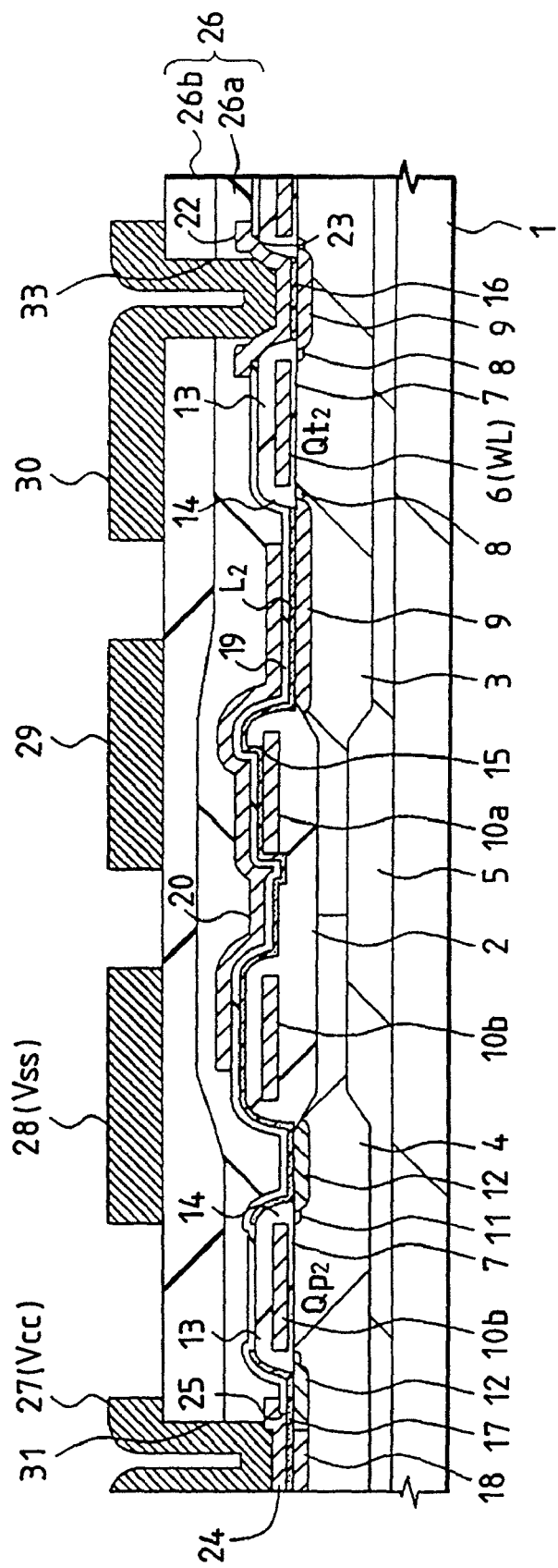
FIG. 36 is a section of an essential portion of the semiconductor substrate and shows a process for manufacturing the memory cell of the SRAM of the present invention.
Figure 37:
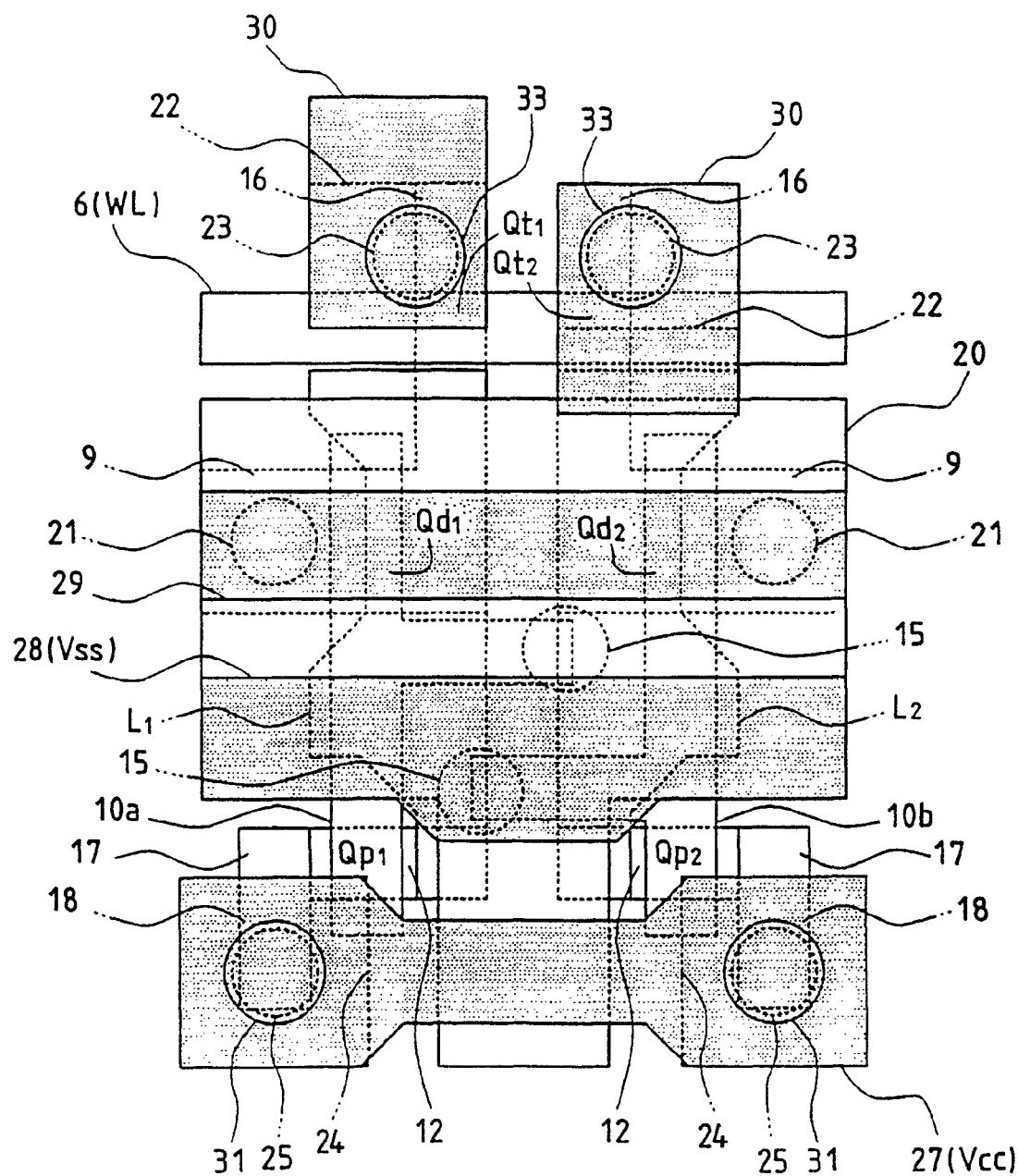
FIG. 37 is a top plan view of an essential portion of the semiconductor substrate and shows a process for manufacturing the memory cell of the SRAM of the present invention.

Next, the inter-layer insulating film 26 is formed with the connection holes 31 and 33 by the dry etching method using the photoresist as the mask. Then, the Al alloy film is deposited to a thickness of about 300 nm all over the surface of the semiconductor substrate 1 by the sputtering method to form the supply voltage line 27, the sub-reference voltage line 28, the sub-word line 29 and the pad layer 30 over the inter-layer insulating film 26, as shown in FIGS. 36 and 37.

Thus, according to the manufacture process of the present embodiment, when the supply voltage line 27 is to be connected with the source regions (i.e., the p$^+$-type semiconductor region 12) of the load MISFETs Qp$_1$ and Qp$_2$ and the n$^+$-type semiconductor region 18 adjacent to the well energizing source region through the connection hole 31 opened in the inter-layer insulating film 26, the polycrystalline silicon pad layer 24 is formed in advance on the p$^+$-type semiconductor region 12 and the n$^+$-type semiconductor region 18. Moreover, when the pad layer 30 is connected with the drain region (i.e., the n$^+$-type semiconductor region 6) of the transfer MISFETs Qt$_1$ and Qt$_2$ through the connection hole 33 opened in the inter-layer insulating film 26, the polycrystalline silicon pad layer 22 is formed in advance on the n$^+$-type semiconductor region 6.

Thanks to this construction, when the inter-layer insulating film 26 is etched to form the connection holes 31 and 33, none of the cobalt silicide layers 16 and 17 are exposed to the bottom portion of the connection holes 31 and 33 so that the cobalt silicide layers 16 and 17 can be prevented from being scraped.

According to the manufacture process of the present invention, moreover, when the source region (i.e., p$^+$-type semiconductor region 12) of the load MISFETs Qp$_1$ and Qp$_2$ and the well energizing n$^+$-type semiconductor region 18 adjacent to that source region are to be connected with the supply voltage line 27, they are formed in advance on their surfaces with the cobalt silicide layer 16. Thanks to this construction, the p$^+$-type semiconductor region 12 and the n$^+$-type semiconductor region 18 can be ohmically connected with the supply voltage line 27 without considering the conduction type of the polycrystalline silicon pad layer 24 formed on the cobalt silicide layer 16, so that they can be simultaneously supplied with the supply voltage ($V_{cc}$) through the single connection hole 31. As a result, the p$^+$-type semiconductor region 12 and the n$^+$-type semiconductor region 18 can be arranged adjacent to each other to have their areas reduced to highly integrate the memory cell.

Figure 38:
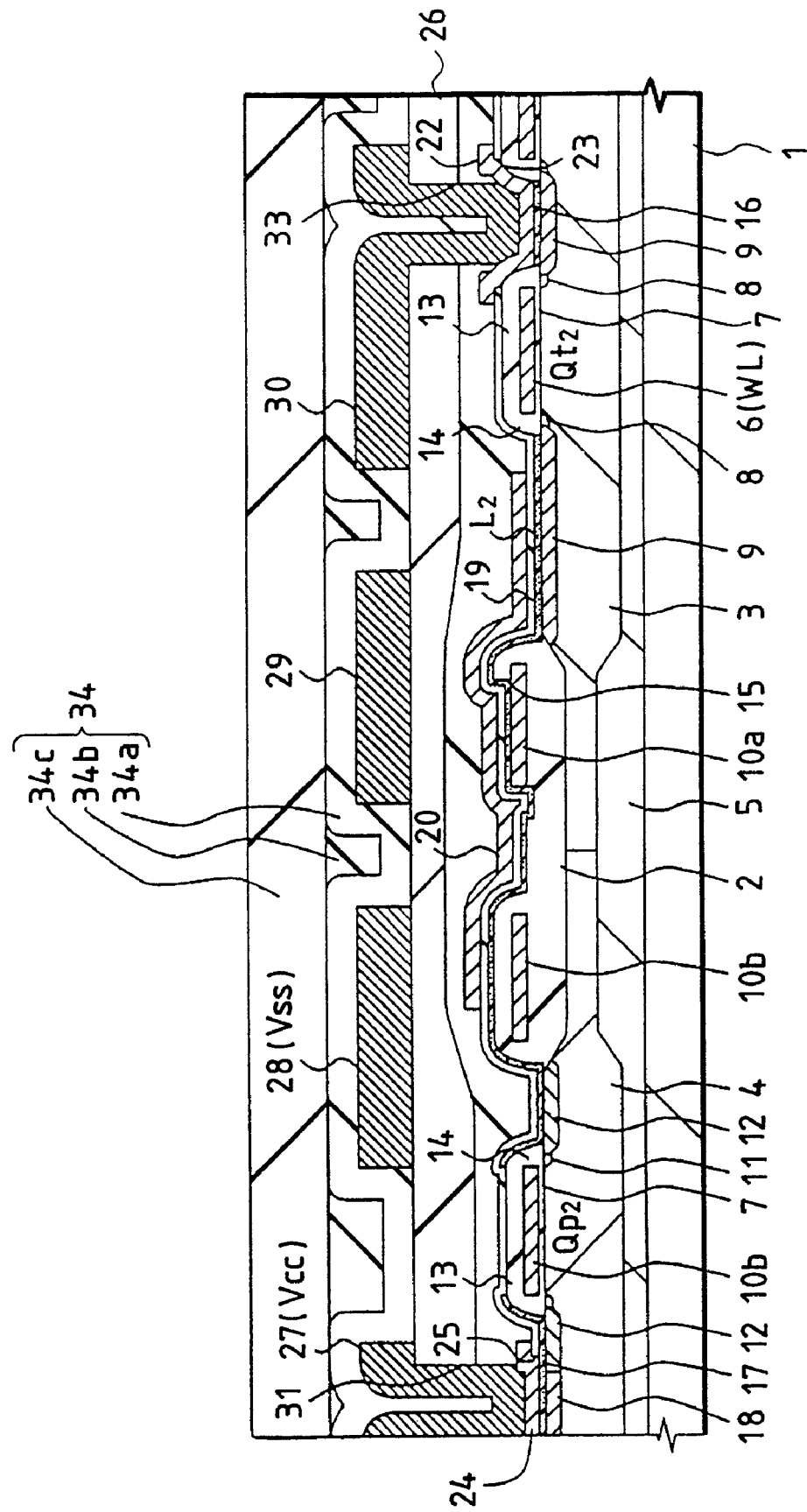
FIG. 38 is a top plan view showing the data line pattern for the sixteen memory cells of the SRAM of the present invention.

Next, the inter-layer insulating film 34 is deposited all over the surface of the semiconductor substrate 1, as shown in FIG. 38. This inter-layer insulating film 34 is formed by spin-applying the spin-on glass (SOG) film 34b having a thickness of about 250 nm to the silicon oxide film 34a deposited to have a thickness of about 500 nm by the CVD method, subsequently by etching back to flatten the surface of the spin-on glass film 34b and by depositing the silicon oxide film 34c having a thickness of about 400 nm thereon by the CVD method.

Figure 39:
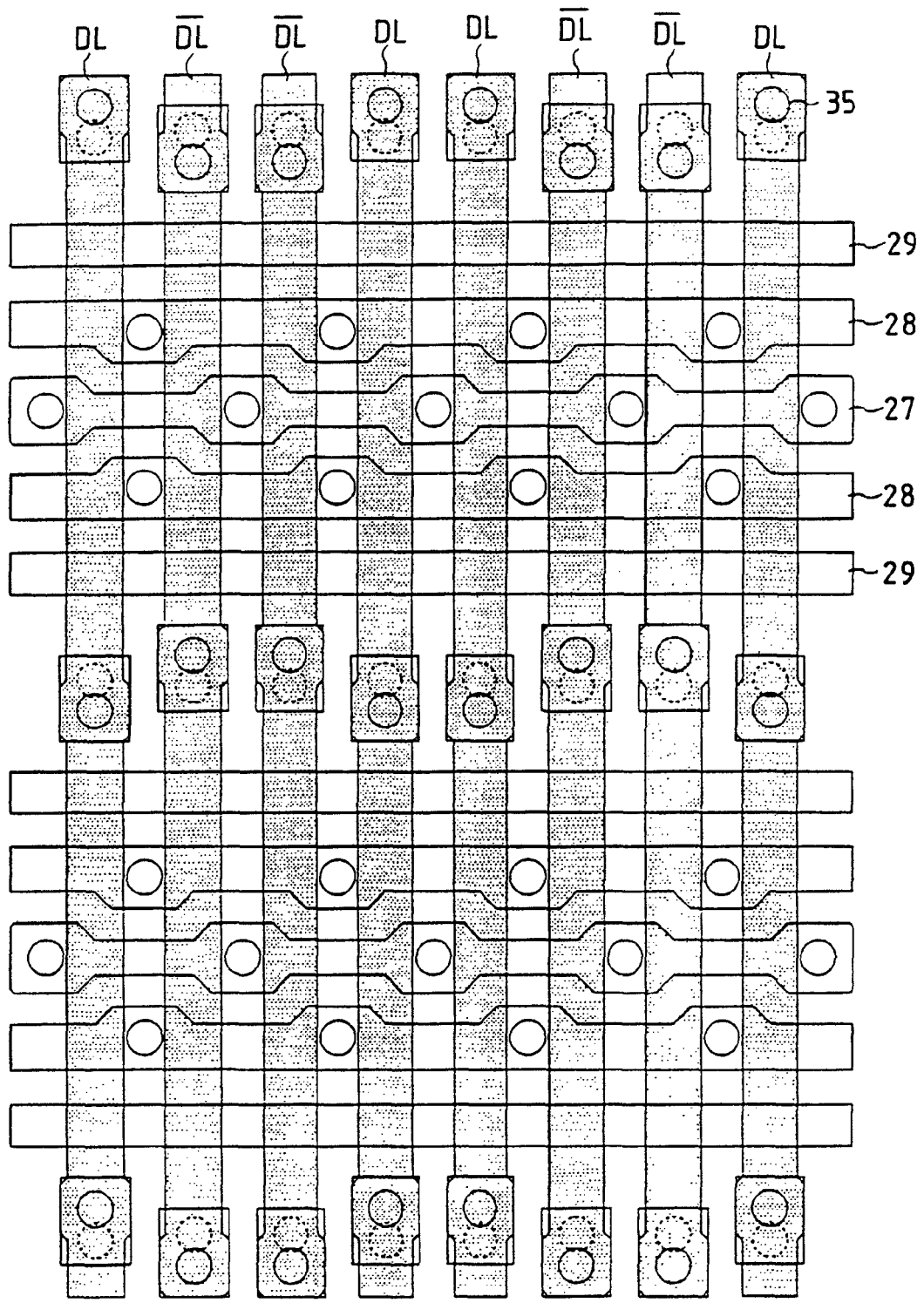
FIG. 39 is a section of an essential portion of the semiconductor substrate and shows a process for manufacturing the memory cell of the SRAM of the present invention.

After this, the inter-layer insulating film 34 is formed with the connection hole 35 by the dry etching using the photoresist as the mask. After this, the Al alloy film is deposited all over the surface of the semiconductor substrate 1 by the sputtering method, and is then patterned to form the data line DL and the barred data line $\overline{DL}$ by the dry etching method using the photoresist as the mask, thus completing the memory cell of the SRAM of the present embodiment. FIG. 39 shows the data lines DL and the barred data lines $\overline{DL}$ for the sixteen memory cells.

Although our invention has been specifically described in connection with its embodiment, it should not be limited thereto but can naturally be modified in various manners without departing from the gist thereof.

When the local wiring lines $L_1$ and $L_2$ are to be formed, the drain region (i.e., the n$^+$-type semiconductor region 9) of the drive MISFETs Qd$_1$ and Qd$_2$ and the drain region (i.e., the p$^+$-type semiconductor region 12) of the load MISFETs Qp$_1$ and Qp$_2$, as constitute the storage nodes A and B of the memory cell, are formed on their individual surfaces with the polycrystalline silicon film 36, the Co film 37 and the polycrystalline silicon film 38 so that the silicifying reaction is caused among those three layers. However, the underlying polycrystalline silicon film 36 is not always necessary, but the silicifying reaction can be caused between the Co film 37 and the polycrystalline silicon film 38 deposited on the former, to form the local wiring lines $L_1$ and $L_2$.

In this case, the step of selectively depositing the polycrystalline silicon film 36 on the surface of the aforementioned drain regions (i.e., the n$^+$-type semiconductor region 9 and the p$^-$-type semiconductor region 12) can be eliminated to reduce the number of steps of manufacturing the memory cell. In this case, however, the Co film 37 is directly deposited on the surface of the drain region (i.e., the n$^+$-type semiconductor region 9 and the p$^-$-type semiconductor region 12). In order to prevent the silicifying reaction from progressing between the silicon of the drain region and the Co film 37, therefore, the overlying polycrystalline silicon film 38 has to be made so sufficiently thick as to feed the silicon necessary for the silicifying reaction to the polycrystalline silicon film 38.

If, moreover, the polycrystalline silicon film 38 on the aforementioned drain region (i.e., n$^+$-type semiconductor region 9 and the p$^+$-type semiconductor region 12) is partially etched when the overlying polycrystalline silicon film 38 is to be patterned by the dry etching method using the photoresist as the mask, the silicifying reaction between the drain region and the Co film 37 progresses. Therefore, a sufficient allowance for the mask alignment has to be retained so that the polycrystalline silicon film 38 may be sufficiently superposed over the drain region (i.e., the n$^+$-type semiconductor region 9 and the p$^+$-type semiconductor region 12) and prevented from being scraped.

Figure 40:
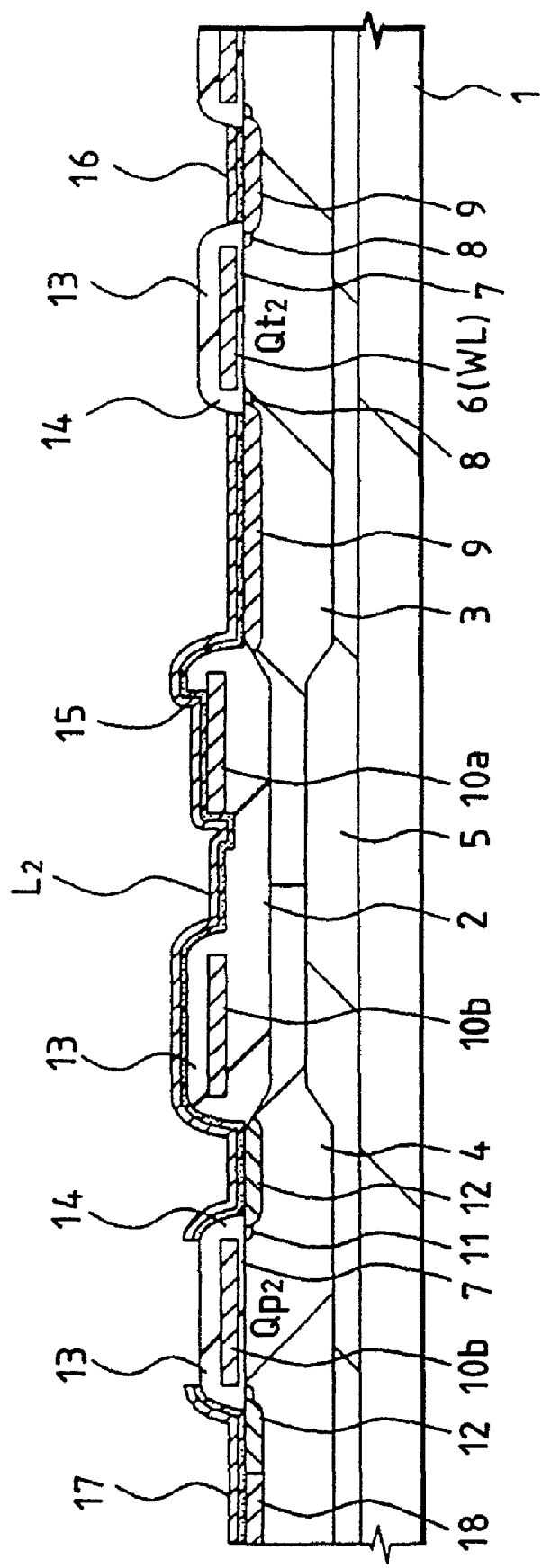
FIG. 40 is a section of an essential portion of the semiconductor substrate and shows another process for manufacturing the memory cell of the SRAM of the present invention.

Moreover, when the local wiring lines $L_1$ and $L_2$ are to be formed by the silicifying reaction, the deposition thickness of the aforementioned polycrystalline silicon film 38 to be deposited on the Co film 37 may be made thicker than that necessary for the silicifying thereby to leave the unreacted polycrystalline silicon film on the cobalt silicide layer. Alternatively, a refractory metal film or a refractory metal silicide film may be further deposited on the polycrystalline silicon film 38. Then, as shown in FIG. 40, the thickness of the local wiring lines $L_1$ and $L_2$ is larger than that of the case of the single cobalt silicide layer so that the local wiring lines $L_1$ and $L_2$ can have a larger surface area. As a result, a capacity ($C_2$) to be established between the local wiring lines $L_1$ and $L_2$ and the overlying reference voltage line 20 can be increased to increase the storage node capacity of the memory cell thereby to improve the resistance to the α ray soft error.

Figure 41:
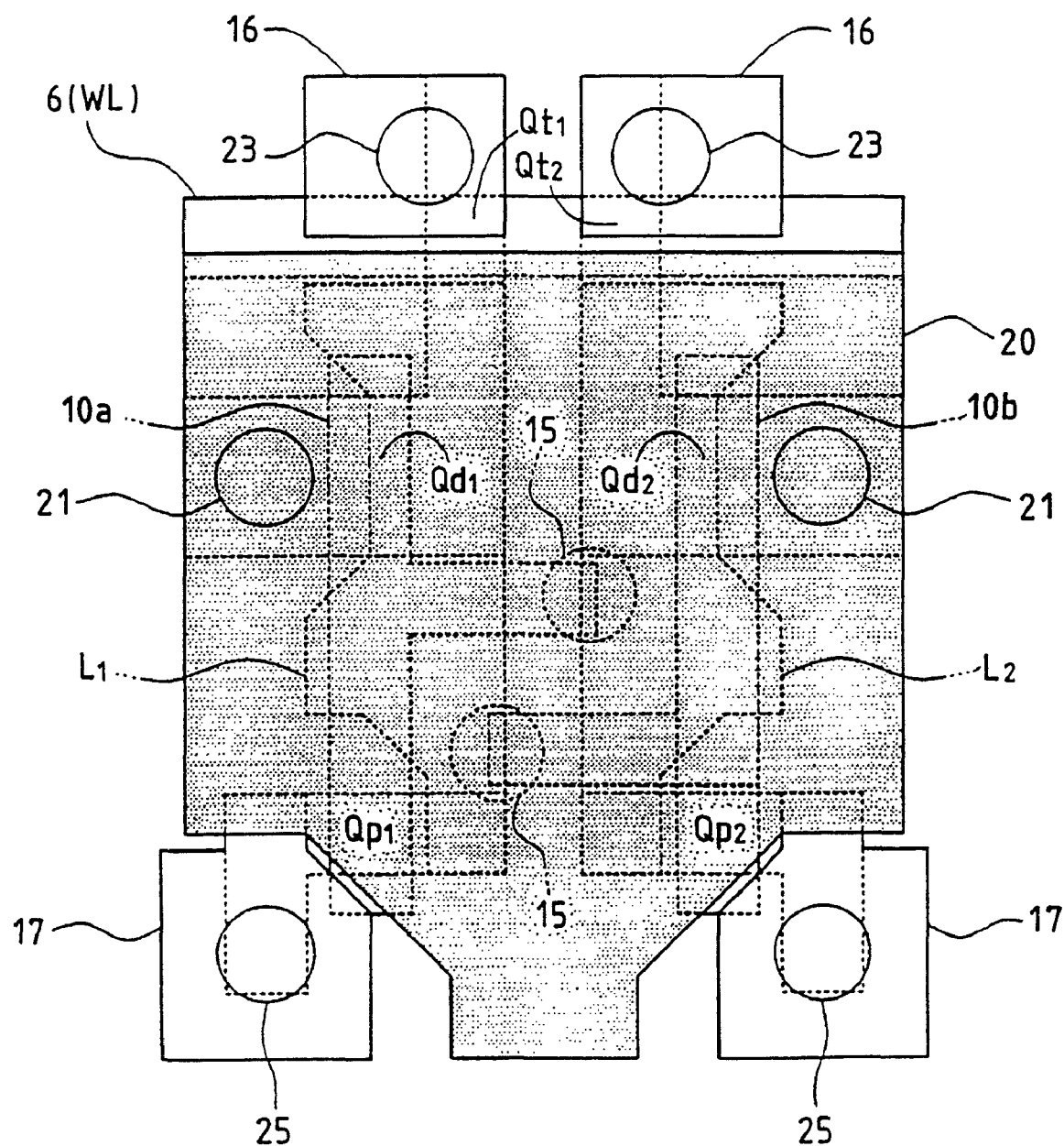
FIG. 41 is a top plan view of an essential portion of the semiconductor substrate and shows another construction of the memory cell of the SRAM of the present invention.
Figure 42:
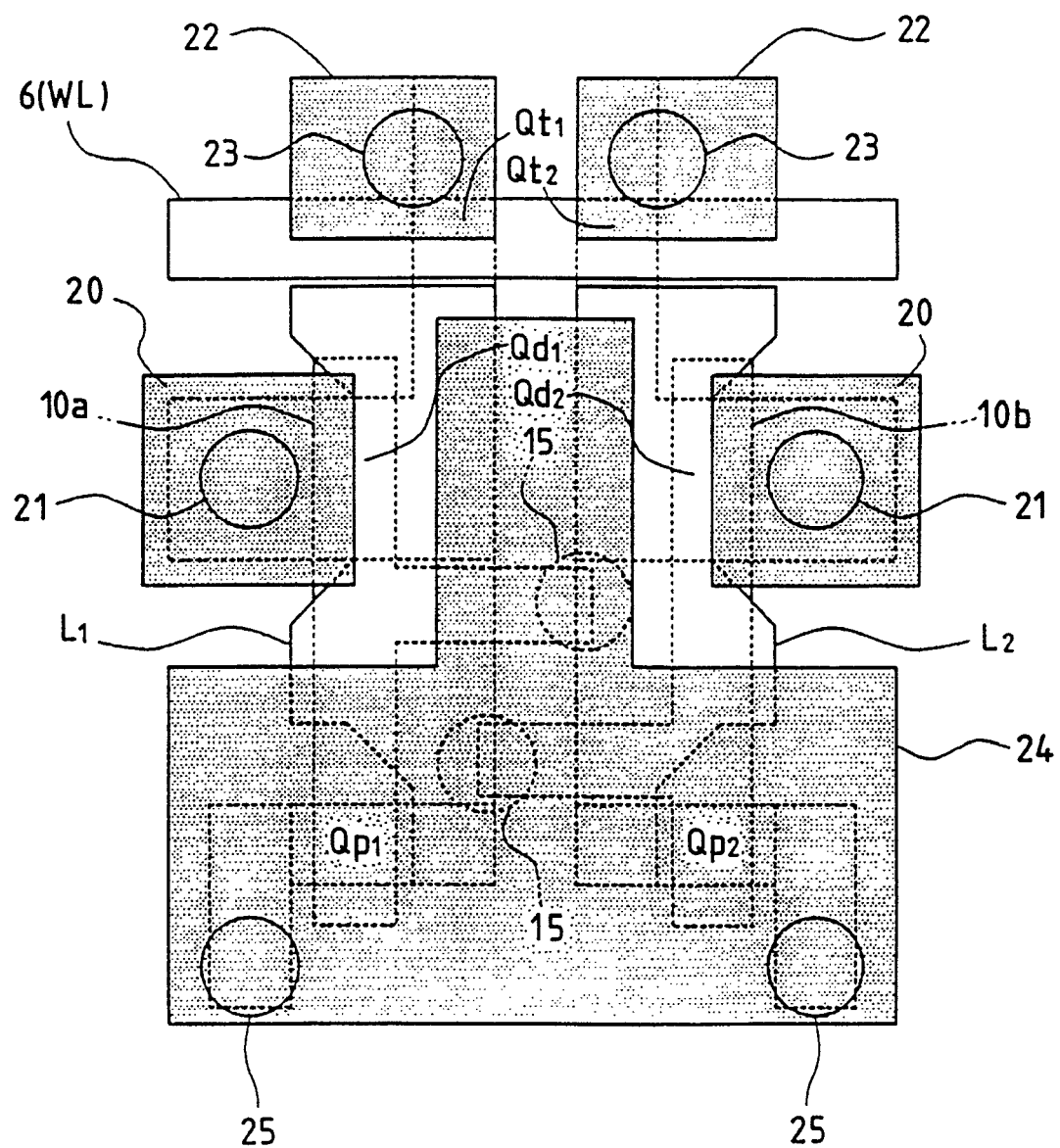
FIG. 42 is a top plan view of an essential portion of the semiconductor substrate and shows another construction of the memory cell of the SRAM of the present invention.

In this case, as shown in FIG. 40, the unreacted polycrystalline silicon film is left not only on the cobalt silicide layer 16 formed on the surface of the drain region (i.e., the $n^+$-type semiconductor region 9) of the transfer MISFETs $Qt_1$ and $Qt_2$ but also the cobalt silicide layer 17 formed on the surface of the source region (i.e., p-type semiconductor region 12) of the load MISFETs $Qp_1$ and $Qp_2$. As a result, the pad layers 22 and 24 need not be formed of the polycrystalline silicon film belonging to the same layer as that of the reference voltage 20 on the cobalt silicide layers 16 and 17, so that the area of the memory cell can be reduced. When the pad layers 22 and 24 belonging to the same layer as that of the reference voltage line 20 are unnecessary, the area to be occupied by the reference voltage line 20 can be enlarged, as shown in FIG. 41, to further increase the storage node capacity of the memory cell thereby to improve the resistance to the a ray soft error.

In the embodiment thus far described, a capacity (C) is formed between the local wiring lines $L_1$ and $L_2$ and the overlying reference voltage line 20. As shown in FIG. 41, however, the power supplying pad layer 24, as formed of the same polycrystalline silicon film as that of the reference voltage line 20, has its area enlarged to cover the local wiring lines $L_1$ and $L_2$ thereby to form a capacity between that pad layer 24 and the local wiring lines $L_1$ and $L_2$. In this case, the reference voltage line 20 is left only over the source region (i.e., the $n^+$-type semiconductor region 9) of the drive MISFETs $Qd_1$ and $Qd_2$.

Figure 43:
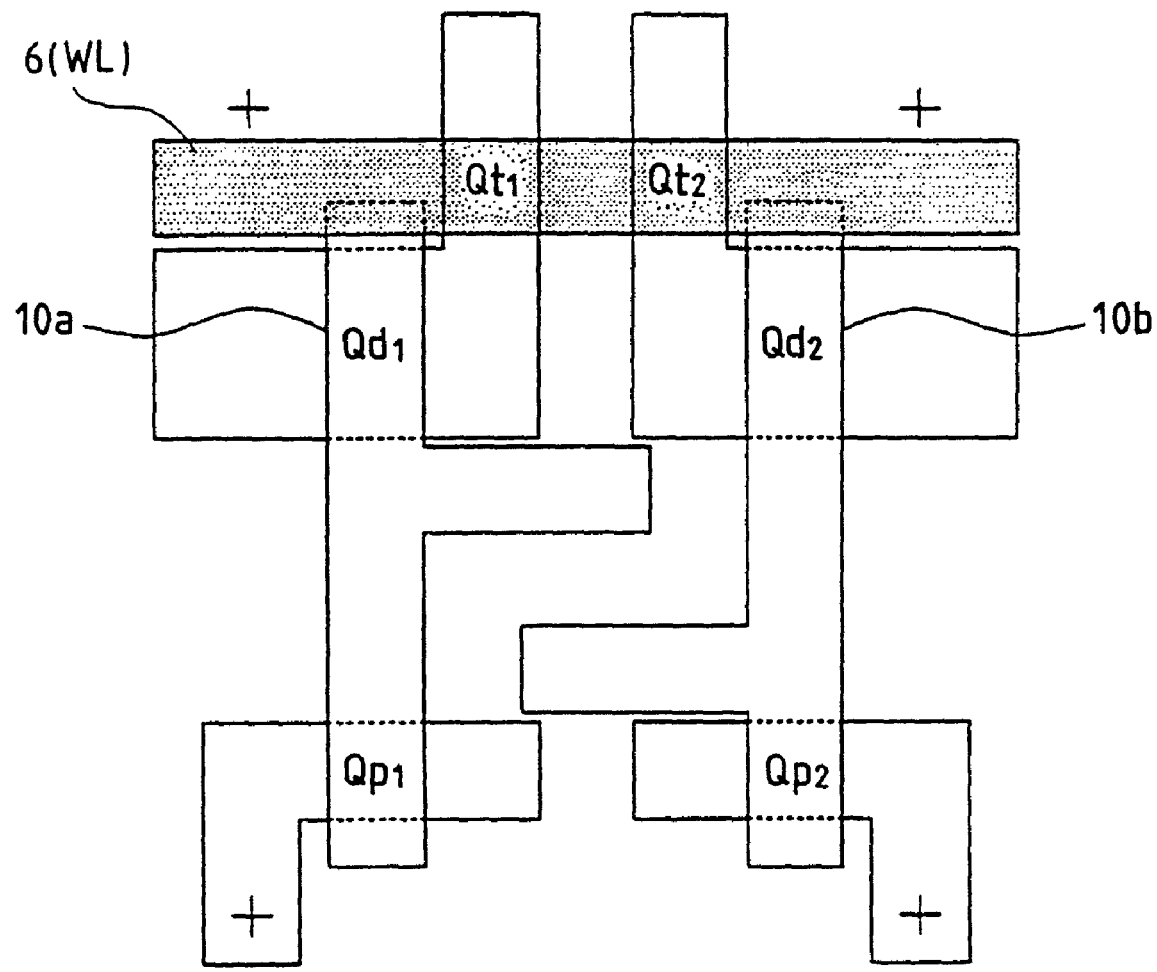
FIG. 43 is a top plan view of an essential portion of the semiconductor substrate and shows another construction of the memory cell of the SRAM of the present invention.

In the memory cell of the SRAM of the foregoing embodiment, the gate electrode 6 (of the word line WL) of the transfer MISFETs $Qt_1$ and $Qt_2$ is formed of the polycrystalline silicon film belonging to the same layer as the gate electrodes 10a and 10b of the drive MISFETs $Qd_1$ and $Qd_2$ and the load MISFETs $Qp_1$ and $Qp_2$ but may also be formed of the polycrystalline silicon film (e.g., the polycrystalline silicon film belonging to the same layer as the reference voltage line 20) overlying the gate electrodes 10a and 10b. In this case, as shown in FIG. 43, the gate electrode 6 (i.e., the word line WL) and the gate electrodes 10a and 10b can be arranged to have their portions partially superposed, so that the area of the memory cell can be reduced to highly integrate the SRAM. Moreover, the present invention has been described in connection with the CMOS inverters ($INV_1$, $INV_2$), but the description should not be limited thereto but can naturally be exemplified by a CMIS (i.e., Complementary-MIS). This exemplification applies to the following Embodiments 2 to 17.

The effects to be obtained by the representative of the invention disclosed by the present embodiment will be briefly described in the following.

The reference voltage line 20 to be formed over the local wiring lines $L_1$ and $L_2$ is arranged to be superposed over the local wiring lines $L_1$ and $L_2$ so that the capacity element $C_2$ is formed between the reference voltage line 20 and the local wiring lines $L_1$ and $L_2$. As a result, the capacity of the storage nodes A and B, as connected with the local wiring lines $L_1$ and $L_2$, can be increased to improve the resistance of the memory cell to the α ray soft error.

The local wiring lines $L_1$ and $L_2$ are arranged to be partially superposed over the gate electrodes 10a, 10b and 6(WL) of the drive MISFETs, the load MISFETs or the transfer MISFETs so that the capacity element $C_1$ can be formed between the local wiring lines and the gate electrodes to increase the gate capacity component $C_1$ of the storage node capacity. As a result, the storage node capacity of the memory cell can be increased to improve the resistance to the α ray soft error.

The local wiring lines $L_1$ and $L_2$ are arranged to be partially superposed over the storage nodes A and B of the memory cell so that the capacity component of the diffusion layer of the storage node capacity can be increased. As a result, the storage node capacity of the memory cell can be increased to improve the resistance to the α ray soft error.

Over the reference voltage line 20, there is arranged the wiring line 28 having a lower resistance, and the electric power is supplied from the lower-resistance wiring line 28 to the reference voltage 20 through the connection holes which are formed in at least one in each memory cell. As a result, the electric power of the reference voltage line 20 can be supplied to each memory cell so that the reference voltage can be stabilized. As a result, the minimum value ($V_{cc.min}$) of the supply voltage can be improved to improve the resistance of the memory cell to the a ray soft error.

The connection holes 32 for connecting the lower-resistance wiring line 28 and the reference voltage line 20 and the connection holes 21 for connecting the reference voltage line 20 and the source region 9 of the drive MISFETs are spaced from each other so that the step, which might otherwise be formed by the overlap of those connection holes, can be avoided to flatten the connection hole forming regions. As a result, the connection holes can have their contact resistances reduced to operate the memory cell at a high speed and at a low voltage.

The local wiring lines $L_1$ and $L_2$ are formed by causing the silicifying reaction among the polycrystalline silicon film 36, the refractory metal film 37 deposited on the former, and the second polycrystalline silicon film 38 deposited on the former, so that the silicon in the semiconductor regions forming the storage nodes A and B of the memory cell can be prevented from participating in the aforementioned silicifying reaction. As a result, the junction leakage current of the semiconductor regions 9 and 12 can be reduced to improve the operational reliability of the memory cell.

The step of forming the connection holes 15 in the portions of the gate electrodes 10a and 10b and the step of exposing the semiconductor regions 9, 12 and 18 are carried out separately of each other to make the allowance unnecessary for the mask alignment between the connection holes 15 and the semiconductor regions 9, 12 and 18, so that the areas for the connection holes can be reduced to highly integrate the memory cell. By connecting the local wiring lines $L_1$ and $L_2$ and the semiconductor regions 9, 12 and 18 in self-alignment, moreover, no allowance is required for the mask alignment of the two so that the memory cell size can be reduced to highly integrate the memory cell.

The paired local wiring lines $L_1$ and $L_2$ for connecting the storage nodes A and B of the memory cell are made of the refractory metal silicide, so that the p-type impurity in the semiconductor region 12 of the load MISFETs and the n-type impurity in the semiconductor region 9 or the gate electrodes 10a and 10b of the drive MISFETs can be prevented from diffusing into each other through the local wiring lines $L_1$ and $L_2$. As a result, the ohmic connections can be made with a low resistance between the semiconductor regions 12 and 9 of the different conduction types and between the semiconductor region 12 and the gate electrodes 10a and 10b thereby to operate the memory cell at a high speed and at a low voltage.

Even in the case of a misalignment of the photoresist 39 to be used as the mask at the time of etching the overlying polycrystalline silicon film 38, it is possible to prevent the underlying polycrystalline silicon film 36 from being scraped. As a result, the allowance for the alignment of the photoresist 39 can be eliminated to reduce the areas for the semiconductor regions 9 and 12 thereby to highly integrate the memory cell.

The refractory metal silicide layers 16 and 17 are formed on the surfaces of at least the portions of the individual source regions and drain regions of the transfer MISFETs $Qt_1$ and $Qt_2$, the drive MISFETs $Qd_1$ and $Qd_2$ and the load MISFETs $Qp_1$ and $Qp_2$, as constituting the memory cell, so that the source regions and the drain regions can have their resistances lowered. As a result, it is possible to operate the memory cell at a high speed and at a low voltage.

The source region 12, the well energizing drain region 18 and the supply voltage line 27 can be ohmically connected without considering the conduction type of the polycrystalline silicon pad layer 24, as formed on the refractory metal silicide layer 16, so that the source region 12 and the well energizing drain region 18 of the load MISFETs can be simultaneously supplied with the supply voltage ($V_{cc}$) through the one connection hole 31. As a result, the source region 12 and the well energizing drain region 18 of the load MISFETs can be arranged adjacent to each other and can have their areas reduced to highly integrate the memory cell.

When the local wiring lines $L_1$ and $L_2$ are to be formed by the silicifying reaction, their thickness and surface areas are increased by making the polycrystalline silicon film 38, as deposited on the refractory metal silicide layer 37, thicker than that necessary for that silicifying reaction, so that the capacity to be established between the local wiring lines $L_1$ and $L_2$ and the overlying reference voltage line 20 is increased. As a result, the storage node capacity of the memory cell can be further increased to improve the resistance to the a ray soft error.

Embodiment 2

Figure 44:
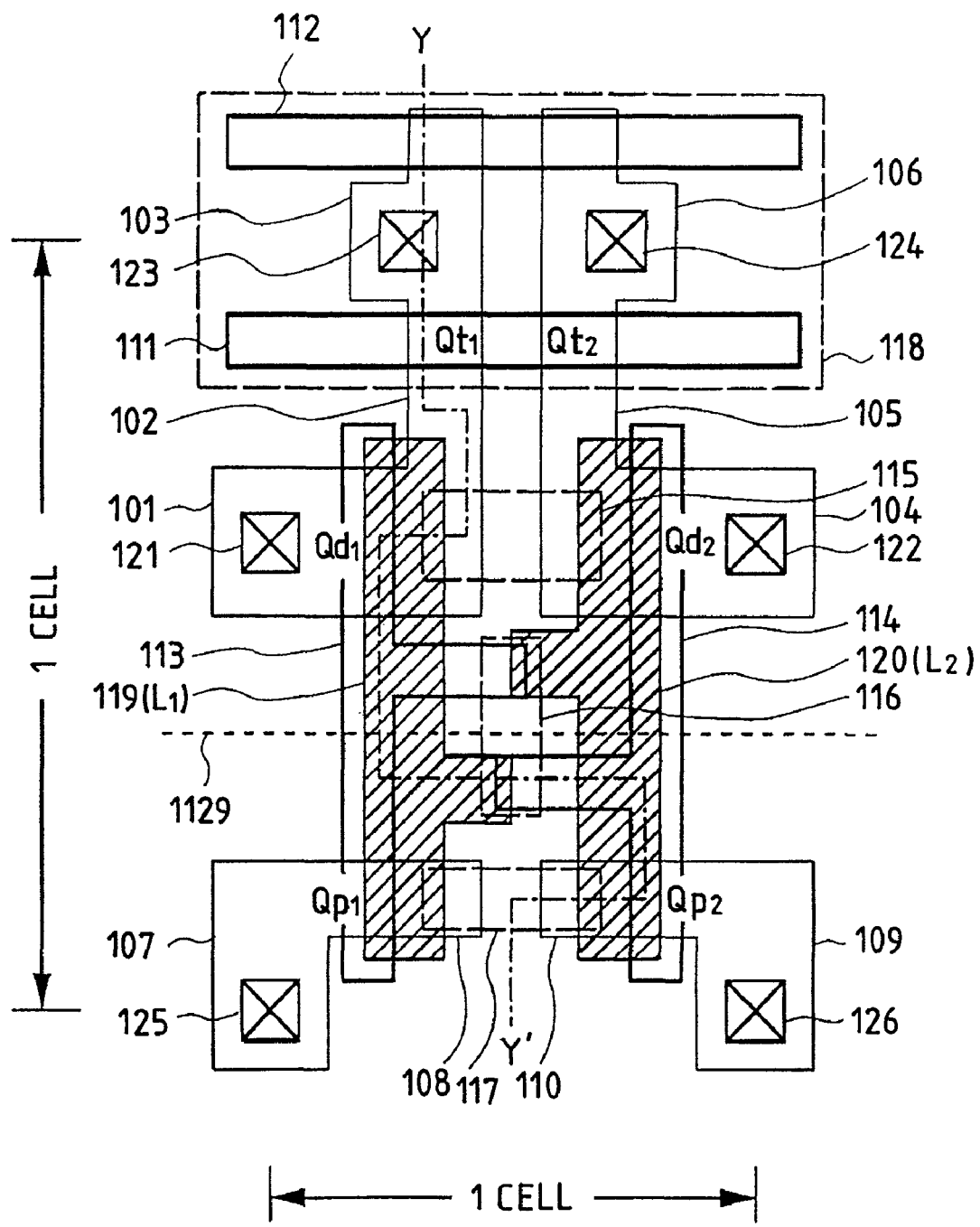
FIG. 44 is a top plan view showing a semiconductor integrated circuit device according to a second-embodiment of the present invention.
Figure 45:
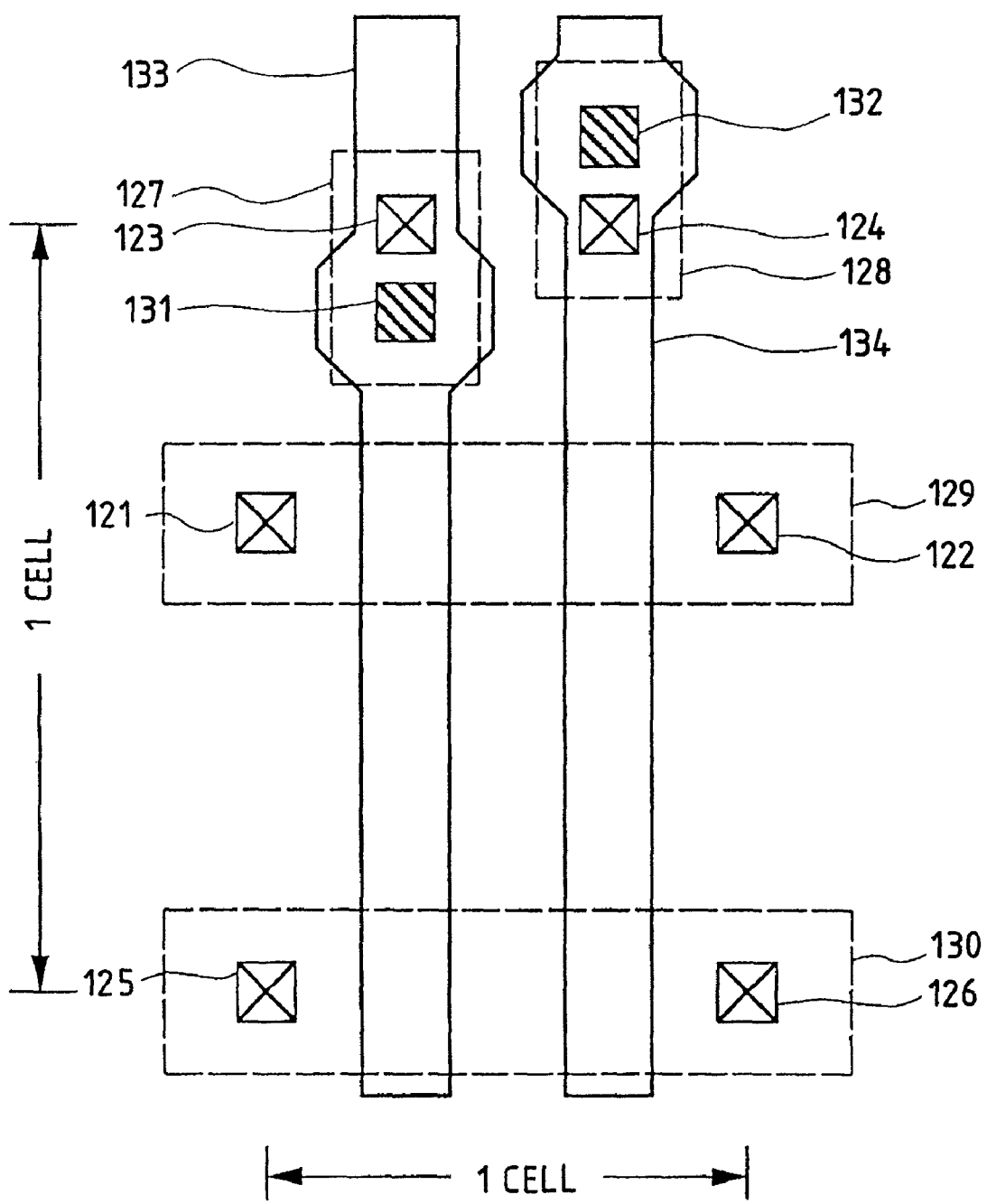
FIG. 45 is a top plan view showing the semiconductor integrated circuit device according to the second embodiment of the present invention.
Figure 46:
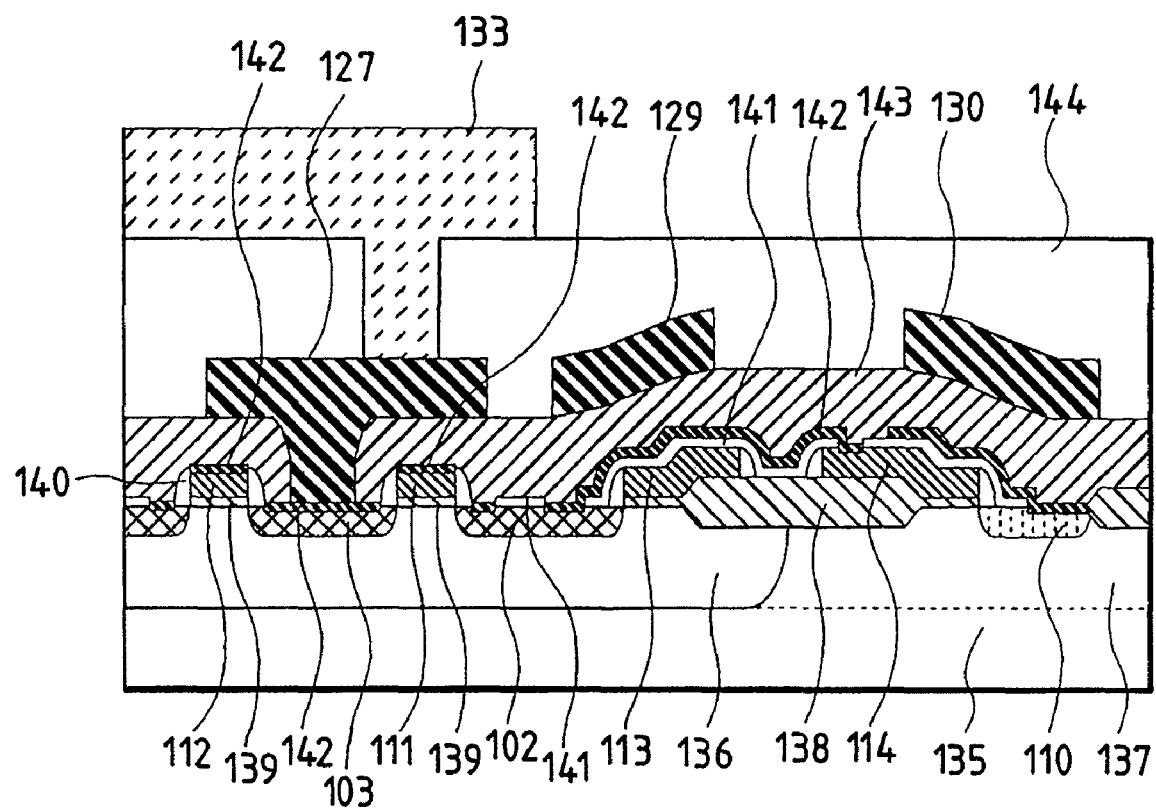
FIG. 46 is a top plan view showing the semiconductor integrated circuit device according to the second embodiment of the present invention.

The present embodiment is a second one of the present invention, which is different from the foregoing Embodiment 1 in the process of forming the local wiring lines $L_1$ and $L_2$. FIGS. 44 and 45 are top plan views showing a portion of 1 bit in the present embodiment, and FIG. 46 shows a sectional structure taken in the direction of line Y-Y of FIG. 44. Specifically, FIG. 44 is a top plan view showing the n-channel drive MIS transistors and transfer MIS transistors and the p-channel load MIS transistors, and FIG. 45 is a top plan view showing the two-layered electrode wiring lines. The equivalent circuit diagram of the memory cell is identical to that shown in FIG. 3 excepting the capacity element $C_2$. The paired drive MIS transistors $Qd_1$ and $Qd_2$, the paired transfer MIS transistors $Qt_1$ and $Qt_2$ and the paired load MIS transistors $Qp_1$ and $Qp_2$, which have their one gate crossly connected with the drain of the other, are individually connected with the storage nodes A and B.

In FIG. 44, the drain of the drive MIS transistor $Qd_1$ and the source or drain of the transfer MIS transistor $Qt_1$ are made of a common heavily doped n-type impurity region 102, and the drain of the drive MIS transistor $Qd_2$ and the drain (or source) of the transfer MIS transistor $Qt_2$ are made of a common heavily doped n-type impurity region 105. Moreover, the common gate electrode 113 of the drive MIS transistor $Qd_1$ and the load MIS transistor $Qp_1$ is connected through an opening 116 with a local wiring line 120 (i.e., $L_2$), through an opening 115 with the heavily doped n-type impurity region 105 and further through an opening 117 with a heavily doped p-type impurity region 110 forming the drain of the load MIS transistor $Qp_2$. Likewise, the common electrode 114 of the drive MIS transistor $Qd_2$ and the load MIS transistor $Qp_2$ is connected through the opening 116 with a local wiring line 119 (i.e., $L_1$), through the opening 115 with the heavily doped n-type impurity region 102, and further through the opening 117 with a heavily doped p-type impurity region 108 forming the drain of the load MIS transistor $Qp_1$. Thus, there are individually formed the storage nodes A and B, which are indicated in the equivalent circuit of the static type random access memory cell of FIG. 43.

On the other hand, a common gate electrode 111 of the transfer MIS transistors $Qt_1$ and $Qt_2$ forms a word line 155 in FIG. 43. Incidentally, a gate electrode 112 belongs to a transfer MIS transistor of an adjacent cell.

Moreover, with openings 123 and 124 of the source or drain of the transfer MIS transistors $Qt_1$ and $Qt_2$, as made of heavily doped n-type impurity regions 103 and 106, there are individually connected first-layered aluminum electrodes 127 and 128, as shown in FIG. 45, and data lines made of overlying second-layered aluminum electrodes 133 and 134 through openings 131 and 132. With the source regions of the drive MIS transistors $Qd_1$ and $Qd_2$ made of heavily doped n-type impurity regions 101 and 104 of FIG. 41, moreover, there are connected through openings 121 and 122 the ground wiring lines which are made of a common first-layered aluminum electrode 129, as shown in FIG. 45.

With the source regions of the load MIS transistors $Qp_1$ and $Qp_2$ made of heavily doped p-type impurity regions 107 and 109 of FIG. 44, on the other hand, there are individually connected through openings 125 and 126 the supply wiring lines made of a common first-layered aluminum electrode 130, as shown in FIG. 45, to supply a predetermined potential to all the memory cells.

Next, the structure of the local wiring lines will be described with reference to the section of FIG. 46. FIG. 46 is a section of the SRAM cell, as taken along line Y-Y' of FIG. 44. In FIG. 46, an n-type silicon substrate 135 is formed with a p-well 136 and an n-well 137 respectively having a depth of 2 μm, a field oxide film 138 having a thickness of 400 nm, and a gate oxide film 139 having a thickness of 10 nm. All the gate electrodes 111 and 112 of the transfer MIS transistors, the gate electrode 113 of the drive MIS transistors and the gate electrode 114 of the load MIS transistors are made of a polycrystalline silicon film having a thickness of 200 nm. Moreover: the heavily doped n-type impurity region 102 is the common drain (or source) of the drive MIS transistors and the transfer MIS transistors; the heavily doped n-type impurity region 103 is the common drain (or source) of the transfer MIS transistors; and the heavily doped p-type impurity region 110 is the drain of the load MIS transistors.

The surfaces of the gate electrodes 111 and 112 of the transfer MIS transistors, a portion of the gate electrode 114 of the drive MIS transistors, and the entire or partial surfaces of the heavily doped n-type impurity regions 102 and 103 and the heavily doped p-type impurity region 110 are formed by the silicifying technique with a titanium silicide film 142 having a thickness of 50 nm to reduce their resistances. Moreover, the titanium silicide films 142 over the heavily doped n-type impurity region 102 and the heavily doped p-type impurity region 110 are automatically connected with each other through the titanium silicide film 142 which is also formed over a silicon oxide film 141. Moreover, a silicon oxide film 143, as lying over the titanium silicide film 142 over the heavily doped n-type impurity region 103, is formed with contact holes and connected with the first-layered aluminum electrode 127.

Next, the steps of manufacturing the present embodiment will be described with reference to FIGS. 47(a) to 47(c), FIGS. 48(a) to 48(c) and FIGS. 49(a) to 49(b). FIGS. 47(a) to 49(b) are sections taken along line Y-Y' from the top plan view of FIG. 44.

Figure 47A:
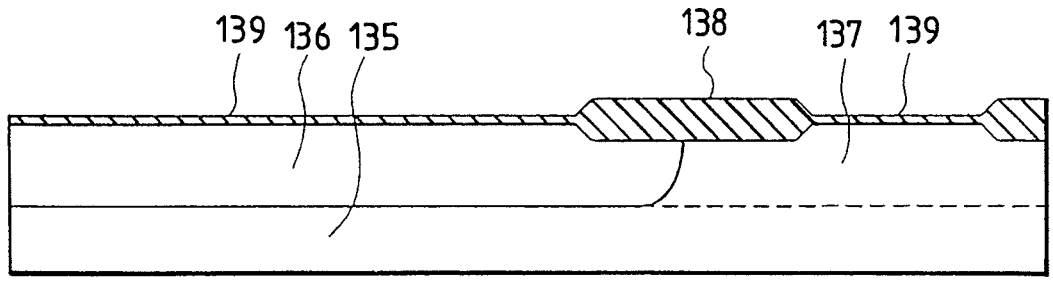
FIGS. 47(a), 47(b) and 47(c) are sections for explaining the steps of manufacturing the semiconductor integrated circuit device according to the second embodiment of the present invention.

First of all, as shown in FIG. 47(a), the n-type silicon substrate 135 having a specific resistance of about 10Ωcm is formed in a dosage of about $1\times10^{16}$ atoms/cm$^2$ with the p-type well 136 and the n-type well 137 having a depth of 1 μm by the ion implantation and the thermal diffusion method and then with the element isolating silicon oxide film (i.e., the field oxide film 138) having a thickness of 400 nm by the well-known selective oxidation method. Subsequently, the portion for the active region of the MIS transistors is formed with the gate oxide film 142 having a thickness of about 10 nm. Here, when the field oxide film 138 is formed, a n-inversion preventing channel stopper layer is ordinarily formed below the field oxide film in the p-type well 136 but is not shown in the Figure. Incidentally, the channel stopper layer may be formed by the ion implantation method after the field oxide film is formed. On the other hand, the wells may have an impurity concentration distribution made to have the higher concentration in the depthwise direction. In this case, the ion implantation for forming the p-type well can be carried out after the field oxide film is formed. In this case, moreover, the ion implantation may be carried out with a plurality of kinds of energy. Then, the ion implantation is carried out for adjusting the threshold voltage of the MOS transistors. For this proper ion implantation, for example, BF$_2$ ions are implanted in a dosage of about $2\times10^{12}$ atoms/cm$^2$ by the energy of 40 KeV. Incidentally, the ion implantation for adjusting the threshold voltage can prevent the gate oxide film from being damaged or contaminated at the ion implanting step, if it is carried out before the gate oxidizing step.

Figure 47B:
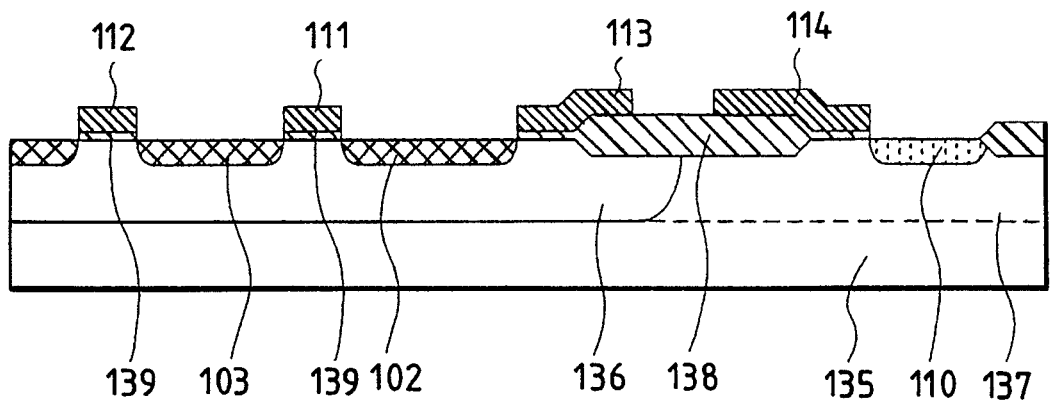

Next, as shown in FIG. 47(b), for example, a polycrystalline silicon film having a thickness of 200 nm is deposited by the low pressure chemical vapor deposition (i.e., LPCVD) so that it is doped with an impurity to have its resistance lowered. The doping method of the impurity is carried out by introducing an n-type impurity such as phosphor by the vapor phase diffusion. Subsequently, the polycrystalline silicon film is patterned into the gate electrodes 111 to 114 by the photolithography and the dry etching method. Subsequently, by using these gate electrodes and photoresists as the masks for the ion implantations, the n-channel MIS transistors are doped with the ions of an n-type impurity such as arsenic in a dosage of about $2\times10^{15}$ atoms/cm$^2$, and the p-channel regions are doped with the ions of a p-type impurity such as boron in a dosage of about $2\times10^{15}$ atoms/cm$^2$. The impurity ions are annealed in the nitrogen atmosphere at 850° C. so that they are activated to form the heavily doped n-type impurity regions 102 and 103 and the heavily doped p-type impurity region 110 having a depth of about 0.1 μm. Incidentally, in order to prevent the reduction of the long-term reliability of the MOS transistors, there may be adopted the so-called "LDD (i.e., Lightly Doped Drain) structure", in which the MOS transistors have their source/drain formed with a lightly doped n-type impurity region, although not described in the present embodiment. Moreover, the method of doping the polycrystalline silicon film of the gate electrode with the impurity may also be exemplified by the ion implantation at the source/drain forming time or by the (doped poly-silicon) method at the time of forming the polycrystalline silicon film.

Figure 47C:
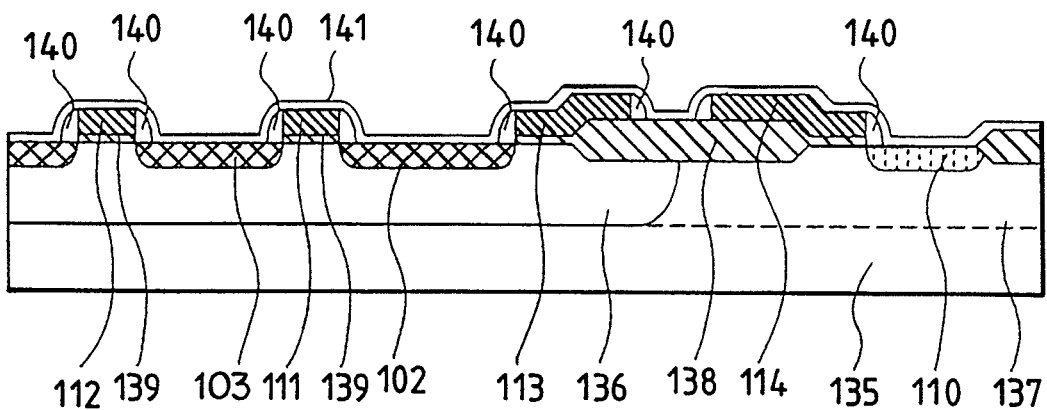
Figure 48A:
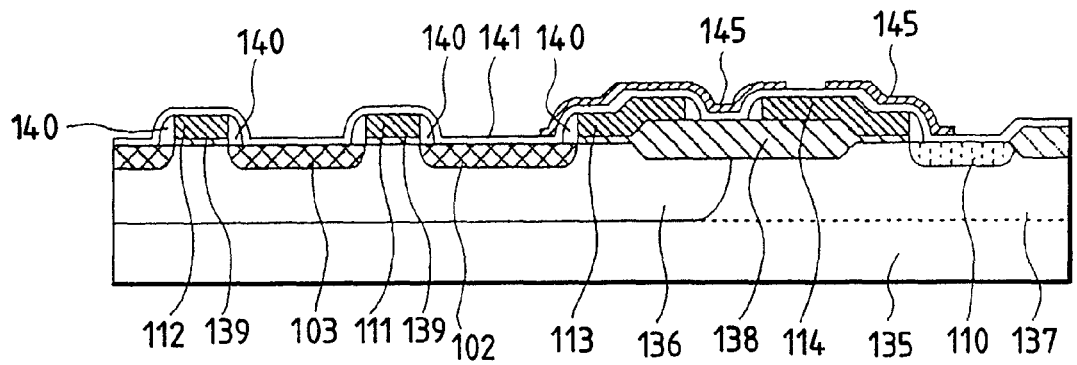
FIGS. 48(a), 48(b) and 48(c) are sections for explaining the steps of manufacturing the semiconductor integrated circuit device according to the second embodiment of the present invention.

Next, as shown in FIG. 47(c), the silicon oxide film having a thickness of about 150 nm is deposited by the LPCVD method of thermally decomposing monosilane gas and is then etched back by the anisotropic dry etching method to form a spacer insulating film 140 on the side walls of the gate electrodes 111 to 114 thereby to expose the heavily doped impurity regions of the upper portion of the gate electrode and the silicon substrate surface to the outside. Next, the silicon oxide film 141 having a thickness of about 30 nm is deposited by a similar LPCVD method, and an amorphous silicon film 145 having a thickness of about 50 nm is subsequently deposited on the silicon oxide film 141 at a temperature of about 520° C. by the LPCVD method. Next, the amorphous silicon film 145 is patterned into the shape of the local wiring lines $L_1$ and $L_2$ by the photolithography and the dry etching method. Incidentally, the amorphous silicon film 145 may be replaced by a polycrystalline silicon film (as shown in FIG. 48(a)).

Figure 48B:
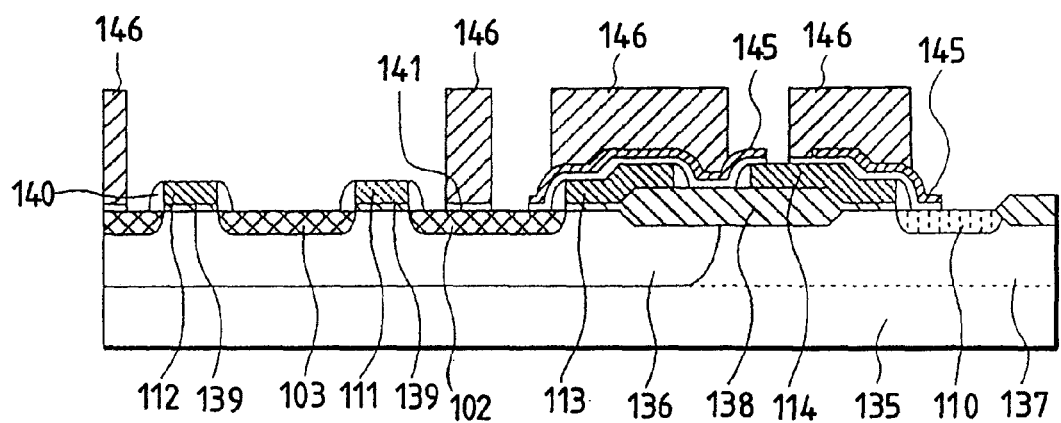

Next, as shown in FIG. 48(b), a photoresist 146 is used as the mask to form the openings (115 to 118 of FIG. 44) in the aforementioned silicon oxide film 141 by the dry etching method. Here, the amorphous silicon film 145 is partially exposed to the openings, but the silicon oxide film 141 of this portion is not dry-etched.

Figure 48C:
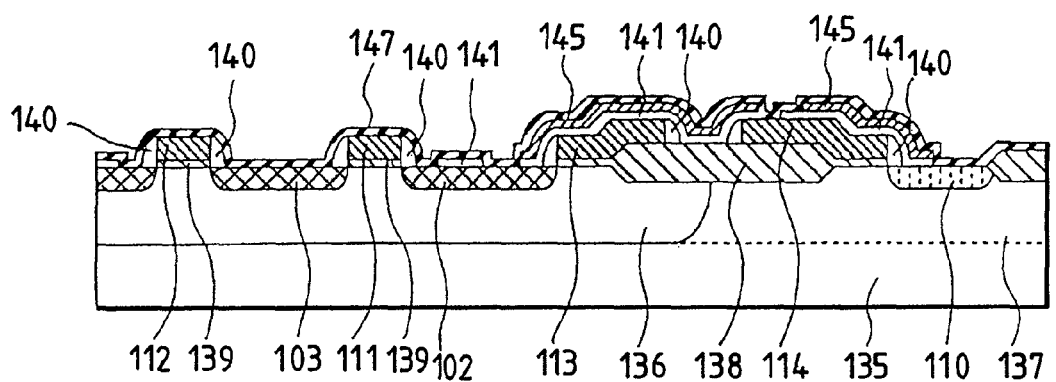

Next, as shown in FIG. 48(c), a titanium film 147 having a thickness of 50 nm is deposited all over the surface by the sputtering method.

Figure 49A:
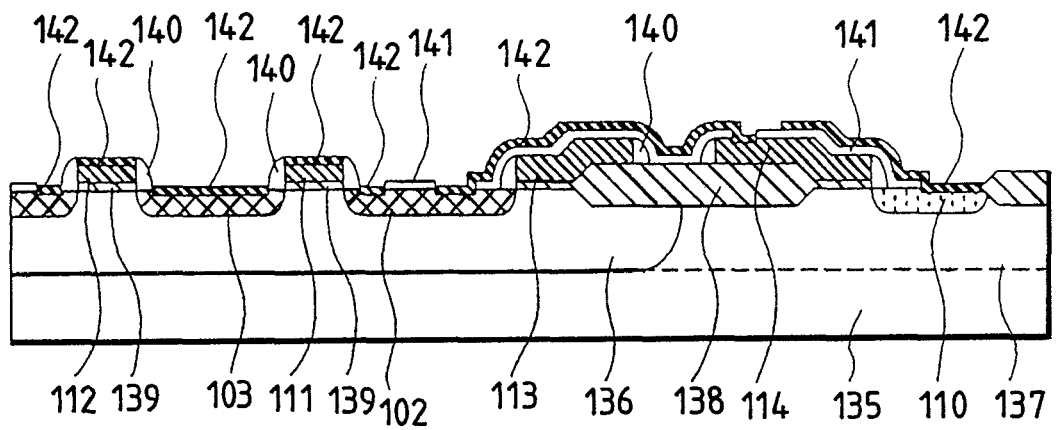
FIGS. 49(a), and 49(b) are sections for explaining the steps of manufacturing the semiconductor integrated circuit device according to the second embodiment of the present invention.

Next, as shown in FIG. 49(a), a heat treatment is carried out in the nitrogen atmosphere to form the titanium silicide film 142 on the exposed heavily doped n-type impurity regions 102 and 103 and heavily doped p-type impurity region 110, the exposed gate electrodes 111, 112 and 114 and the exposed amorphous silicon film 145. The titanium left unreacted is removed by an aqueous solution of hydrogen peroxide or the like. Incidentally, at the time of forming the titanium silicide, the conditions for the thermal treatment are such that the titanium silicide film 142 on the silicon substrate is caused by the heat treatment to creep up the step of the silicon oxide film 141 into contact with the titanium silicide film 142 which is formed by the reaction with the amorphous silicon film 145. At this time, the titanium silicide film 142 an the gate-electrode 113 are insulated by the silicon oxide film 141. Next, the resistance of the titanium silicide film 142 is lowered by an annealing treatment in the nitrogen atmosphere at a temperature of 800° C.

Figure 49B:
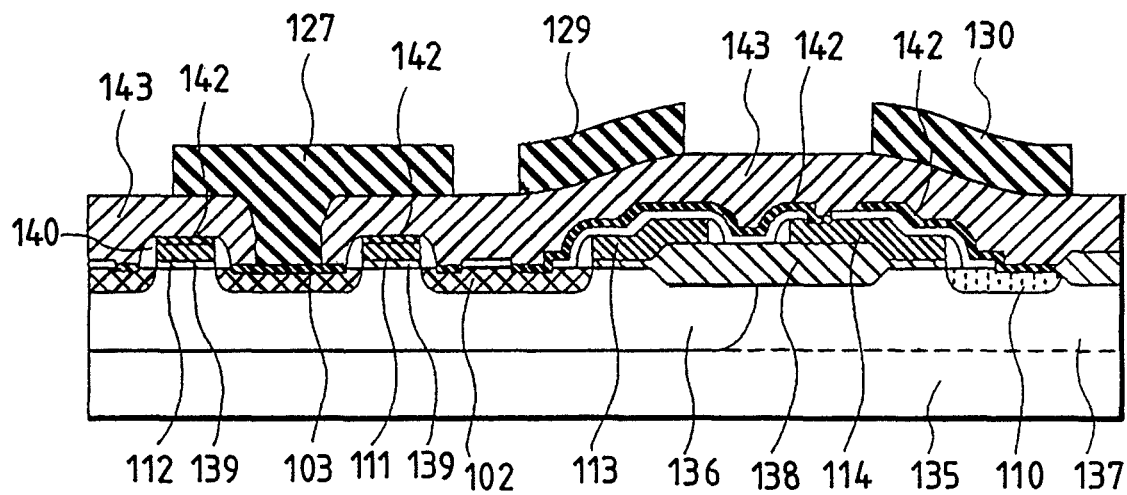

Next, as shown in FIG. 49(b), the silicon oxide film 143 is deposited on the aforementioned titanium silicide film 142 and is formed with the openings 121 to 126 (although not shown in FIG. 49), as shown in FIG. 44, by the photolithography and the dry etching method. Subsequently, the first-layered aluminum electrodes 127, 129 and 130 are patterned by the photolithography and the dry etching method. Incidentally, the temperature for forming the silicon oxide film is desired to be so low that the composition of the titanium silicide film may not be influenced.

Incidentally, the present embodiment has been described in connection with only the memory cell. However, the source/drain of the CMIS transistor group and the gate electrodes around the memory cell can also be silicified by etching the silicon oxide film 141 of a desired portion as in the word lines of the memory cell. Moreover, the present embodiment has been described in connection with the titanium silicide but can use another material such as a cobalt silicide, which is liable to creep up on the oxide film. In addition, there can be used a chemical compound (I.e., a refractory metal silicide) of a known refractory metal and silicon, such as platinum silicide (PtSi$_x$), nickel silicide (NiSi$_x$), tungsten silicide (WSi$_x$) or tantalum silicide (TaSi$_x$).

Moreover, a refractory metal such as cable of selectively growing on the silicon surface is enabled to grow directly on the silicon substrate, the gate electrodes or the amorphous silicon film. In this case, the growing condition for tungsten may be exemplified by the CVD method using tungsten hexafluoride gas.

According to the present embodiment, it is simultaneously possible to silicify the titanium on the silicon substrate and the gate electrodes and to form the local wiring lines of the laminated structure. As a result, the source/drain and the gate electrodes can have their resistances lowered without any drastic increase in the step number, and the memory cell area can also be reduced by using the local wiring lines of the laminated structure in the intersections of the memory cells. According to the present embodiment, moreover, the drive MIS transistors are formed on their drain ends with the local wiring lines which are connected with the heavily doped n-type impurity regions of the drain so that they are at the same potential as that of the drains. In case, therefore, the LDD structure is adopted in the MIS transistors, the reduction of the driving ability by the LDD layer can be suppressed by the fringe electric field of the local wiring lines, to provide a memory cell having a stable operation and excellent noise characteristics. Incidentally, the logic elements other than the memory cell are formed of three or more aluminum wiring lines, although not shown. In the present embodiment, the logical elements of the microprocessor are formed on the silicon substrate 135 and are composed of the MISFETs having the same construction as that of the transfer MISFETs $Qt_1$ and $Qt_2$. In short, the logic elements are formed of the MISFETs having their gate electrode formed of the polycrystalline silicon electrodes 111 and the titanium silicide film 142.

Embodiment 3

Figure 50:
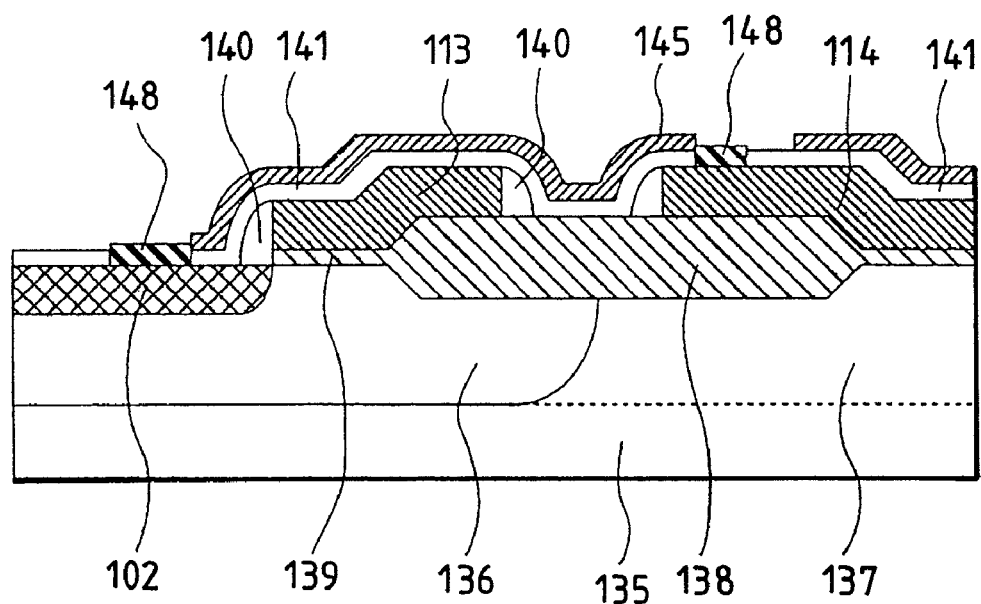
FIG. 50 is a section showing a semiconductor integrated circuit device according to a third embodiment of the present invention.

The present embodiment relates to a method of connecting the local wiring lines and the silicon substrate. FIG. 50 presents a sectional structure of a SRAM memory cell according to the present embodiment and shows the portion of the local wiring lines of the section along line A-A' of FIG. 48(b), in an enlarged scale. The steps when and before the MIS transistors are formed on the silicon substrate are identical to those at and before FIG. 48(b) of Embodiment 2. In FIG. 50, the heavily doped n-type impurity region 102 exposed to the openings of the silicon oxide film 141 and the gate electrodes 114 of the drive MIS transistors are selectively grown with the polycrystalline silicon and connected in self-alignment with the amorphous silicon film 145 which is patterned into the pattern of the local wiring lines. The means for selectively growing the polycrystalline silicon is the LPCVD method using dichlorosilane and hydrogen chloride gas at a temperature of 750° c. to 800° C. Incidentally, in this case, too, the polycrystalline silicon film selectively grows on the source/drain and the gate electrodes of the CMIS transistors of the peripheral circuit other than the memory cell group. If, however, the growth distance of the polycrystalline silicon film is controlled to the step of the silicon oxide film, the source/drain and gate electrodes will not be shorted. Incidentally, according to the aforementioned manufacture process, the polycrystalline silicon film is grown on the amorphous silicon film 145 but is not shown. The subsequent steps may be absolutely identical to those of Embodiment 2 on and after FIG. 48(c).

According to the present embodiment, the silicon substrate and the gate electrodes and the local wiring lines can be easily connected. In the peripheral CMIS transistors, moreover, the polycrystalline silicon also grows on the source/drain and acts as a source for supplying silicon at the time of forming the silicide so that the silicon in the heavily doped impurity region is not consumed by the silicifying reaction. As a result, the leakage current at the pn junction portion can be reduced.

Embodiment 4

Figure 51:
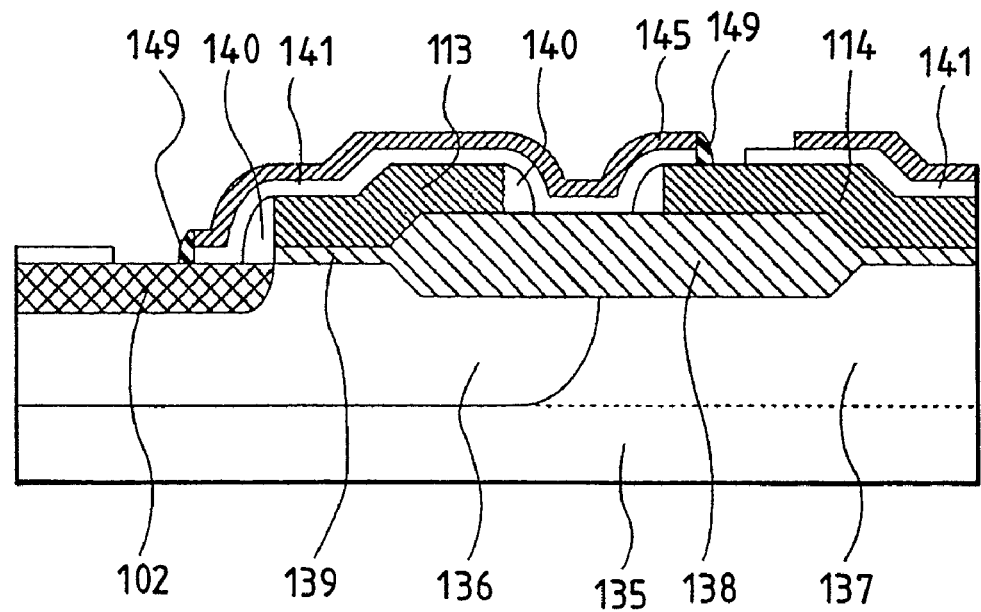
FIG. 51 is a section showing a semiconductor integrated circuit device according to a fourth embodiment of the present invention.

The present embodiment relates to a method for connecting the local wiring lines and the silicon substrate, but is different from that of Embodiment 3. FIG. 51 presents a sectional structure of the SRAM memory cell according to the present embodiment and shows only the portion of the local wiring lines of the section of FIG. 44, in an enlarged scale. The steps when and before the MIS transistors are formed on the silicon substrate are identical to those at and before FIG. 48(b) of Embodiment 2. In FIG. 48(b), the silicon oxide film 141 is exposed through the openings to the outside, and the amorphous silicon of 50 nm is deposited all over the surface. Next, side walls 149 of amorphous silicon are formed on the heavily doped n-type impurity region 102 and on the side walls of the silicon oxide film 141 in the openings of the gate electrodes 114 of the drive MIS transistors and the amorphous silicon film 145, as shown in FIG. 51, by the dry etching back method, and the amorphous silicon film 145 of the local wiring pattern, the heavily doped n-type impurity region 102 and the gate electrodes 114 are connected. Incidentally, in this case, the source/drain and gate electrodes of the MIS transistors are etched back, but this etching rate is desired to be properly controlled to raise no problem. The subsequent steps may be absolutely identical to those at and after FIG. 48(c) of Embodiment 2.

According to the present embodiment, the silicon substrate and the gate electrodes and the local wiring lines can be easily connected.

Embodiment 5

Figure 52:
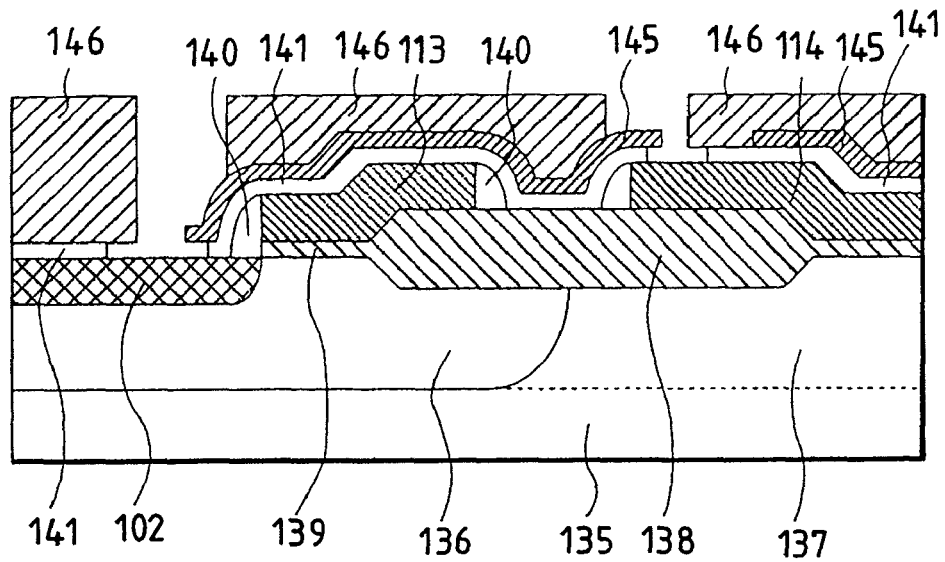
FIG. 52 is a section showing a semiconductor integrated circuit device according to a fifth embodiment of the present invention.

The present embodiment relates to a method for connecting the local wiring lines and the silicon substrate, which is different from those of Embodiments 3 and 4. FIG. 52 presents a sectional structure of the SRAM memory cell according to the present embodiment and shows only the portion of the local wiring lines of the section of FIG. 44, in an enlarged scale. The steps till the MIS transistors are formed on the silicon substrate are identical to those at and before FIG. 48(b) of Embodiment 2. After the openings are formed in the silicon oxide film 141, as shown in FIG. 48(b), the photoresist 146 used at the opening forming time is left as it is, and the silicon oxide film 141 underlying the amorphous silicon film 145 exposed to the openings of the silicon oxide film 141, as shown in FIG. 51, is side-etched. This side etching method is properly exemplified by the wet etching method using an aqueous solution of hydrofluoric acid. The subsequent steps may be absolutely identical to those at and after FIG. 48(c) of Embodiment 2.

According to the present embodiment, the silicon substrate and the gate electrodes and the local wiring lines can be easily connected.

Embodiment 6

Figure 53:
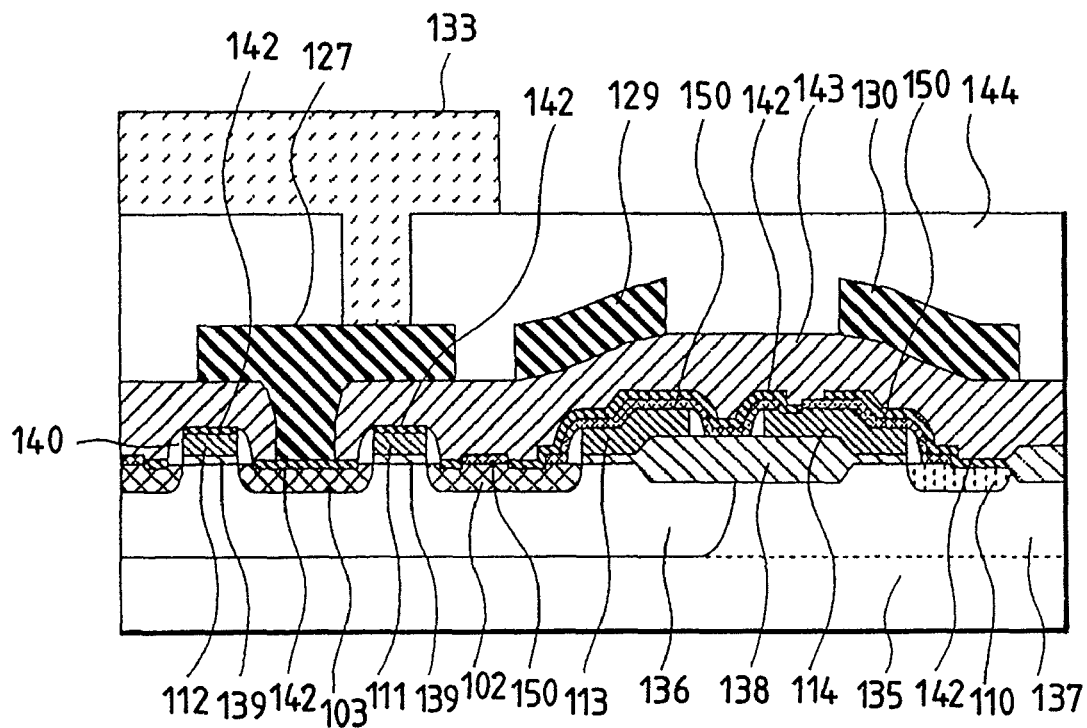
FIG. 53 is a section showing a semiconductor integrated circuit device according to a sixth embodiment of the present invention.

The present embodiment relates to the capacity element $C_1$ using the gate electrodes and the local wiring lines in the SRAM cell of Embodiment 2. FIG. 53 is a section of the SRAM memory cell according to the present embodiment. In FIG. 53, a silicon nitride film 150 having a thickness of 20 nm is deposited by the LPCVD method on the gate electrodes of the drive MIS transistors and is overlaid by the titanium silicide film 142 of the local wiring lines. As a result, the gate electrodes 113, the nitride film 150 and the titanium silicide film 142 constitute the capacity element $C_1$ to be connected between the storage nodes.

In the present embodiment, the capacity element $C_1$ has its insulating film 150 formed of a silicon nitride film, which may be replaced by a composite film of a silicon nitride film and a silicon oxide film. This material may also be exemplified by an insulating film material having a dielectric constant such as tantalum pentoxide.

Figure 54:
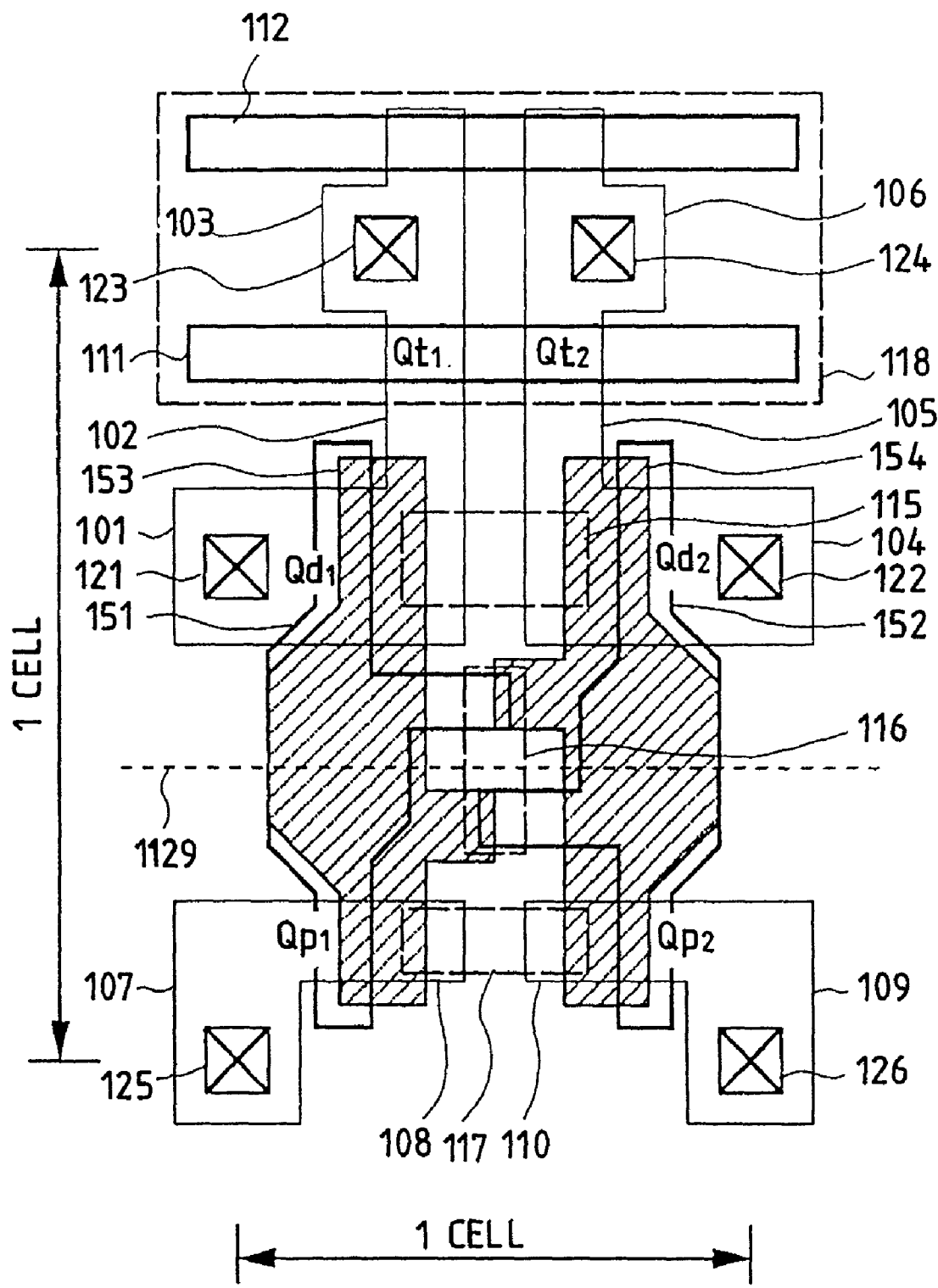
FIG. 54 is a top plan view showing a semiconductor integrated circuit device according to a seventh embodiment of the present invention.
Figure 55:
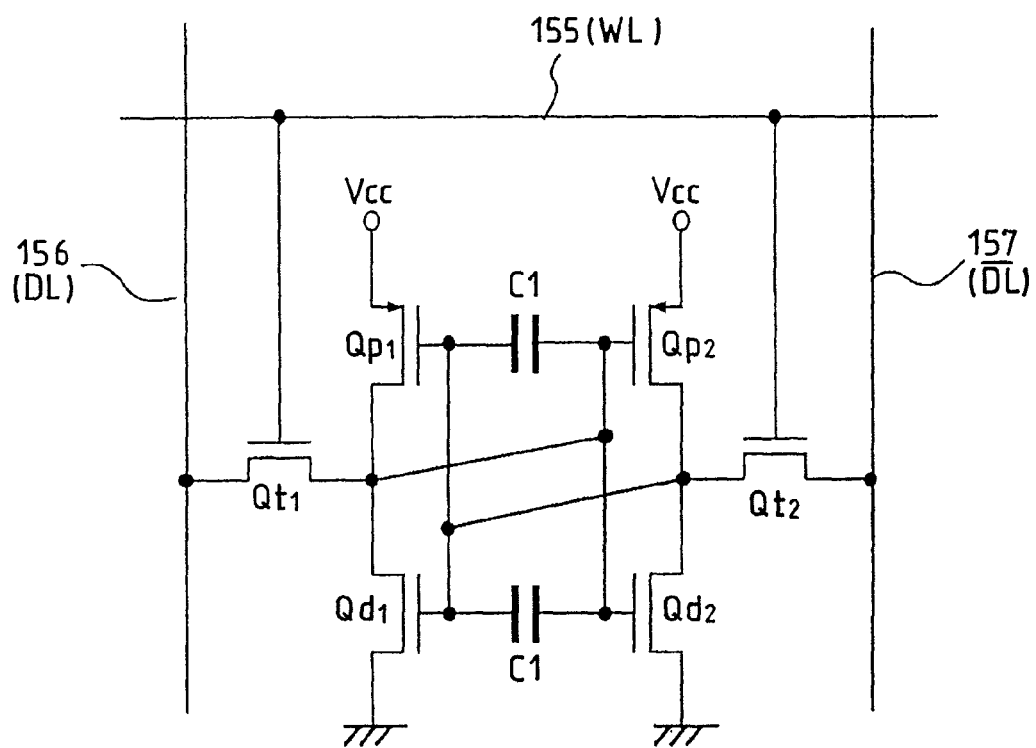
FIG. 55 is an equivalent circuit diagram showing the semiconductor integrated circuit device according to the seventh embodiment of the present invention.

Next, the memory cell will be described with reference to the top plan view of FIG. 54. As shown in FIG. 54, the electrodes have their areas enlarged to increase the capacity of the capacity element $C_1$ of the aforementioned storage nodes. In FIG. 54, the heavily doped n-type impurity region 102 of the storage node is connected with a titanium silicide 153 of the local wiring lines, to form the capacity element $C_1$ between itself and an underlying gate electrode 151 which is connected with the opposite storage node. On the other hand, the heavily doped n-type impurity region 105 of the opposite storage node is connected with a titanium silicide film 154 of the local wiring lines to form the capacity element $C_1$ between itself and an underlying gate electrode 152 which is connected with the storage node. Thus, between the storage nodes A and B of the SRAM, there can be connected in parallel the two capacity elements which are formed of the gate electrodes of the drive MIS transistors and the laminated titanium silicide film, as indicated at $C_1$ in FIG. 55.

According to the present embodiment, the capacity element $C_1$ can be formed between the storage nodes of the SRAM with neither increasing the number of manufacture steps nor enlarging the memory cell areas. As a result, the storage capacity of the storage nodes can be efficiently increased to prevent the malfunction of the memory cell, which might otherwise be caused when the memory cell is irradiated with the α ray.

Embodiment 7

Figure 56:
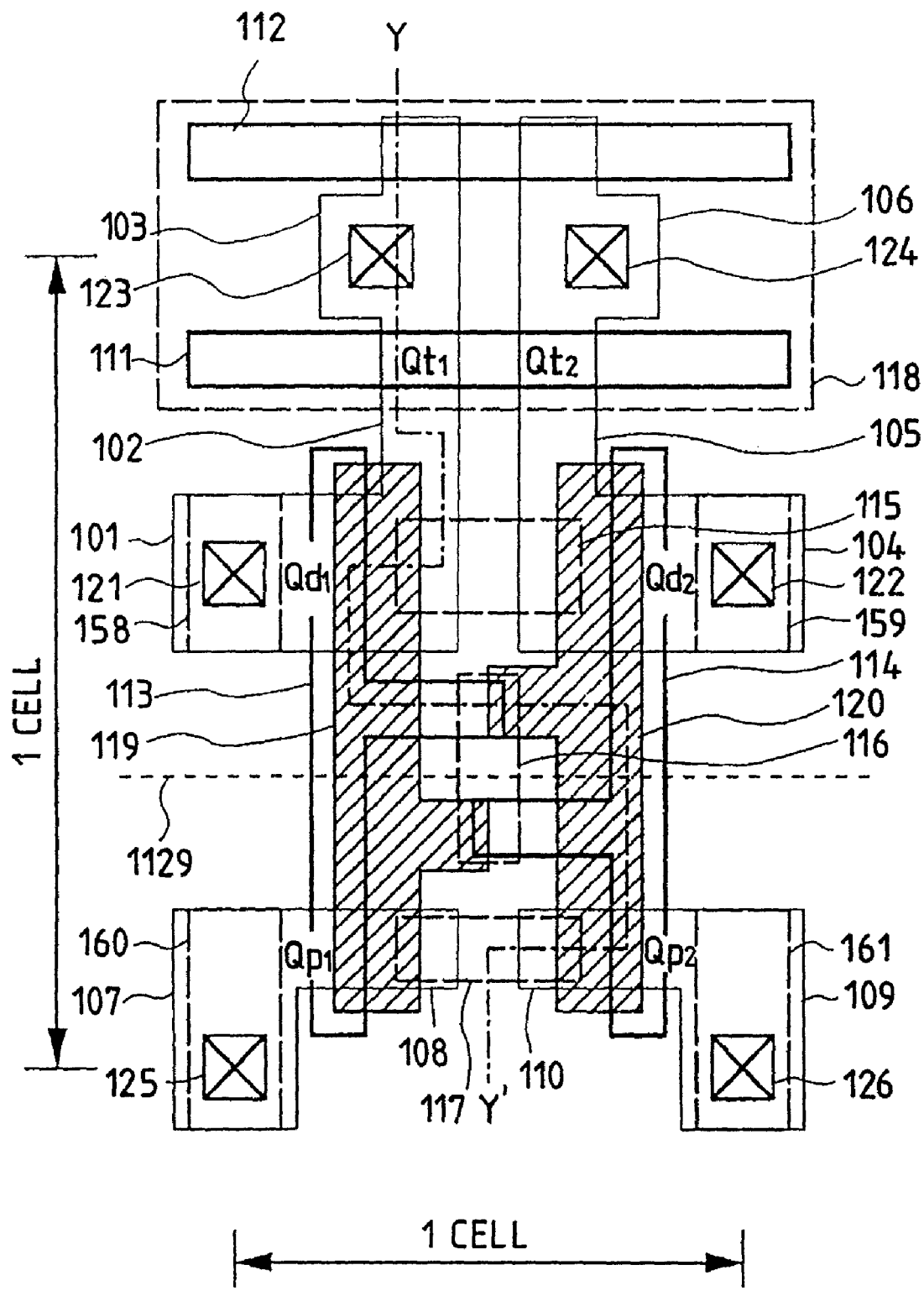
FIG. 56 is a top plan view showing the semiconductor integrated circuit device according to the seventh embodiment of the present invention.

The present embodiment relates to a method of forming contact holes in the SRAM cell of Embodiment 2. FIG. 56 is a top plan view showing the SRAM memory cell according to the present embodiment. As shown in FIG. 56, the heavily doped n-type impurity regions 101 and 104 of the source regions of the drive MIS transistors are formed with openings 158 and 159 and the titanium silicide film which has been described in connection with Embodiment 2. Likewise, the heavily doped p-type impurity regions 107 and 109 of the source regions of the load MIS transistors are formed with openings 160 and 161 and the titanium silicide film 142 which has been described with reference to FIG. 46 of Embodiment 2. Incidentally, the present embodiment has a structure similar to Embodiment 2, as shown in FIG. 44, excepting the structure of the portion other than the openings 158 to 161, as shown in FIG. 56. Hence, the description of the remaining structure will be omitted.

In case, on the other hand, the present embodiment is applied to Embodiment 6, the silicon nitride film 150 to be used as the insulating film for the capacity element $C_1$, as shown in FIG. 53, is etched off by the dry etching step of the aforementioned openings 158 to 161. As a result, the silicon nitride film 150 is not left on those portions of the heavily doped n-type impurity regions 101 and 104 and the heavily doped p-type impurity regions 107 and 109, which are to be formed with the contact holes.

According to the present embodiment, all the openings 121 to 126, as formed for connecting the first-layered aluminum electrodes with the heavily doped impurity regions on the silicon substrate, are formed with the titanium silicide at the silicifying step so that the cleaning treatment to be executed for depositing the first-layered aluminum electrodes can be facilitated. This cleaning treatment is exemplified by the sputter cleaning method using argon gas, for example. Moreover, the portions to be formed with the contact holes are cleared of the silicon nitride film for forming the capacity element $C_1$ so that the aluminum wiring lines can be prevented from being broken in the contact holes.

Embodiment 8

Figure 57:
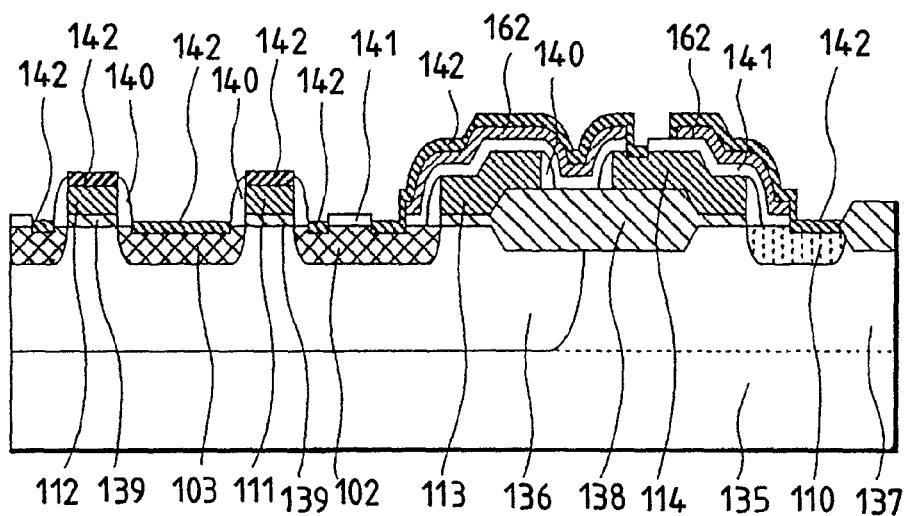
FIG. 57 is a section showing a semiconductor integrated circuit device according to an eighth embodiment of the present invention.

The present embodiment relates to a local wiring line having a poly-cide structure. FIG. 57 present a section of the SRAM cell of Embodiment 2, as taken along line Y-Y' of FIG. 44. In FIG. 57, the n-type silicon substrate 135 is formed with the p-well 136 and the n-well 137 having a depth of 2 μm, the field oxide film 138 having a thickness of 400 nm, and the gate oxide film 139 having a thickness of 10 nm. The gate electrodes 111 and 112 of the transfer MOS transistors, the gate electrode 113 of the drive MOS transistors and the gate electrodes 114 of the load MOS transistor are all formed of a polycrystalline silicon film having a thickness of 200 nm. Moreover: the heavily doped n-type impurity region 102 forms the common drain (or source) of the drive MOS transistors and the transfer MOS transistors; the heavily doped n-type impurity region 103 forms the common drain (or source) of the transfer MOS transistors; and heavily doped p-type impurity region 110 forms the drains of the load MOS transistors.

The surfaces of the gate electrodes 111 and 112 of the aforementioned transfer MOS transistors, the portions of the gate electrodes 114 of the aforementioned drive MOS transistors, and the entire and portions of the surfaces of the aforementioned heavily doped n-type impurity regions 102 and 103 and the aforementioned heavily doped p-type impurity region 110 are formed with the titanium silicide film 142 having a thickness of 50 nm to have their resistances lowered by the so-called "silicifying technique". Moreover, the local wiring lines are formed of a composite film (or a poly-cide film) composed of a polycrystalline silicon film 162 and the overlying titanium silicide film 142 and formed by the aforementioned silicifying step, and the titanium silicide films 142 overlying the heavily doped n-type impurity region 102 and the heavily doped p-type impurity region 110 are automatically connected with each other through the titanium silicide film 142 formed over the aforementioned polycrystalline silicon film 162. Incidentally, the methods of Embodiments 3 to 5 can be applied to that for connecting the local wiring lines and the silicon substrate and the gate electrodes. Moreover, the present embodiment can also be applied to the structure for forming the capacity element $C_1$ of Embodiment 6. At this time, moreover, the aforementioned polycrystalline silicon film 162 may preferably be doped with an impurity. Especially, boron has a lower diffusion rate in the titanium silicide than arsenic or phosphor so that it can suppress the increase in the contact resistance between the heavily doped impurity region in the silicon substrate and the local wiring lines. In this case, the impurity boron can be added immediately after the deposition of the polycrystalline silicon film 162 by the ion implantation for implanting the ions of $BF_2$ by an acceleration energy of 25 KeV and in a dosage of $5 \times 10^{15}$ atoms/cm². Incidentally, this activation of the impurity can effect the thermal step for forming the silicide layer.

Moreover, the polycrystalline silicon film 162 may have its inside divided into the region to be doped with an n-type impurity and the region to be dope with a p-type impurity. This method may be effected by the ion implantation using a photoresist as the mask. Incidentally, in this case, it is desired that the heavily doped n-type impurity region in the silicon substrate is connected with the polycrystalline silicon film 162 doped with the n-type impurity whereas the heavily doped p-type impurity region in the silicon substrate is connected with the polycrystalline silicon film 162 doped with the p-type impurity.

In the method of fabricating the aforementioned local wiring lines, a polycrystalline silicon film having a thickness of about 150 nm may be used in place of the amorphous silicon film 141 at the time of forming the amorphous silicon film 145 of Embodiment 2, as shown in FIG. 48(a). In the present embodiment, moreover, the material for the silicifying reaction is exemplified by titanium but can be replaced by a compound of a well-known refractory metal and silicon, such as cobalt silicide, platinum silicide, nickel silicide, tungsten silicide or tantalum silicide. An alternative material may be a composite film of the aforementioned refractory metal and the polycrystalline silicon film.

According to the present embodiment, the mechanical stress to be applied to the underlying silicon oxide film 141 when the titanium silicide of the local wiring lines is to be formed can be damped by the aforementioned polycrystalline silicon film 162, to prevent the dielectric breakdown and the leakage current increase of the silicon oxide film 141. Especially in case the present embodiment is applied to the formation of the capacity element $C_1$ of Embodiment 6, it is possible to provide a highly reliable SRAM.

Embodiment 9

Figure 58:
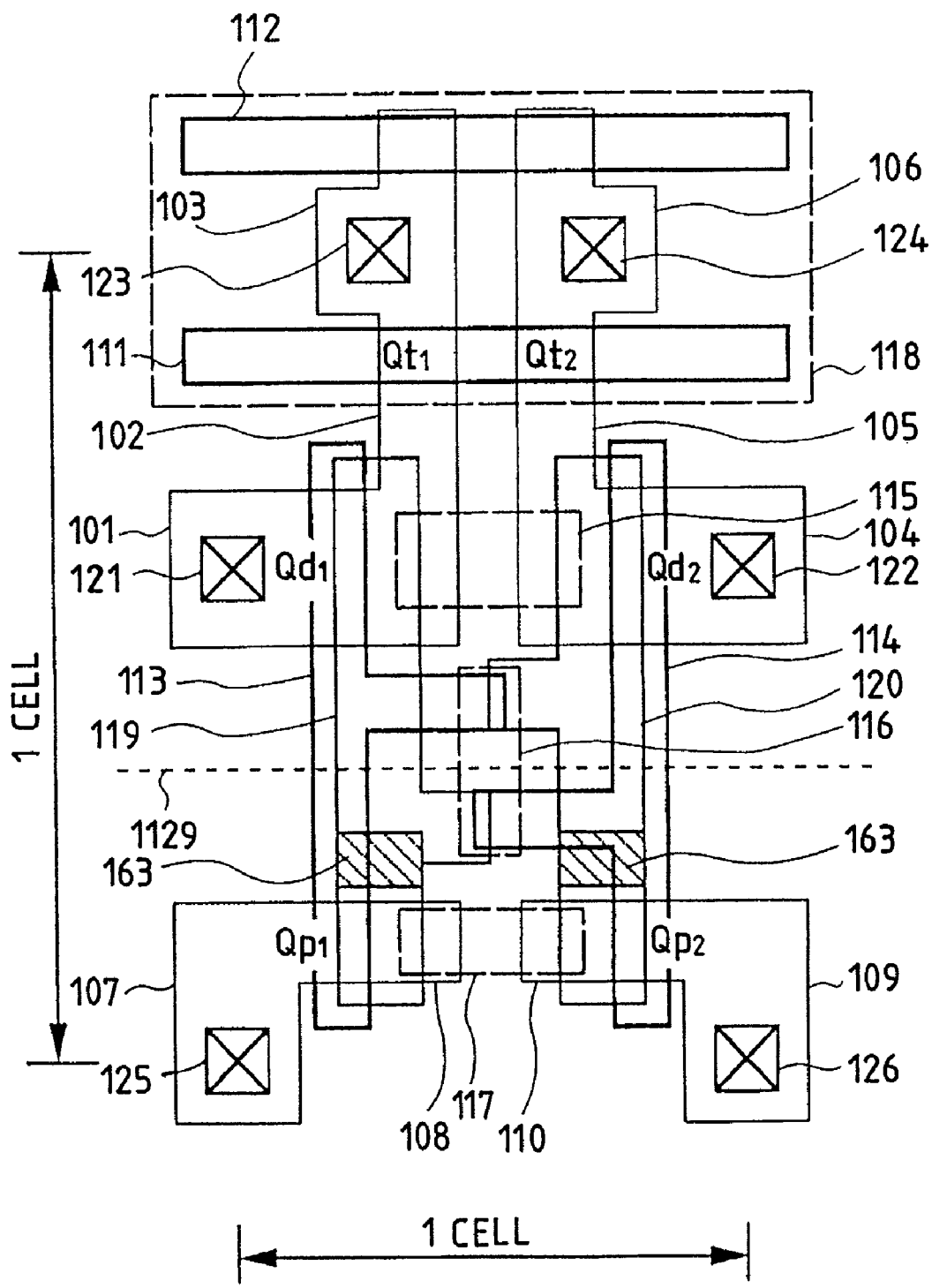
FIG. 58 is a top plan view showing a semiconductor integrated circuit device according to a ninth embodiment of the present invention.

The present embodiment relates to a method of forming the local wiring lines. FIG. 58 presents a top plan view of the present embodiment. In FIG. 58, the local wiring lines 119 and 120 are partially formed with regions 163 heavily doped with oxygen. The oxygen doping method may be exemplified by the well-known method such as the ion implantation. The regions heavily doped with the oxygen act to suppress the mutual diffusions of the n-type impurity and the p-type impurity in the local wiring lines. Incidentally, the structure of FIG. 58 of the portions other than the local wiring lines is similar to that of Embodiment 2, as shown in FIG. 44, and its repeated description will be omitted.

According to the present embodiment, it is possible to suppress the increase in the contact resistance between the heavily doped impurity regions in the silicon substrate and the local wiring lines and the fluctuation of the characteristics and the dispersion of the threshold voltage or the drain current of the drive MOS transistors.

Embodiment 10

Figure 59:
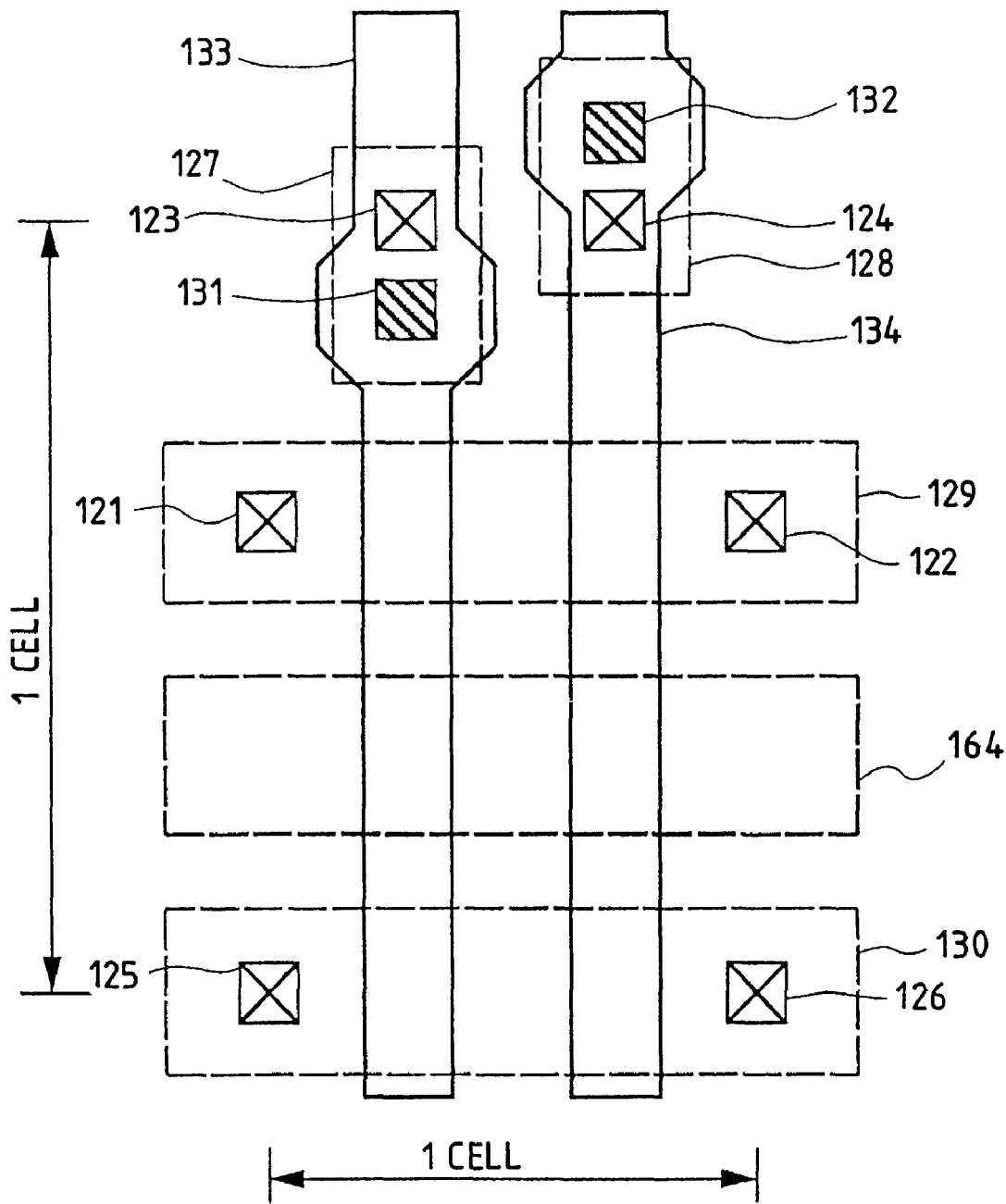
FIG. 59 is a top plan view showing a semiconductor integrated circuit device according to a tenth embodiment of the present invention.

The present embodiment relates to the aluminum wiring lines in the SRAM memory cell in Embodiment 2. FIG. 59 is a top plan view of the SRAM cell according to the present embodiment and shows a portion of the aluminum wiring lines. The portion of the MOS transistors is absolutely similar to that of Embodiment 2. In FIG. 59, a first-layered aluminum electrode 164 is formed between the first-layered aluminum electrode 129 of the ground wiring line and the first-layered aluminum electrode 130 of the supply wiring line. This aluminum electrode 164 shorts the word lines which are divided for the individual memory mats.

According to the present embodiment, the word lines can have their resistances substantially lowered to provide a high speed SRAM.

Embodiment 11

The present embodiment relates to a semiconductor integrated circuit device in which a SRAM using the CMOS transistors of Embodiment 2 and bipolar transistors are formed over a common semiconductor substrate. FIGS. 60(a) to 60(c) and FIGS. 61(a) to 61(c) present sections of manufacture steps of the present embodiment and show the portions of the bipolar elements and the CMOS transistors but not the portion of the memory cell of the SRAM. The present embodiment will be described in the order of the manufacture steps with reference to FIGS. 60(a) to 60(c) and FIGS. 61(a) to 61(c).

Figure 60A:
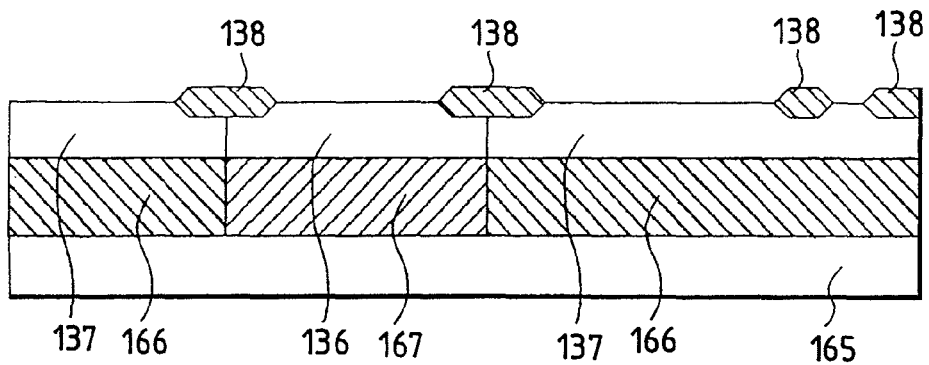
FIGS. 60(a), 60(b) and 60(c) are sections for explaining the steps of manufacturing a semiconductor integrated circuit device according to an eleventh embodiment of the present invention.

First of all, as shown in FIG. 60(a), by using the well-known self-alignment technique, a p-type silicon substrate 165 is formed with an n-type buried layer 166 by the diffusion of antimony (Sb) and with a p-type buried layer 167 by the ion implantation of boron (B) and by the annealing. The antimony diffusing conditions are properly effected at 1,175° C. for about 30 minutes, and the boron ion implanting conditions are properly effected with an acceleration energy of 50 KeV and in a dosage of $7 \times 10^{12}$ atoms/cm². Next, the silicon layer formed to have a thickness of 1 μm by the epitaxial growth is formed therein with the n-well 136 and the p-well 137 and further with the field oxide film 138 having a thickness of 400 nm. Incidentally, the n-well 136 and the p-well 137 are formed over the n-type buried layer 166 and the p-type buried layer 167, respectively, by a method similar to that of Embodiment 2.

Figure 60B:
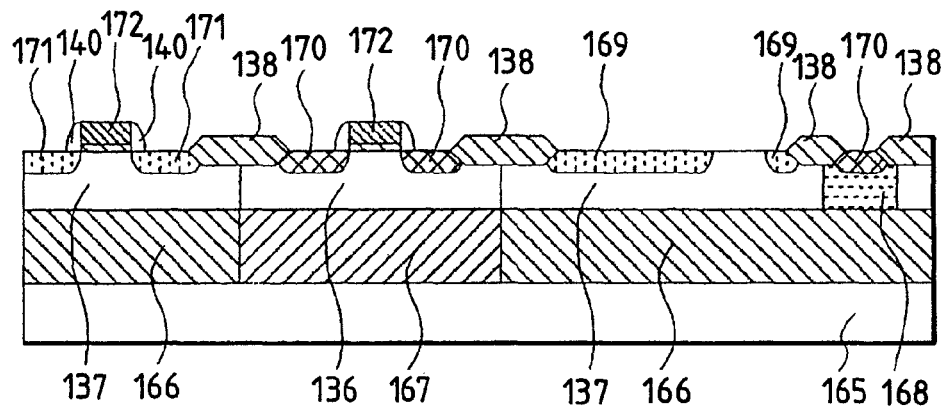

Next, as shown in FIG. 60(b), the gate oxide film 139 having a thickness of 10 nm is formed as in Embodiment 2. After this, the polycrystalline silicon film having a thickness of 200 nm is deposited by the LPCVD method to pattern gate electrodes 172. Next, a photoresist is used as the mask to implant phosphor (P) thereby to form a collector lead-out portion 168 of the bipolar. Likewise, by the ion implantation of arsenic (As), a heavily doped n-type impurity region 170 is formed on the source/drain of the n-channel MOS transistors and on the collector portion of the bipolar. Likewise, a heavily doped p-type impurity region 171 of the source/drain portions of the p-channel MOS transistors and a heavily doped p-type impurity region 169 of the base lead-out portion of the bipolar transistors are simultaneously formed by the ion implantation of $BF_2$. These ion implantation conditions may be identical to those of Embodiment 2.

Figure 60C:
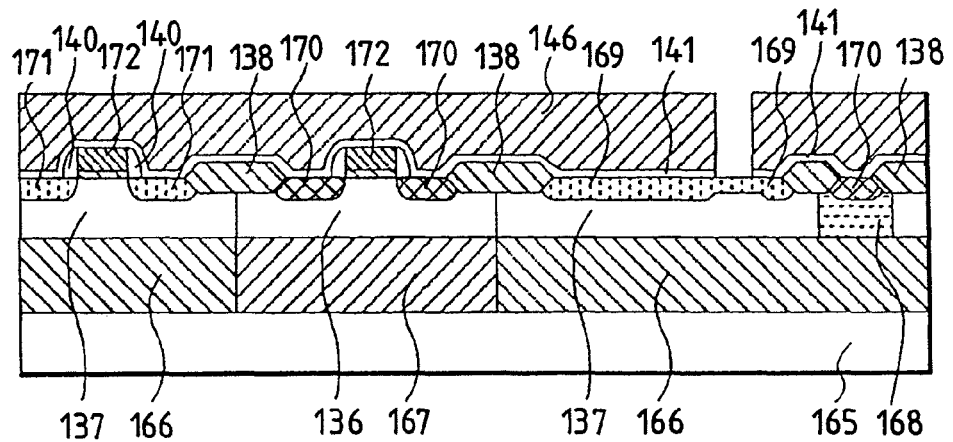

Next, as shown in FIG. 60(c), the portions to form the bases of the bipolar transistors are formed with p-type impurity regions 173 by the boron ion implantation using a photoresist as the mask and by a predetermined annealing treatment. The ion implantation conditions are an acceleration energy of 50 KeV and a dosage of $2 \times 10^{14}$ atoms/cm² for the ion implantation of $BF_2$. Subsequently, the silicon oxide film 141 having a thickness of 50 nm is deposited by the LPCVD method and is then removed from the portions to form the emitters of the bipolar transistors by the dry etching method using the photoresist mask.

Figure 61A:
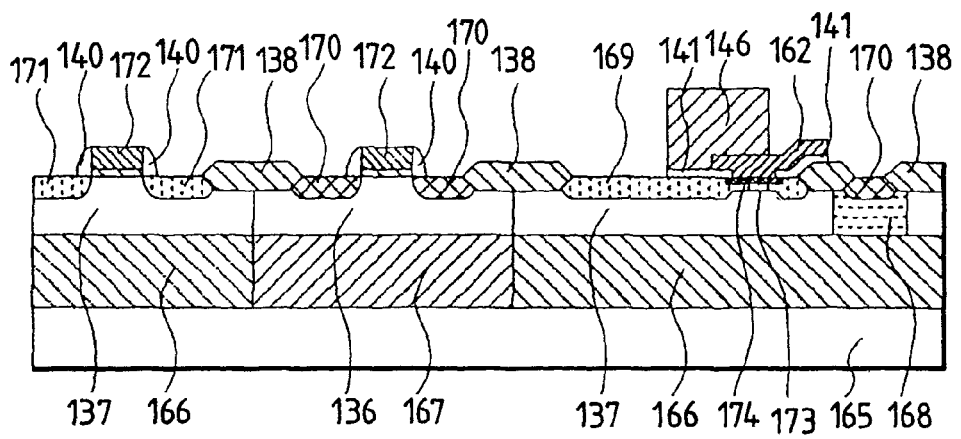
FIGS. 61(a), 61(b) and 61(c) are sections for explaining the steps of manufacturing a semiconductor integrated circuit device according to an eleventh embodiment of the present invention.

Next, as shown in FIG. 61(a), the polycrystalline silicon film 162 having a thickness of 200 nm is deposited by the LPCVD method and has its resistance lowered by the arsenic ion implantation and by a predetermined annealing treatment to form a heavily doped n-type impurity region 174 for the emitter layer. The ion implantation conditions may be exemplified by the implantation energy of 80 KeV and a dosage of $1×10^{16}$ atoms/cm². Moreover, the polycrystalline silicon film 162 is patterned into the shape of the emitter electrodes by the photolithography, and the silicification is the carried out by using the photoresist 146 as the mask to etch off the silicon oxide film 141 thereby to expose the silicon substrate and the gate electrodes to the outside.

Figure 61B:
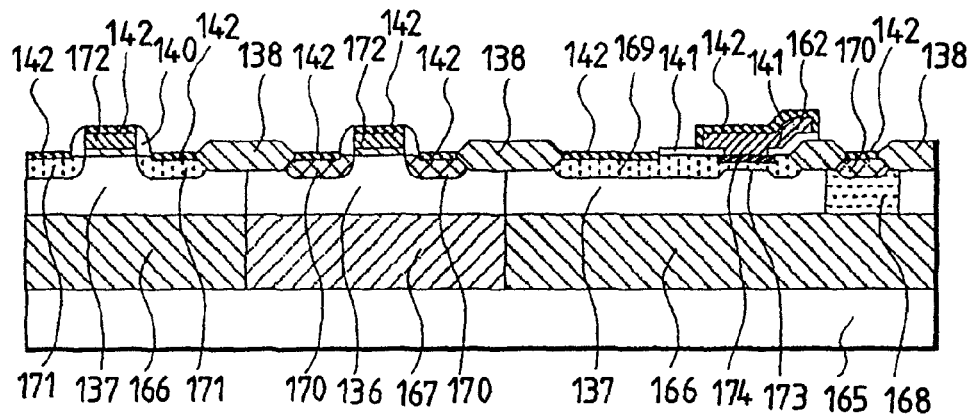

Next, as shown in FIG. 61(b), the silicon substrate and gate electrodes thus exposed and the emitter electrodes are silicified to form the titanium silicide film 142 as in Embodiment 1.

Figure 61C:
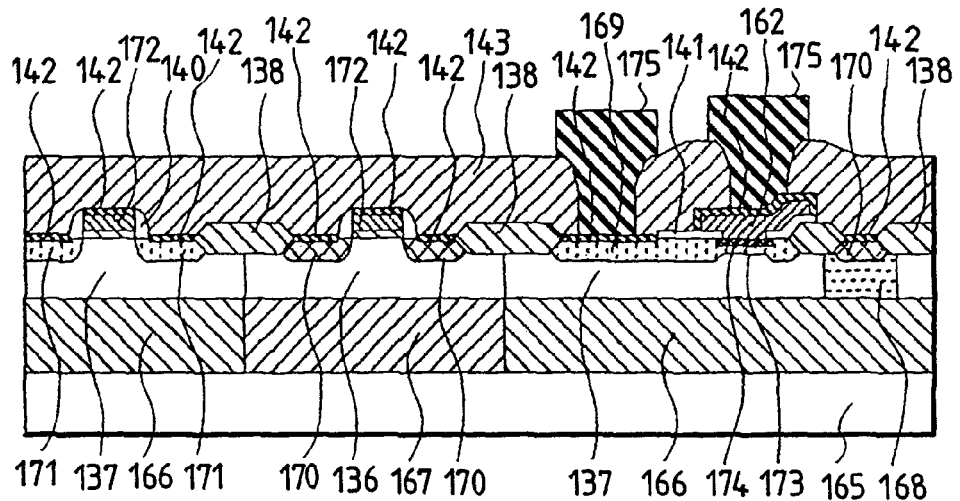

The subsequent wiring steps can be similar to those of Embodiment 2 (as shown in FIG. 61(c)). Incidentally, the present embodiment has been described while premising the local wiring lines using the titanium silicide. However, the resistance lowering material can be exemplified not only by the titanium silicide but also by a refractory metal such as cobalt, tantalum, nickel, tungsten or platinum, or its compound (i.e., silicide) with silicon.

According to the present embodiment, it is possible to simultaneously form the highly integrated SRAM memory cell having the local wiring lines of the laminated structure using the silicification, the bipolar elements and the CMOS transistors, thereby to provide a SRAM capable of operating at a high speed.

Embodiment 12

Figure 62:
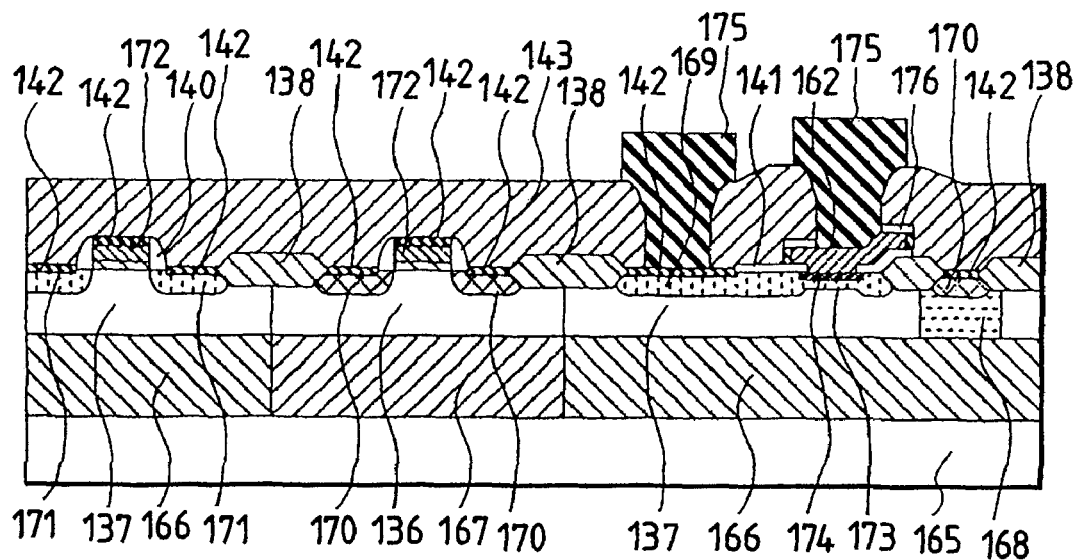
FIG. 62 is a section showing a semiconductor integrated circuit device according to a twelfth embodiment of the present invention.

The present embodiment relates to a semiconductor integrated circuit device in which a SRAM using the CMOS transistors of Embodiment 11 and bipolar transistors are formed on a common semiconductor substrate, and to a method of forming no silicide layer over the emitter electrodes. FIG. 62 presents a section of the present embodiment and shows the portions of the bipolar elements and the CMOS transistors but not the portion of the memory cell of the SRAM. In FIG. 62, over the polycrystalline silicon film 162 of the emitter electrodes, there is formed a silicon oxide film 176 but not the silicide film 142.

The process for manufacturing the aforementioned bipolar transistors will be described in the following with reference to the manufacture process, as described in connection with Embodiment 11. First of all, when the polycrystalline silicon film 162 of the emitters is to be patterned (as corresponds to the step of Embodiment 11, as shown in FIG. 61(a)), the silicon oxide film 176 having a thickness of 80 nm is deposited on the polycrystalline silicon film 162 and is patterned into the shape of the emitter electrodes. After this, the silicon oxide film 176 is sued as the dry etching mask to pattern the polycrystalline silicon film 162. Next, at the step of exposing the silicon substrate or the gate electrodes for the silicification, the silicon oxide film 141 is dry-etching with the photoresist pattern (as shown in FIG. 61(a)) covering the aforementioned emitter electrodes. The subsequent silicifying step and the aluminum wiring line forming step are similar to those of Embodiment 11.

Incidentally, the polycrystalline silicon film 162 of the present embodiment forms the emitter electrodes but can be used in other portions to form resistance elements.

According to the present embodiment, the polycrystalline silicon film of the emitter electrodes of the bipolar transistors is not silicified so that no influence is exerted upon the diffusion of the impurity into the silicide film thereby to easily control the impurity distribution of the heavily doped n-type impurity region of the emitters into the silicon substrate. As a result, it is possible to provide bipolar transistors which has a high current gain and a high performance.

Embodiment 13

Figure 63:
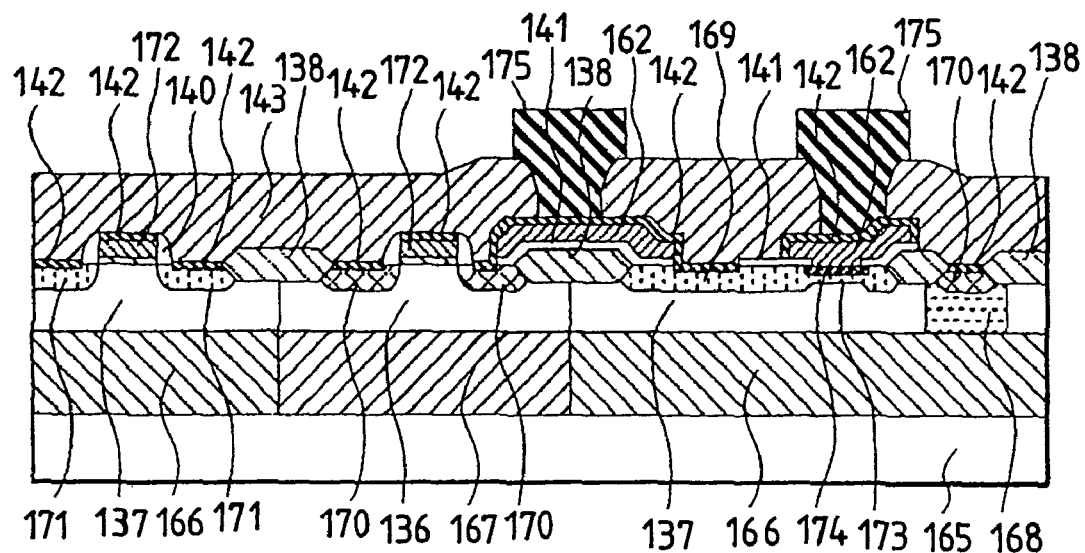
FIG. 63 is a section showing a semiconductor integrated circuit device according to a thirteenth embodiment of the present invention.

The present embodiment relates to a semiconductor integrated circuit device, in which a SRAM having the CMOS transistors or Embodiment 11 and the bipolar transistors are formed on a common semiconductor substrate, and to a structure using the local wiring lines as the lead-out electrodes of the base. FIG. 63 presents a section of the present embodiment and shows the portions of the bipolar elements and the CMOS transistors but not the portion of the memory cells of the SRAM. In FIG. 63, the heavily doped p-type impurity region 169 of the base regions of the bipolar transistors, the polycrystalline silicon film 162 forming the local wiring lines common to the emitter electrodes, and the heavily doped n-type impurity region 170 of the MOS transistors are connected with each other through the titanium silicide film 142, and this titanium silicide film 142 is formed over the polycrystalline silicon film 162. As shown in FIG. 63, moreover, the titanium silicide film 142 overlying the aforementioned polycrystalline silicon film 162 can be formed thereover with openings to connect aluminum wiring lines 175. Incidentally, in the present embodiment, the local wiring lines are connected with the n-channel source/drain but can be connected with the p-channel source/drain. Moreover, the present embodiment can also be applied to Embodiment 12 to omit the silicification of the emitter electrodes.

According to the present embodiment, the area required for effecting contacts between the bases of the bipolar transistors and the source/drain of the MOS transistors can be made smaller than that of the ordinary one, to provide a highly integrated SRAM and a high speed SRAM.

Embodiment 14

Figure 64A:
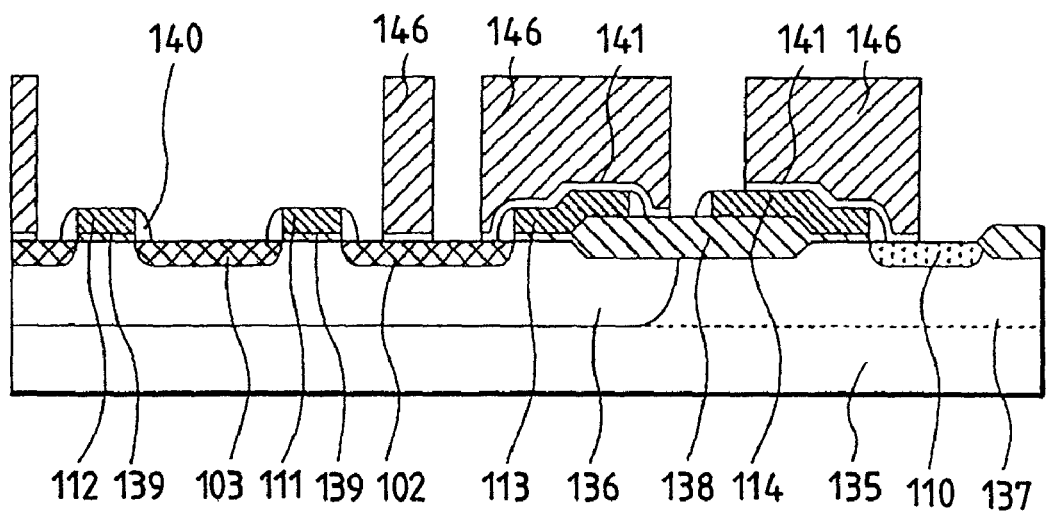
FIGS. 64(a) and 64(b) are sections showing the steps of manufacturing the semiconductor integrated circuit device according to a fourteenth embodiment of the present invention.
Figure 64B:
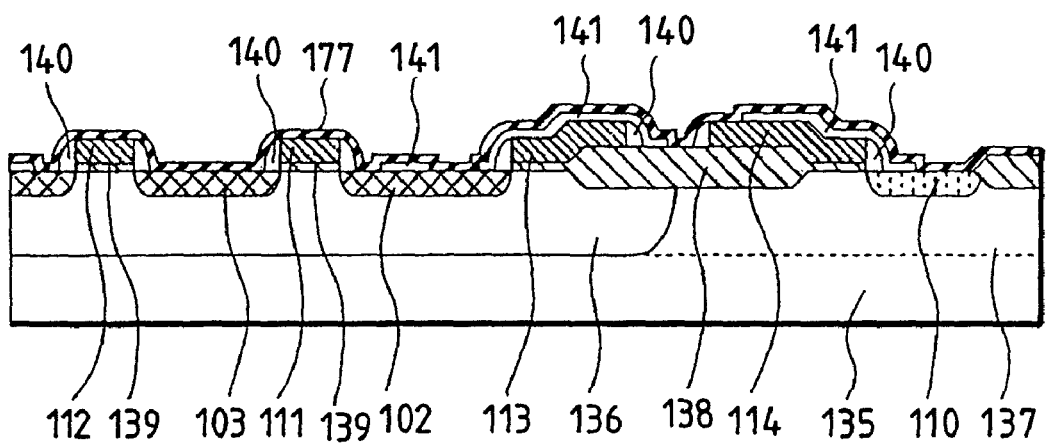
Figure 65A:
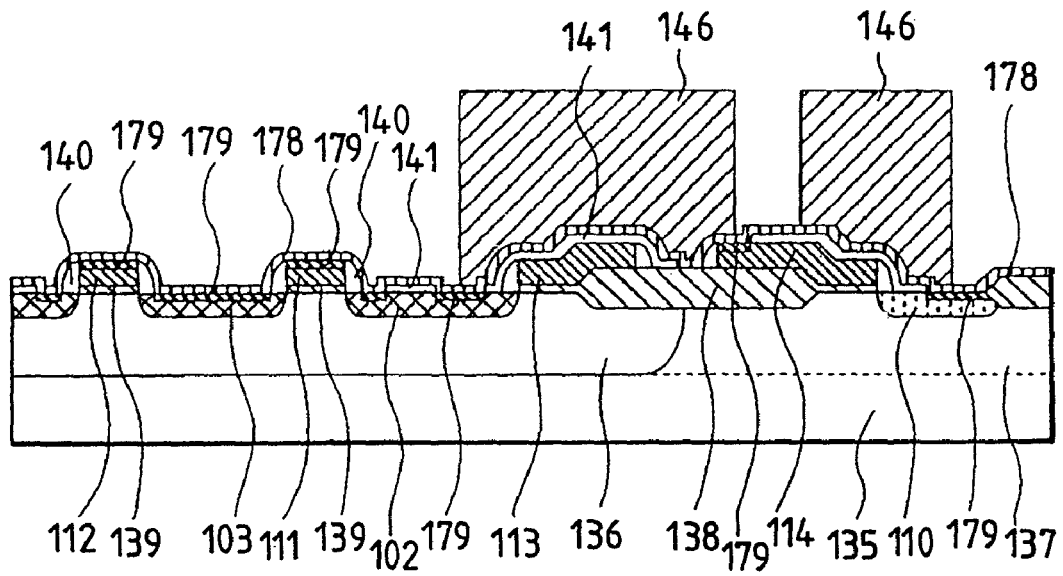
FIGS. 65(a) and 65(b) are sections showing the steps of manufacturing the semiconductor integrated circuit device according to a fourteenth embodiment of the present invention.

The present embodiment relates to a structure using the titanium nitride film in the local wiring lines. FIGS. 64(a) and 64(b) and FIGS. 65(a) and 65(b) present sections showing the manufacture steps of the present embodiment. The manufacture process of the present embodiment will be described in the following with reference to the Figures. First of all, the steps when and before the silicon substrate is formed with the MOS transistors and has the silicon oxide film 141 deposited thereon, are similar to those of Embodiment 2, as shown in FIG. 47(c). Next, the photoresist 146 is used as the mask to form the openings in the aforementioned silicon oxide film 141 thereby to expose the silicon substrate and the gate electrodes to the outside (as shown in FIG. 64(a)). Next, a titanium film 177 having a thickness of 50 nm is deposited all over the surface by the sputtering method (as shown) in FIG. 64(b)). Then, an annealing treatment is executed in the nitrogen atmosphere of 675° C. for 30 minutes, to change the surface of the titanium film 177 into a titanium nitride film 178 and to form a titanium silicide film 179 over the heavily doped n-type impurity regions 102 and 103 and the heavily doped p-type impurity region 110 over the silicon substrate, and over the gate electrodes 111, 112, 113 and 114. Next, the photoresist 146 is used as the mask to remove the unnecessary portions of the titanium nitride film 178 and the unreacted titanium film by the dry etching method and by the wet etching method using an aqueous solution of hydrogen peroxide. Incidentally, the temperature and time period for the aforementioned annealing treatment are adjusted to set the thicknesses of the titanium silicide film and the titanium nitride film to desired values. Next, an annealing treatment is carried out in the nitrogen atmosphere of 800° C. to lower the resistances of the titanium nitride film 178 and the titanium silicide film 179 (as shown in FIG. 65(a)).

Figure 65B:
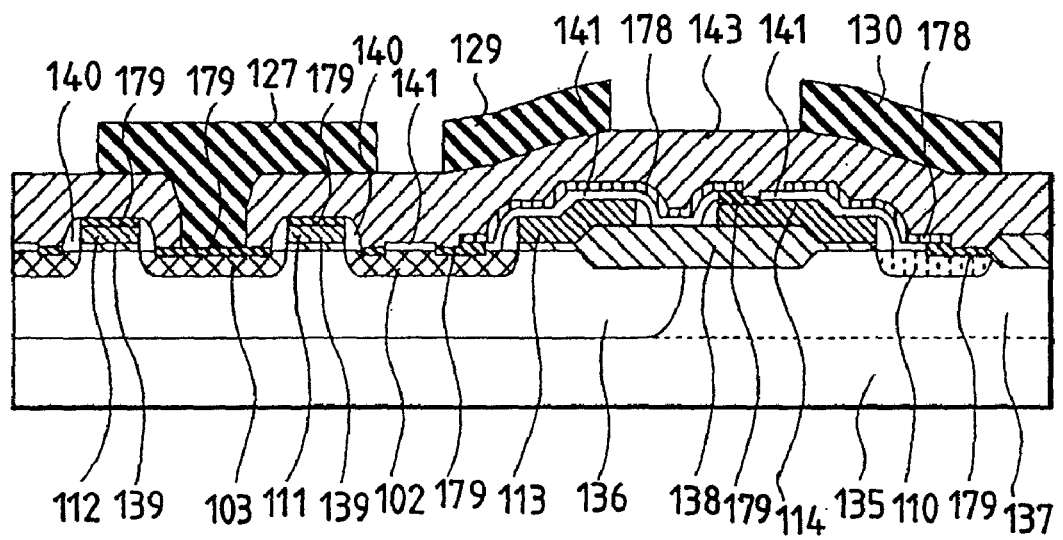

The subsequent steps of forming the aluminum wiring lines are similar to those of Embodiment 2 (as shown in FIG. 65(b)).

According to the present embodiment, the local wiring lines of the SRAM memory cell can be formed of the titanium nitride film acting as the barrier against the diffusion of the impurity. As a result, it is possible to eliminate the problem which might otherwise be caused by the diffusion of the impurity of the heavily doped impurity regions of the n-channel MOS transistors and the p-channel MOS transistors into the silicide thereby to increase the contact resistance in the boundary of the silicon substrate.

Embodiment 15

The present embodiment relates to a capacity element which is formed in the circuit element group using the CMIS transistors in the periphery of the portion other than the memory cell. FIG. 66 presents a sectional structure of the present embodiment. In FIG. 66, the n-type silicon substrate 135 is formed with the n-type well 137, the field oxide film 138, the gate oxide film 139 and a gate electrode 1124. This gate electrode 1124 is used as the mask for an ion implantation to form a heavily doped n-type impurity region 1225 simultaneously with the source/drain region of the MIS transistors. Incidentally, these steps are similar to those used in the ordinary CMIS process, as has been described in connection with Embodiment 2. Moreover, the gate electrode 1124 is formed thereover though a silicon oxide film 1126 with a titanium silicide film 1127 for the local wiring lines, and this titanium silicide film 1127 has its one end connected with the heavily doped n-type impurity region 1125. The aforementioned gate electrode is connected with aluminum wiring lines 1128.

Thanks to the structure described above, a MIS capacity is formed between the gate electrode 1124 and the n-type well 137, and a capacity element is formed between the gate electrode 1124 and the titanium silicide film 1127 for the local wiring lines. Incidentally, the present embodiment uses the titanium silicide film is used for the local wiring lines, but the poly-cide structure can also be adopted by applying Embodiment 8. Moreover, the present embodiment is described in connection with the MIS capacity of the n-type well, but the conduction type of the impurity may be inverted in connection with the MIS capacity of the p-type well. Incidentally, the capacity element made in the present embodiment can be applied to a circuit for raising or lowering the supply voltage.

According to the present embodiment, no step is added except for the step of manufacturing the memory cell according to the present invention, and the two capacity elements can be formed without increasing the necessary area on the silicon substrate. As a result, it is possible to provide the capacity element $C_1$ requiring a small area.

Embodiment 16

The present embodiment relates to a resistance element which is formed in the circuit element group using the CMIS transistors in the periphery of the portion other than the memory cell. FIG. 67 presents a sectional structure of the present embodiment. In FIG. 67, the n-type silicon substrate 135 is formed with the p-type well 1336 and the field oxide film 138, and the heavily doped n-type impurity region 1125 is formed simultaneously with the source/drain regions of the MIS transistors and is overlaid by the silicon oxide film 1126. Incidentally, these steps are similar to those of the ordinary CMIS process which has been described in connection with Embodiment 2. At the portions to be connected with the aluminum wiring lines 1128, moreover, the silicon oxide film 1126 is selectively etched to form the titanium silicide film 1127 in the portion over the heavily doped impurity region 1125 at the silicifying step.

Thanks to the aforementioned structure, the heavily doped impurity region 1125 presents the resistance element. Incidentally, the resistance element thus formed in the present embodiment can be used in an input protecting circuit, for example.

According to the present embodiment, no step is added except for the step of manufacturing the memory cell according to the present invention, and the resistance element can be formed without increasing the necessary area on the silicon substrate.

Embodiment 17

The present embodiment relates to a method for connecting the local wiring lines and the silicon substrate. FIG. 68 presents a sectional structure of the SRAM memory cell according to the present embodiment and shows the portion of the local wiring lines of the section, as taken along line A-A' of FIG. 49(a), in an enlarged scale. The steps when and before the MIS transistors are formed on the silicon substrate, are similar to those at and before FIG. 48(c) of Embodiment 2. In FIG. 48(c), the titanium nitride film 178, which is formed simultaneously as the polycrystalline silicon film 145 is silicified, is patterned by using the photography similar to that described in connection with Embodiment 14, to leave a desired portion, and the heavily doped n-type impurity region 102 and the titanium silicide film 141 are connected through that titanium nitride film 178 (as shown in FIG. 68). The subsequent steps may be similar to those of Embodiment 2, as shown in FIG. 49(b).

According to the present embodiment, the silicon substrate and the gate electrodes and the local wiring lines can be easily connected.

According to Embodiments 2 to 17, the source/drain and gate electrodes of the MIS transistors can have their individual surfaces formed with the low resistance material by the silicifying process, and the local wiring lines can be laminated over the gate electrodes. As a result, it is possible to provide a semiconductor integrated circuit device having the complete CMOS type SRAM cell which has a high integration, a resistance to the soft error and an excellent consistency with the logic process.

Although our invention has been specifically described in connection with Embodiments 2 to 17, it should not be limited thereto but can naturally be modified in various manners without departing from the gist thereof. Over the local wiring lines 119, 120, 153 and 154 according to Embodiments 2 to 17, for example, there may be arranged the reference voltage line 20 according to Embodiment 1. The capacity element $C_2$ may be formed between the local wiring lines 119, 120, 153 and 154 and the reference voltage line 20. These modifications can also achieve the same effects as these of Embodiment 1.

The representative ones of the invention to be disclosed in Embodiments 2 to 17 will be summarized in the following.

(1) In a semiconductor integrated circuit device with a plurality of insulated gate type field effect transistors comprising: a first impurity region 102, 105, 108 and 110 formed over the surface of a semiconductor substrate; and a first conducting film 111 and a second conducting film 113 and 114 formed through a first insulating film 139 and in the same layer, a semiconductor integrated circuit device and a process for manufacturing the same, wherein a third conducting film 142 having a lower resistance than the first impurity region 102, 105, 108 and 110 or the second conducting film 113 and 114 is formed over a portion of the first impurity region and the first conducting film, and wherein the third conducting film 143 has a lower resistance than that of the first conducting film 111.

(2) In a semiconductor integrated circuit device comprising: with a first impurity region formed over the surface of a semiconductor substrate; a first conducting film 111 and a second conducting film 113 and 114 formed through a first insulating film 139 and in the same layer; and a plurality of fourth conducting films 119, 120, 142, 151 and 152 formed over the second conducting film 113 and 114 through a second insulating film 141 and 150, a semiconductor integrated circuit device and a process for manufacturing the same as set forth in (1), wherein the fourth conducting films 119, 120, 142, 151 and 152 are so formed through the second if 141 and 150 that at least their portions are superposed over the second conducting film 113 and 114, wherein the first conducting film 111 and a portion other than the superposed portion of the first impurity region 102, 105, 108 and 110 and the second conducting film 113 and 114 over the fourth conducting films 119, 120, 142, 151 and 152 are formed with a third conducting film 142 having a lower resistance than that of the first impurity region or the first conducting film, wherein the first conducting film 111 has a lower resistance than that of the second conducting film 113 and 114, wherein the fourth conducting films 119, 120, 142, 151 and 152 are formed by the method having the means for forming the third conducting film 142, and wherein the other second conducting film 113 and 114 is connected with the fourth conducting films 119, 120, 142, 151 and 152.

(3) A semiconductor integrated circuit device and a process for manufacturing the same as set forth in (2), comprising: the step of forming the first impurity region 102, 105, 108 and 110 on the surface of the semiconductor substrate; the step of forming the first insulating film 139; the step of forming the first and second conducting films 111, 113 and 114; the step of the second insulating film 141 and 150 on the first and second conducting films; the step of forming a fifth conducting film 145; the step of simultaneously forming an opening 118 to the first conducting film 111 and an opening 115, 116 and 117 to the first impurity region 102, 105, 108 and 110 to cover the fifth conducting film and removing the second insulating film; the step of lowering the resistance of the fifth conducting film and then selectively forming the conducting film 142 partially in the portions of the first conducting film 111 exposed to the opening and the first impurity region 102, 105, 108 and 110 in self-alignment; and the step of the third conducting film 142 in that portions with the first impurity region 102, 105, 108 and 110 and the fourth conducting films 119, 120, 142, 151 and 152.

(4) In a static type random access memory comprising: a flip-flop circuit having a first storage node and a second storage node crossly connecting one and other drains of a pair of drive insulated gate type field effect transistors $Qd_1$ and $Qd_2$; a pair of transfer insulated gate type field effect transistors $Qt_1$ and $Qt_2$ individually connected with the first and second storage node, and a pair of load elements $Qp_1$ and $Qp_2$; and word lines having the gate electrode of the transfer insulated gate type field effect transistors, a semiconductor integrated circuit device and a process for manufacturing the same, wherein the drive insulated gate type field effect transistors and the transfer insulated gate type field effect transistors have their gate insulating films formed of the first insulating film 139, and wherein the transfer insulated gate type field effect transistors have their gate electrodes 111 and 142 given a lower resistance than that of the gate electrodes 113 and 114 of the drive insulated gate type field effect transistors.

(5) A semiconductor integrated circuit device and a process for manufacturing the same as set forth in (1) and (4), wherein the drive insulated gate type field effect transistors $Qd_1$ and $Qd_2$ and the load insulated gate type field effect transistors $Qp_1$ and $Qp_2$ of a memory cell group have their gate electrodes formed of the second conducting film 113 and 114, and wherein the transfer insulated gate type field effect transistor or the memory cell group and the insulated gate type field effect transistors of a peripheral circuit group have their gate electrodes formed of a composite film composed of the first conducting film 111 and the third conducting film 142 having a lower resistance than that of the first conducting film.

(6) In a static type random access memory wherein a pair of transfer MIS transistors $Qt_1$ and $Qt_2$, a pair of load MIS transistors $Qp_1$ and $Qp_2$ and a pair of drive MIS transistors $Qd_1$ and $Qd_2$ are individually arranged in an X direction, and wherein the transfer MIS transistors have their gate electrode 111 extended in the X direction whereas the drive MIS transistors and the load MIS transistors have their common gate electrodes 113 and 114 extended in a Y direction, a semiconductor integrated circuit device and a process for manufacturing the same, wherein a pair of local wiring lines 119, 120, 142, 151 and 152 are individually extended in the Y direction over the common gate electrodes 113 and 114 of the drive MIS transistors and the load MIS transistor, wherein by using individual identical connection means 142, one 119 and 151 of the paired local wiring lines is connected at the side wall of the end portion with the heavily doped n-type impurity region 102 of the drain of one drive MIS transistor $Qd_1$ whereas the other 120 and 152 of the paired local wiring lines is connected at the side wall of the end portion with the heavily doped n-type impurity region 103 of the drain of the other drive MIS transistor $Qd_2$, wherein one 119 and 151 of the paired local wiring lines is connected at the side wall of the end portion with the gate electrode 114 of the other drive MIS transistor whereas the other 120 and 152 of the paired local wiring lines is connected at the side wall of the end portion with the gate electrode 113 of the one drive MIS transistor.

(7) In a semiconductor integrated circuit device comprising: a first impurity region 102, 105, 108 and 110 formed over the surface of the semiconductor substrate; a first conducting film 111 and a pair of second conducting films 113 and 114 formed through a first insulating film and in the same layer; and a pair of fourth conducting films 119, 120, 141, 153 and 154 formed over the second conducting films through a second insulating film 141 and 150, wherein the paired transfer insulated gate type field effect transistors have their gate electrodes formed of the first conducting film 111, wherein the paired drive insulated gate type field effect transistors have their gate electrodes formed of the second conducting films 113 and 114, and wherein the first or second storage node contains at least the first impurity region.

a semiconductor integrated circuit device and a process for manufacturing the same as set forth in (5) or (6), wherein said fourth conducting films 119, 120, 142, 153 and 154 are so formed through the second insulating film 141 and 150 that at least their portions are superposed over the second conducting films 113 and 114, wherein the first conducting film 111 and a portion other than the superposed portion of the first impurity region 102, 105, 108 and 110 and the second conducting films 113 and 114 over the fourth conducting films 119, 120, 142, 153 and 154 are formed with a third conducting film 142 having a lower resistance than that of the first impurity region 102, 105, 108 and 110 or the second conducting films 113 and 114, and wherein one of the fourth conducting films 119, 120, 142, 153 and 154 is insulated from the gate electrode of one drive insulated gate type field effect transistor but is connected with the gate electrode of the other drive insulated gate type field effect transistor to effect the local inter-connection in the memory cell.

(8) A semiconductor integrated circuit device and a process for manufacturing the same as set forth in (7), wherein the paired load elements are composed of the drive insulated gate type field effect transistors $Qd_1$ and $Qd_2$ and the paired of load insulated gate type field effect transistors $Qp_1$ and $Qp_2$ of the opposite conduction type, wherein the load insulated gate type field effect transistors and the drive insulated gate type field effect transistors connected with the common storage node are formed of the common gate electrode 113 and 114, and wherein the drains of the drive and load insulated gate type field effect transistors connected with one storage node and the gate electrodes of the drive and load insulated gate type field effect transistors connected with the other storage node are connected with each other through the fourth conducting films 119, 120, 142, 153 and 154 to form the cross connections of the flip-flop circuit.

(9) A semiconductor integrated circuit device and a process for manufacturing the same as set forth in (2) and (7), wherein the portions in the first conducting film 111, the second conducting films 113 and 114 and the first impurity region 102, 105, 108 and 110 other than those superposed over the fourth conducting films are formed with the third conducting film 142 having a lower resistance by using the fourth conducting films as the mask.

(10) A semiconductor integrated circuit device and a process for manufacturing the same, wherein the first and second conducting films 111, 113 and 114 are made of polycrystalline silicon doped with an impurity, and wherein the third conducting film 142 is made of a compound of a refractory metal such as W, Ti, Co, Pt, Ni or Ta and silicon.

(11) A semiconductor integrated circuit device and a process for manufacturing the same, wherein the second conducting films 113 and 114, the second insulating film 141 and 150 and the fourth conducting films 119, 120, 142, 153 and 154 form a capacity element $C_1$ for supplying electric charge to the second conducting films.

(12) A semiconductor integrated circuit device and a process for manufacturing the same as set forth in (11), wherein the capacity element $C_1$ is connected between the first and second storage nodes.

(13) A semiconductor integrated circuit device and a process for manufacturing the same, wherein the second insulating film 141 and 150 contains a silicon nitride film.

(14) In a semiconductor integrated circuit device, in which having bipolar transistors and insulated gate type field effect transistors are formed over a common semiconductor substrate.

a semiconductor integrated circuit device and a process for manufacturing the same as set forth in (2) and (7), wherein the bipolar transistors have their emitter electrodes formed of the fourth conducting films 142.

(15) In a semiconductor integrated circuit device, a semiconductor integrated circuit device and a process for manufacturing the same as set forth in (5) to (7), wherein a power wiring line for supplying the electric power to the static type random access memory cell array and a ground wiring line are composed of first-layered aluminum wiring lines 129 and 130, wherein data lines are composed of second-layered aluminum wiring lines 133 and 134, and wherein a logic circuit other than the memory cell array is made of three layers or more aluminum wiring lines.

(16) A semiconductor integrated circuit device and a process for manufacturing the same as set forth (15), wherein the first-layered aluminum wiring lines 164 are formed in the direction of the word lines to connect a plurality of word lines at the extensions of the former word lines.

(17) In a semiconductor integrated circuit device in which a static type random access memory and the logic element of a microprocessor are formed over a common semiconductor substrate, a semiconductor integrated circuit device and a process for manufacturing the same as set forth in (5) to (7), wherein the insulated gate type field effect transistors of the logic element group have their gate electrodes formed of a composite film composed of the first conducting film 111 and the third conducting film 142.

What is claimed is:

1. A semiconductor integrated circuit device comprising:
a memory cell of a static random access memory including a first n-channel MISFET, a second n-channel MISFET, a first p-channel MISFET and a second p-channel MISFET,
each of the first-channel MISFET and the second n-channel MISFET having a gate electrode formed over a semiconductor substrate, and a source region and a drain region formed in the semiconductor substrate,
each of the first p-channel MISFET and the second p-channel MISFET having a gate electrode formed over the semiconductor substrate, and a source region and a drain region formed in the semiconductor substrate;
a first insulating film formed over the MISFETs;
a first conductive film and a second conductive film formed on the first insulating film and comprised of a different conductive layer from that of the gate electrodes of the MISFETs,
the first conductive film being electrically connected to the drain region of the first n-channel MISFET, the drain region of the first p-channel MISFET, the gate electrode of the second n-channel MISFET and the gate electrode of the second p-channel MISFET,
the second conductive film being electrically connected to the drain region of the second n-channel MISFET, the drain region of the second p-channel MISFET, the gate electrode of the first n-channel MISFET and the gate electrode of the first p-channel MISFET;
a third conductive film, a fourth conductive film, a fifth conductive film and a sixth conductive film formed with the same level layer as the first conductive film and the second conductive film and arranged separately with each other;
a second insulating film formed over the first conductive film, the second conductive film, the third conductive film, the fourth conductive film, the fifth conductive film and the sixth conductive film;
a power source line formed over the second insulating film and electrically connected to the source region of the first p-channel MISFET through the third conductive film and to the source region of the second p-channel MISFET through the fourth conductive film; and
a reference voltage line formed over the second insulating film, formed with the same level layer as the power source line and electrically connected to the source region of the first n-channel MISFET through the fifth conductive film and to the source region of the second n-channel MISFET through the sixth conductive film.

2. A semiconductor integrated circuit device according to claim 1, further comprising:
   a wiring line formed over the second insulating film and formed with the same level layer as the power source line,
   wherein the memory cell includes a first transfer MISFET and a second transfer MISFET each having a gate electrode, and
   wherein the wiring line is electrically connected to the gate electrodes of the first transfer MISFET and the second transfer MISFET.

3. A semiconductor integrated circuit device according to claim 1, wherein the power source line and the reference voltage line extend over the first conductive film and the second conductive film.

4. A semiconductor integrated circuit device according to claim 1, wherein the p-channel MISFETs are arranged to be spaced from the n-channel MISFETs in a first direction, and wherein the power source line and the reference voltage line extend in a second direction crossing the first direction.

5. A semiconductor integrated circuit device according to claim 1, further comprising:
   a logic element of a microprocessor.

6. A semiconductor integrated circuit device according to claim 1, wherein each of the source region and the drain region of the p-channel MISFET includes a selectively formed region such that a silicide layer is formed on the selectively formed region.

7. A semiconductor integrated circuit device according to claim 1, wherein a surface of the second insulating film is substantially flat.

8. A semiconductor integrated circuit device comprising:
   a memory cell of a static random access memory including a first n-channel MISFET, a second n-channel MISFET, a first p-channel MISFET and a second p-channel MISFET,
   each of the first n-channel MISFET and the second n-channel MISFET having a gate electrode formed over a semiconductor substrate, and a source region and a drain region formed in the semiconductor substrate,
   each of the first p-channel MISFET and the second p-channel MISFET having a gate electrode formed over the semiconductor substrate, and a source region and a drain region formed in the semiconductor substrate;
   a first insulating film formed over the MISFETs;
   a first conductive film and a second conductive film formed on the first insulating film and comprised of a different conductive layer from that of the gate electrodes of the MISFETs,
   the first conductive film being electrically connected to the drain region of the first n-channel MISFET, the drain region of the first p-channel MISFET, the gate electrode of the second n-channel MISFET and the gate electrode of the second p-channel MISFET,
   the second first conductive film being electrically connected to the drain region of the second n-channel MISFET, the drain region of the second p-channel MISFET, the gate electrode of the first n-channel MISFET and the gate electrode of the first p-channel MISFET;
   a third conductive film, a fourth conductive film, a fifth conductive film and a sixth conductive film formed with the same level layer as the first conductive film and the second conductive film and arranged separately with each other,
   the first p-channel MISFET being arranged to be spaced from the first n-channel MISFET in a first direction,
   the second n-channel MISFET being arranged to be spaced from the second p-channel MISFET in the first direction,
   the fourth conductive film arranged to be spaced from the third conductive film in a second direction crossing the first direction, and
   the sixth conductive film arranged to be spaced from the fifth conductive film in the second direction;
   a second insulating film formed over the first conductive film, the second conductive film, the third conductive film, the fourth conductive film the fifth conductive film and the sixth conductive film;
   a power source line formed over the second insulating film and electrically connected to the source region of the first p-channel MISFET through the third conductive film and to the source region of the second p-channel MISFET through the fourth conductive film; and
   a reference voltage line formed over the second insulating film, formed with the same level layer as the power source line and electrically connected to the source region of the first n-channel MISFET through the fifth conductive film and to the source region of the second n-channel MISFET through the sixth conductive film,
   the power source line and the reference voltage line extending in the second direction.

9. A semiconductor integrated circuit device according to claim 8, further comprising:
   a wiring line formed over the second insulating film and formed with the same level layer as the power source line,
   wherein the memory cell includes a first transfer MISFET and a second transfer MISFET each having a gate electrode, and
   wherein the wiring line is electrically connected to the gate electrodes of the first transfer MISFET and the second transfer MISFET.

10. A semiconductor integrated circuit device according to claim 8, wherein the power source line and the reference voltage line extend over the first conductive film and the second conductive film.

11. A semiconductor integrated circuit device according to claim 8, further comprising:
   a logic element of a microprocessor.

12. A semiconductor integrated circuit device according to claim 8, wherein each of the source region and the drain region of the p-channel MISFETs includes a selectively formed region such that a silicide layer is formed on the selectively formed region.

13. A semiconductor integrated circuit device according to claim 8, wherein a surface of the second insulating film is substantially flat.

14. A semiconductor integrated circuit device comprising:
   memory cells of a static random access memory, each including a first n-channel MISFET, a second n-channel MISFET, a first p-channel MISFET and a second p-channel MISFET,
   each of the first n-channel MISFET and the second n-channel MISFET having a gate electrode formed over a semiconductor substrate, and a source region and a drain region formed in the semiconductor substrate,
   each of the first p-channel MISFET and the second p-channel MISFET having a gate electrode formed over the semiconductor substrate, and a source region and a drain region formed in the semiconductor substrate;

a first insulating film formed over the MISFETs;

first conductive films and second conductive films formed on the first insulating film and comprised of a different conductive layer from the gate electrodes of the MISFETs, each of the first conductive films, in the memory cell, being electrically connected to the drain region of the first n-channel MISFET, the drain region of the first p-channel MISFET, the gate electrode of the second n-channel MISFET and the gate electrode of the second p-channel MISFET, each of the second conductive films, in the memory cell, being electrically connected to the drain region of the second n-channel MISFET, the drain region of the second p-channel MISFET, the gate electrode of the first n-channel MISFET and the gate electrode of the first p-channel MISFET;

third conductive films, fourth conductive films, fifth conductive films and sixth conductive films formed with the same level layer as the first conductive films and the second conductive films such that, in the memory cell, the third conductive films, the fourth conductive films, the fifth conductive films and the sixth conductive films are arranged separately with each other;

a second insulating film formed over the first conductive films, the second conductive films, the third conductive films, the fourth conductive films, the fifth conductive films and the sixth conductive films;

power source lines formed over the second insulating film and electrically connected to the source regions of the first p-channel MISFETs through the third conductive films and to the source regions of the second p-channel MISFETs through the fourth conductive films; and reference voltage lines formed over the second insulating film, formed with the same level layer as the power source lines and electrically connected to the source regions of the first n-channel MISFETs through the fifth conductive films and to the source regions of the second n-channel MISFETs through the sixth conductive films.

15. A semiconductor integrated circuit device according to claim 14, further comprising:

wiring lines formed over the second insulating film and formed with the same level layer as the power source lines, wherein the memory cell includes a first transfer MISFET and a second transfer MISFET each having a gate electrode, and wherein the wiring lines are electrically connected to the gate electrodes of the first transfer MISFETs and the second transfer MISFETs.

16. A semiconductor integrated circuit device according to claim 14, wherein, in the memory cell, the power source lines and the reference voltage lines extend over the first conductive films and the second conductive films.

17. A semiconductor integrated circuit device according to claim 14, wherein, in the memory cell, the p-channel MISFETs are arranged to be spaced from the n-channel MISFETs in a first direction, and wherein, in the memory cell, the power source lines and the reference voltage lines extend in a second direction crossing the first direction.

18. A semiconductor integrated circuit device according to claim 14, further comprising:

a logic element of a microprocessor.

19. A semiconductor integrated circuit device according to claim 14, wherein each of the source region and the drain region of the p-channel MISFETs includes a selectively formed region such that a silicide layer is formed on the selectively formed region.

20. A semiconductor integrated circuit device according to claim 14, wherein a surface of the second insulating film is substantially flat.

21. A semiconductor integrated circuit device comprising:

memory cells of a static random access memory, each including a first n-channel MISFET, a second n-channel MISFET, a first p-channel MISFET and a second p-channel MISFET, each of the first n-channel MISFET and the second n-channel MISFET having a gate electrode formed over a semiconductor substrate, and a source region and a drain region formed in the semiconductor substrate, each of the first p-channel MISFET and the second p-channel MISFET having a gate electrode formed over the semiconductor substrate, and a source region and a drain region formed in the semiconductor substrate;

a first insulating film formed over the MISFETs;

first conductive films and second conductive films formed on the first insulating film and comprised of a different conductive layer from the gate electrodes of the MISFETs, the first conductive films, in the memory cell, being electrically connected to the drain region of the first n-channel MISFET, the drain region of the first p-channel MISFET, the gate electrode of the second n-channel MISFET and the gate electrode of the second p-channel MISFET, the second first conductive films, in the memory cell, being electrically connected to the drain region of the second n-channel MISFET, the drain region of the second p-channel MISFET, the gate electrode of the first n-channel MISFET and the gate electrode of the first p-channel MISFET;

third conductive films, fourth conductive films, fifth conductive films and sixth conductive films formed with the same level layer as the first conductive films and the second conductive films such that, in the memory cell, the third conductive films, the fourth conductive films, the fifth conductive films and the sixth conductive films are arranged separately with each other, the first p-channel MISFETs being arranged to be spaced from the first n-channel MISFETs in a first direction, the second n-channel MISFETs being arranged to be spaced from the second p-channel MISFETs in the first direction, the fourth conductive films arranged to be spaced from the third conductive films in a second direction crossing the first direction, and the sixth conductive films arranged to be spaced from the fifth conductive films in the second direction;

a second insulating film formed over the first conductive films, the second conductive films, the third conductive films, the fourth conductive films, the fifth conductive films and the sixth conductive films;

power source lines formed over the second insulating film and electrically connected to the source regions of the first p-channel MISFETs through the third conductive films and to the source regions of the second p-channel MISFETs through the fourth conductive films; and reference voltage lines formed over the second insulating film, formed with the same level layer as the power source lines and electrically connected to the source regions of the first n-channel MISFETs through the fifth conductive films and to the source regions of the second n-channel MISFETs through the sixth conductive films, the power source lines and the reference voltage lines extending in the second direction.

22. A semiconductor integrated circuit device according to claim 21, further comprising:

wiring lines formed over the second insulating film and formed with the same level layer as the power source lines, wherein the memory cell includes a first transfer MISFET and a second transfer MISFET, each having a gate electrode, and wherein the wiring lines are electrically connected to the gate electrodes of the first transfer MISFETs and the second transfer MISFETs.

23. A semiconductor integrated circuit device according to claim 21, wherein the power source lines and the reference voltage lines extend over the first conductive films and the second conductive films.

24. A semiconductor integrated circuit device according to claim 21, further comprising:

a logic element of a microprocessor.

25. A semiconductor integrated circuit device according to claim 21, wherein each of the source region and the drain region of the p-channel MISFET includes a selectively formed region such that a silicide layer is formed on the selectively formed region.

26. A semiconductor integrated circuit device according to claim 21, wherein a surface of the second insulating film is substantially flat.

* * * * *